United States Patent
Wang et al.

(10) Patent No.: US 9,335,977 B2
(45) Date of Patent: May 10, 2016

(54) OPTIMIZATION OF A DATA FLOW PROGRAM BASED ON ACCESS PATTERN INFORMATION

(71) Applicant: NATIONAL INSTRUMENTS CORPORATION, Austin, TX (US)

(72) Inventors: Guoqiang Wang, Albany, CA (US); Kaushik Ravindran, Berkeley, CA (US); Rhishikesh Limaye, Berkeley, CA (US); Guang Yang, San Jose, CA (US); Arkadeb Ghosal, Vacaville, CA (US); Hugo A. Andrade, El Cerrito, CA (US); John R. Allen, Los Altos, CA (US); Jacob Kornerup, Austin, TX (US); Ian C. Wong, Austin, TX (US); Jeffrey N. Correll, Cedar Park, TX (US); Michael J. Trimborn, Austin, TX (US)

(73) Assignee: National Instruments Corporation, Austin, TX (US)

( * ) Notice: Subject to any disclaimer, the term of this patent is extended or adjusted under 35 U.S.C. 154(b) by 238 days.

(21) Appl. No.: 14/050,084

(22) Filed: Oct. 9, 2013

(65) Prior Publication Data

US 2014/0040855 A1     Feb. 6, 2014

Related U.S. Application Data

(63) Continuation-in-part of application No. 13/193,353, filed on Jul. 28, 2011, now Pat. No. 8,887,121.

(60) Provisional application No. 61/711,653, filed on Oct. 9, 2012.

(51) Int. Cl.
*G06F 17/50*     (2006.01)
*G06F 9/00*     (2006.01)
*G06F 9/44*     (2006.01)

(52) U.S. Cl.
CPC ............ *G06F 8/34* (2013.01); *G06F 9/4436* (2013.01); *G06F 17/505* (2013.01); *G06F 17/5022* (2013.01); *G06F 17/5054* (2013.01)

(58) Field of Classification Search
CPC ............ G06F 17/5054; G06F 17/505; G06F 17/5022; G06F 8/34; G06F 9/4436; G06F 7/00
USPC ............ 716/117, 104, 106; 703/16; 707/798, 707/803; 717/144
See application file for complete search history.

(56) References Cited

U.S. PATENT DOCUMENTS 4,841,436 A * 6/1989 Asano et al. ............... 710/54
4,943,916 A * 7/1990 Asano et al. ............... 712/26

(Continued)

OTHER PUBLICATIONS

B. Bhattacharya and S. Bhattacharyya, "Parameterized Dataflow Modeling for DSP Systems", IEEE Transactions on Signal Processing, vol. 49, No. 10, Oct. 2001, pp. 2408-2421.

(Continued)

*Primary Examiner* — Phallaka Kik
(74) *Attorney, Agent, or Firm* — Meyertons Hood Kivlin Kowert & Goetzel, P.C.; Jeffrey C. Hood; Mark S. Williams

(57) ABSTRACT

System and method for optimizing a data flow diagram based on access pattern information are described. Access pattern information for a data flow diagram may be received. The data flow diagram may include a plurality of interconnected actors, e.g., functional blocks, visually indicating functionality of the data flow diagram. The access pattern information may include one or more of: input pattern information specifying cycles on which tokens are consumed by at least one of the actors, or output pattern information specifying cycles on which tokens are produced by at least one of the actors. A program that implements the functionality of the data flow diagram may be generated based at least in part on the access pattern information.

31 Claims, 65 Drawing Sheets

(56) References Cited

U.S. PATENT DOCUMENTS

| | | | |
|---|---|---|---|
| 5,021,947 A * | 6/1991 | Campbell et al. | 712/25 |
| 7,680,632 B1 | 3/2010 | Aldrich | |
| 8,555,243 B2 * | 10/2013 | Correll | G06F 8/34 717/104 |
| 8,719,774 B2 * | 5/2014 | Wang | G06F 8/34 717/105 |
| 8,726,228 B2 * | 5/2014 | Ravindran | G06F 8/34 717/104 |
| 8,887,121 B2 * | 11/2014 | Ravindran | G06F 8/34 703/16 |
| 2004/0088666 A1 * | 5/2004 | Poznanovic et al. | 716/7 |
| 2004/0088685 A1 * | 5/2004 | Poznanovic et al. | 717/140 |
| 2004/0088689 A1 * | 5/2004 | Hammes | 717/154 |
| 2004/0088691 A1 * | 5/2004 | Hammes et al. | 717/158 |
| 2005/0080610 A1 * | 4/2005 | Toma et al. | 703/22 |
| 2005/0257194 A1 * | 11/2005 | Morrow et al. | 717/109 |
| 2006/0150149 A1 | 7/2006 | Chandhoke et al. | |
| 2008/0022288 A1 * | 1/2008 | Bekooij | 718/107 |
| 2009/0210847 A1 * | 8/2009 | Manohar et al. | 716/12 |
| 2012/0030646 A1 * | 2/2012 | Ravindran et al. | 717/105 |
| 2012/0030647 A1 * | 2/2012 | Wang | G06F 8/34 717/105 |
| 2012/0030648 A1 * | 2/2012 | Correll | G06F 8/34 717/105 |
| 2012/0030650 A1 * | 2/2012 | Ravindran | G06F 8/34 717/107 |
| 2015/0020043 A1 * | 1/2015 | Ravindran | G06F 8/34 717/105 |

OTHER PUBLICATIONS

Jorn W. Janneck, "Tokens? What Tokens? A Gentle Introduction to Dataflow Programming", ASTG Technical Memo, Xilinx, Aug. 5, 2007, 40 pages.

Alain Girault, Bilung Lee, and Edward A. Lee, "Hierarchical Finite State Machines with Multiple Concurrency Models", IEEE Transactions on Computer-Aided Design of Integrated Circuits and Systems, vol. 18, No. 6, Jun. 1999, pp. 742-760.

Marlyn Edwards and Peter Green, "The Implementation of Synchronous Dataflow Graphs Using Reconfigurable Hardware", Field-Programmable Logic and Applications: The Roadmap to Reconfigurable Computing; 10th International Conference, FPL 2000, Villach, Austria; Aug. 27-30, 2000; pp. 739-748.

Matthias Gries, "Methods for Evaluating and Covering the Design Space during Early Design Development", Integration, the VLSI Journal, Elsevier, vol. 38(2), May 26, 2004; 70 pages.

Yu-Kwong Kwok and Ishfaq Ahmad, "Static Scheduling Algorithms for Allocating Directed Task Graphs to Multiprocessors", ACM Computing Surveys, vol. 31, No. 4, Dec. 1999, pp. 406-471.

Edward A. Lee and David G. Messerschmitt, "Static Scheduling of Synchronous Data Flow Programs for Digital Signal Processing", IEEE Transactions on Computers, vol. C-36, No. 1, Jan. 1987, pp. 24-35.

Orlando M. Moreira and Marco J. G. Bekooij, "Self-Timed Scheduling Analysis for Real-Time Applications", EURASIP Journal on Advances in Signal Processing, vol. 2007, Article ID 83710; Apr. 2007; 14 pages.

Gilbert C. Sih and Edward A. Lee, "A Compile-Time Scheduling Heuristic for Interconnection-Constrained Heterogeneous Processor Architectures", IEEE Transactions on Parallel and Distributed Systems, vol. 4, No. 2, Feb. 1993, pp. 175-187.

Sander Stuijk, Marc Geilen, and Twan Basten, "Throughput-Buffering Trade-Off Exploration for Cyclo-Static and Synchronous Dataflow Graphs", IEEE Transactions on Computers, vol. 57, Issue 10, Oct. 2008, pp. 1331-1345.

Alberto L. Sangiovanni-Vincentelli, "Quo Vadis SLD: Reasoning about Trends and Challenges of System-Level Design", Proceedings of the IEEE, vol. 95, No. 3, Mar. 2007, pp. 467-506.

Kurt Keutzer, A. Richard Newton, Jan M. Rabaey, and Alberto L. Sangiovanni-Vincentelli, "System-Level Design: Orthogonalization of Concerns and Platform-Based Design", IEEE Transactions on Computer-Aided Design of Circuits and Systems, vol. 19, No. 12, Dec. 2000, pp. 1523-1543.

Edward A. Lee, "Embedded Software", UCB ERL Memorandum M01/26, University of California, Berkeley, CA 94720 USA; Nov. 1, 2001; 34 pages.

J Eker, J. W. Janneck, E. A. Lee, J. Liu, X. Liu, J. Ludvig, S. Neuendorffer, S. Sachs, Y. Xiong, "Taming Heterogeneity—the Ptolemy Approach", Proceedings of the IEEE, vol. 91, No. 2, Jan. 2003, pp. 127-144.

L. Deng, K. Sobti, Y. Zhang, and C. Chakrabarti, "Accurate Area, Time and Power Models for FPGA-Based Implementations", Journal of Signal Processing Systems, DOI 10.1007/s11265-009-0387-7, Jun. 19, 2009, 12 pages.

Zhiru Zhang, Yiping Fan, Wei Jiang, Guoling Han, Changqi Yang, and Jason Cong, "AutoPilot: A Platform-Based ESL Synthesis System", High-Level Synthesis, Chapter 6, Springer Science + Business Media B.V. 2008, pp. 99-112.

R. Enzler, T. Jeger, D. Cottet, and G. Tröster, "High-Level Area and Performance Estimation of Hardware Building Blocks on FPGAs", Field-Programmable Logic and Applications: The Roadmap to Reconfigurable Computing, 10th International Conference, FPL 2000, Villach, Austria, Aug. 27-30, 2000; pp. 525-534.

Shuvra S. Bhattacharyya, Praveen K. Murthy, and Edward A. Lee, "Software Synthesis from Dataflow Graphs," Kluwer Academic Publishers, Norwell, Massachusetts, May 1996, pp. 29-56.

Tara M. Madhyastha, Daniel A. Reed, "Exploiting Global Input/Output Access Pattern Classification," Supercomputing '97, Proceedings of the 1997 ACM/IEEE Conference on Supercomputing; Nov. 15, 1997; 18 pages.

International Search Report and Written Opinion for Application No. PCT/US2011/045783 dated Oct. 26, 2011, 12 pages.

N. Liveris, et al., "Retiming for Synchronous Data Flow Graphs," IEEE ASP-DAC, XP031085543, Jan. 2007, pp. 480-485.

Alessio Bonfietti, et al., "Throughput Constraint for Synchronous Data Flow Graphs," Computer Science, vol. 5547, Springer Berlin Heidelberg, May 2009, pp. 26-40.

* cited by examiner

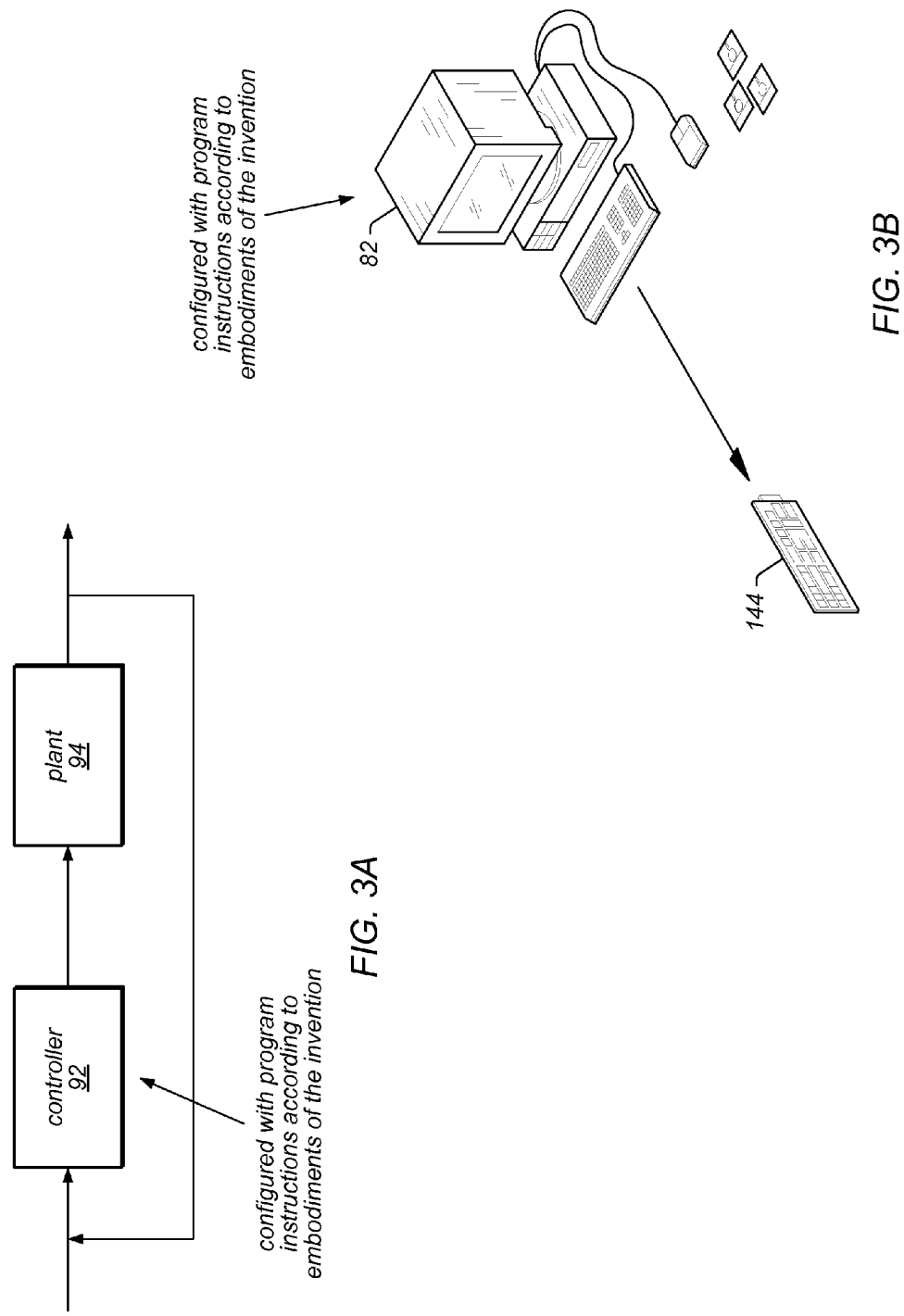

One Embodiment of Objective Function Generation to Optimize Total Buffer Size

Use Heuristics to Obtain Constraints for Subsequent Optimization Steps

OPTIMIZATION OF A DATA FLOW PROGRAM BASED ON ACCESS PATTERN INFORMATION

PRIORITY CLAIM

This application is a continuation-in-part of U.S. patent application Ser. No. 13/193,353, titled "Developing Programs for Hardware Implementation in a Graphical Specification and Constraint Language," filed on Jul. 28, 2011, and claims priority to U.S. Provisional Patent App. No. 61/711,653 titled "Optimization of a Data Flow Program Based on Access Pattern Information," filed on Oct. 9, 2012, both of which are hereby incorporated by reference in their entirety as though fully and completely set forth herein.

FIELD OF THE INVENTION

The present invention relates to the field of data flow programming, and more particularly, to embodiments of systems and methods for specifying, implementing, and optimizing a data flow program.

DESCRIPTION OF THE RELATED ART

Many industrial applications require high-performance and/or efficient implementation, such as, for example, digital signal processing (DSP) applications. Moreover, such applications may be subject to various execution requirements, e.g., with respect to timing, resource usage, throughput, etc. For example, applications to be implemented in programmable hardware, such as a field programmable gate array (FPGA) may require that the application's footprint, i.e., area used, on the FPGA be no larger than a given size. Many high-performance applications are implemented in accordance with data flow (also referred to as "dataflow") protocols, which facilitate parallelism, particularly in hardware implementations, such as FPGA-based targets.

Prior art techniques for specifying and implementing such applications have typically required significant manual analysis and testing, which is difficult, tedious, and error prone.

Thus, improved systems and methods for specifying, implementing, and optimizing applications are desired.

SUMMARY

Various embodiments of a system and method for optimizing a data flow program that has been augmented with access pattern information are described herein. According to some embodiments, an application development environment may be configured to receive a data flow program, receive user input specifying one or more desired optimization objectives for an implementation of the data flow program, and receive input specifying execution characteristic information regarding the execution of the actors (also called actor characteristic information) in the data flow program. The application development environment may perform a method that analyzes the characteristic information in order to generate or improve (e.g., optimize) an implementation of the data flow program that meets the user's desired execution requirements and targets. In some embodiments, the user specifies an execution property to be minimized or maximized without specifying an exact target value.

In one embodiment, access pattern information for a data flow diagram may be received, where the data flow diagram includes a plurality of interconnected actors visually indicating functionality of the data flow diagram, where the access pattern information includes one or more of: a) input pattern information specifying the time at which tokens are consumed by at least one of the actors, or b) output pattern information specifying the time at which tokens are produced by at least one of the actors. A program may then be generated that implements the functionality of the data flow diagram based at least in part on the access pattern information. In some embodiments, each actor may be, include, or be implemented by, a respective functional block. Thus, the data flow diagram may include a plurality of interconnected functional blocks.

The techniques disclosed herein may be applied not only to graphical programs and data flow diagrams, but to data flow specifications, as well. Thus, following the above, the method may include receiving access pattern information for a data flow specification, where the data flow specification specifies a plurality of functional actors (or simply actors) that perform functionality according to a data flow model of computation, and where, similar to the above, the access pattern information includes one or more of: a) input pattern information specifying the time at which tokens are consumed by at least one of the functional actors, or b) output pattern information specifying the time at which tokens are produced by at least one of the functional actors. A(n implementation) program may be generated that implements the functionality based on the data flow specification and the access pattern information Common to all embodiments is the use of access pattern information to generate or improve the implementation of a program. Access pattern information may include among other things the times at which individual outputs become available or the times at which individual inputs are required.

Examples of actor characteristic information that may be used in some embodiments include the amount of time required by an actor to complete processing of one set of input operands (execution time) and the amount of time required to initiate processing of a set of input operands (initiation interval).

In some embodiments, the user specified execution property may be the maximum time taken by a program from the input of operands to the output of the corresponding results (latency); in others, it may be the number of outputs produced per unit time (throughput); and in still others, it may be the maximum amount of memory required to hold intermediate values during the computation (buffer size). In some embodiments, the specified performance target for an execution property must be met exactly while in other embodiments it is only necessary to do no better or no worse than the specified performance target.

Some embodiments formulate the actor characteristic information and desired execution properties into a system of linear inequalities which are solved exactly in order to generate or optimize the implementation of the data flow program. Other embodiments may approximate the solution to a system of linear inequalities, while some embodiments do not construct a system of linear inequalities.

BRIEF DESCRIPTION OF THE DRAWINGS

A better understanding of the present invention can be obtained when the following detailed description of the preferred embodiment is considered in conjunction with the following drawings, in which:

FIG. 3A is a high level block diagram of an exemplary system which may execute or utilize graphical programs or which may execute implementations generated from graphical programs;

FIG. 3B illustrates an exemplary system which may be used to develop graphical programs, and perform control and/or simulation functions utilizing graphical programs;

Figure 1A:
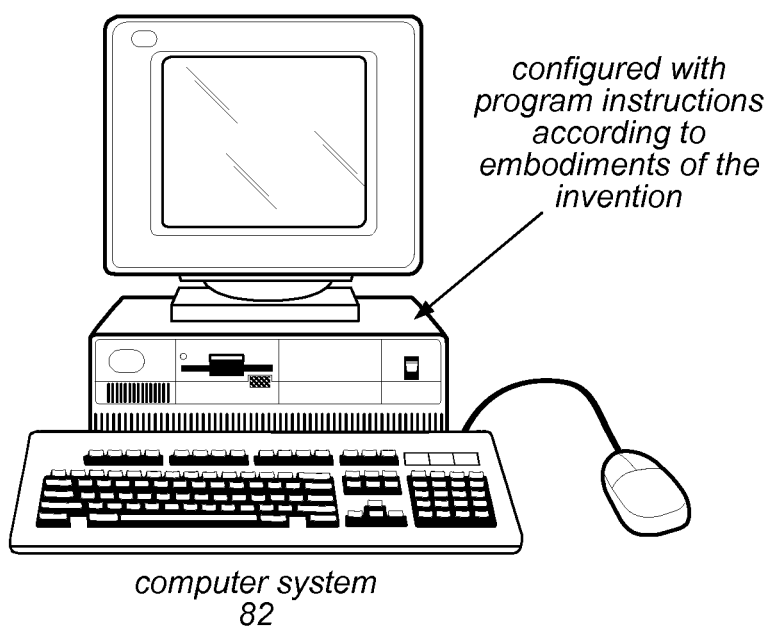
FIG. 1A illustrates a computer system configured to execute a graphical program according to an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Provisional Application Ser. No. 61/711,653 titled "Optimization of a Data Flow Program Based on Access Pattern Information," filed on Oct. 9, 2012.

U.S. Provisional Application Ser. No. 61/369,624, titled "Specifying and Implementing Applications Via a Disciplined Design Methodology", filed on Jul. 30, 2010.

U.S. patent application Ser. No. 13/193,353, titled "Developing Programs for Hardware Implementation in a Graphical Specification and Constraint Language," filed on Jul. 28, 2011.

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,210,117 titled "System and Method for Programmatically Generating a Graphical Program in Response to Program Information," filed Dec. 20, 2000.

U.S. Pat. No. 7,506,304 titled "Graphical Data Flow Programming Environment with First Model of Computation that Includes a Structure Supporting Second Model of Computation," filed Jun. 16, 2004.

TERMS

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look-up tables) to coarse grained (arithmetic logic units or processor cores). A programmable hardware element may also be referred to as "reconfigurable logic".

Nonprogrammable Hardware Element—includes a hardware device whose functionality is embedded directly into its circuitry at the time of its manufacture. The most prominent example is an ASIC (Application Specific Integrated Circuit), but any hardware device which is not a Programmable Hardware Element is covered by this concept.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist (a list of gates and their connections) or bit file, that can be used to configure a programmable hardware element or otherwise control its execution.

Hardware Manufacture Mask—a representation (netlist, mask, or bit file) that can be used during manufacturing to control the functionality of a nonprogrammable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element or 3) a hardware manufacture mask used to determine the functionality of a nonprogrammable hardware element.

Implementation or Implementation Program—a particular implementation of an application program intended to execute on a specific target. Note that an application program may be the basis for numerous different implementation programs, e.g., targeted for execution on a processor based system, targeted for deployment to a programmable hardware element, and so forth.

Graphical Program—A program comprising a plurality of interconnected nodes or icons, wherein the plurality of interconnected nodes or icons visually indicate functionality of the program. The interconnected nodes or icons are graphical source code for the program. In at least one embodiment of a graphical program, the nodes represent functions that are to be enacted on data and the interconnections (also called edges) represent the flow of data from node to node. Nodes in a graphical program may also be referred to as graphical function nodes, actors, functional blocks, or simply blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™, Matrixx/SystemBuild™, and Visual System Simulator™ from National Instruments, Simulink® from the MathWorks, VEE™, SystemVue, and ADS Ptolemy Simulator from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes is often referred to as the block diagram portion of the graphical program.

LabVIEW®—an environment available from National Instruments Corporation for developing graphical programs. The graphical language used to represent graphical programs in LabVIEW® is often referred to as "G".

Block Diagram—refers to interconnected blocks (i.e., nodes) or icons that visually indicate operation of the model or block diagram; a block diagram may be considered graphical source code for a graphical program.

Node—In the context of a graph, node carries its standard meaning of being a vertex or an entity which may be connected via edges to other nodes or itself. In the context of a graphical program, a node also refers to the programming element which the node represents. For instance, exemplary nodes may include function nodes, sub-program nodes, terminal nodes, structure nodes, etc. In this context, nodes may also be called blocks.

Data Flow Program—A program in which execution is represented as a flow of data between functions or actors. Actors execute their indicated computation at any time after the necessary input data are available, and emit their results once computed. Data flow programs can be contrasted with procedural programs which specify an execution flow of computations to be performed. As used herein "data flow" or "data flow programs" encompass both "dynamically-scheduled data flow" and "statically-scheduled data flow".

Graphical Data Flow Program (or Graphical Data Flow Diagram)—A graphical program which is also a data flow program. A graphical data flow program comprises a plurality of interconnected nodes (blocks), wherein at least a subset of the connections among the nodes visually indicates that data produced by one node are used by another node. A LabVIEW VI (Virtual Instrument) is one example of a graphical data flow program. A Simulink block diagram is another example of a graphical data flow program.

Graphical User Interface—this term is intended to have the full breadth of its ordinary meaning The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when input controls and output indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at runtime. As another example, the GUI may comprise GUI Elements embedded in the block diagram portion of the graphical program.

Graphical User Interface Element—an element of a graphical user interface, such as for providing input or displaying output. Exemplary graphical user interface elements in some embodiments comprise input controls and output indicators, as described below. An output indicator is sometimes referred to as an "output control".

Input Control—a graphical user interface element for providing user input to a program. In addition, an input control may display the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Front Panel—A graphical user interface that includes input controls and/or output indicators, and which enables a user to interactively control or manipulate the input being provided to a program, and/or view output of the program, while the program is executing.

A front panel is a type of GUI. A front panel may be associated with a graphical program as described above. In an instrumentation application, the front panel can be considered to be analogous to the front panel of an instrument. In an industrial automation application the front panel can be analogized to the Man Machine Interface (MMI) of a device. The user may adjust the controls on the front panel to affect the input and view the output on the respective indicators.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation other than through the program itself. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. They are instead dictated by the program controlling the system's operation. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are automatically completed). The present specification provides various examples of operations being automatically performed in response to actions the user has taken.

Required Execution Properties—properties which the application user or other user requires to be true when the implemented program is executed. For example, a typical execution requirement in some embodiments is that the system produces some number of outputs per unit time—a throughput requirement. Another typical execution requirement is that an output corresponding to a given input is produced within a set time from the moment when the input is received—a latency requirement.

Application Model—a specification of the user application to be implemented and the execution requirements the user desires and requires of the implementation. In many embodiments, the user application is specified as a program, which would comprise an application model.

Platform Model—a definition of the computing and I/O resources and capabilities of the user selected target platform, which may include descriptions of the memory, processors, computing elements, number of slots, and other elements of a target platform.

Resource Model—an internal model that stores definitions of actors (e.g., via tuples), interconnections between actors, and implementation properties of actors, and is an intermediate representation on which code generation may be based.

Platform Library—a library of pre-characterized platform building blocks that the user can assemble to create a platform model. This library can include timing data for blocks.

Specification—refers to part of the diagram or user input that captures the application functionality and reflects the user intent regardless of the platform on which the application is going to be implemented/deployed.

Constraint—refers to mathematical expressions which must be met (i.e. held to be true) when solving or optimizing a mathematical expression. For instance, maximizing the expression $x^2$ subject to the constraint $0<=x<=5$ occurs when $x=5$ since that is point for x at which $x^2$ takes on its maximum value. In many contexts, constraint is also used as another name for execution requirement. Herein, the two terms will be distinguished, but the surrounding context should clarify any ambiguity.

Actor—basic unit of computation in a program; conceptually, a sequential process that reads inputs, performs actions, and produces outputs. An example of an actor is a functional block in a graphical program or a hierarchical arrangement (sub-diagram) of a portion of a graphical program. Throughout this document, actors and functional blocks are used interchangeably. Actors may be referred to as "functional actors" to emphasize their functional, as opposed to merely symbolic, nature; thus a functional block is an exemplary functional actor.

Actor Definition Language (ADL)—a language used to define the functionality and execution requirements of actors.

Data Tokens—or simply Tokens, a quantum of information that is communicated between two actors in data flow representation. The data token is basic unit of information passed from a producer to a consumer, and may have different sizes and contain different information between different producers and consumers.

Terminal—an interface through which an actor communicates information. A terminal can be either an input terminal from which its actor reads data or an output terminal to which its actor writes data.

Port—a connection for communicating information between the system and things outside the system. Ports are input (which means information comes into the system from outside), output (which means information travels from the system to outside) or both.

Channel—any mechanism that supports communication of data tokens between actors. One example can be a bounded point-to-point FIFO (First-In-First-Out, a memory data structure in which elements are removed in the same order in which they are entered) buffer between two actors. A channel may contain a specified number of initial tokens and this is also referred to as initial token count.

Buffer Size—for a channel, the amount of storage (possibly expressed as the number of buffers for data tokens on the channel) used to hold tokens emitted by the channel's producer until consumed by the channel's consumer.

Input Count (IC)—number of tokens consumed at an input terminal of one functional block by one firing of the functional block. It is also called consumption count or consumption rate.

Output Count (OC)—number of tokens produced at an output terminal of one functional block by one firing of the functional block. It is also called production count or production rate.

Firing—when used as a verb, the act of executing an actor for one set of input tokens. As a noun, a single execution of an actor that begins when the requisite number of data tokens are present on all its input terminals and the requisite number of empty spaces (storage) are present on all its output terminals. On each firing, an actor consumes data from its input terminals, takes finite time to execute its actions, and produces data on its output terminals.

Static Data Flow (SDF)—a data flow program where the number of data tokens consumed and produced by its actor firing on all its terminals is static (specified a priori at edit or compile time).

Cyclo-Static Data Flow (CSDF)—a data flow program where its actors execute as a repeating sequence of phases. Each phase corresponds to a firing of a static data flow actor for which the number of data tokens consumed and produced are specified a priori.

Parameterized Cyclo-Static Data Flow (PCSDF)—a CSDF where the number of data production and consumption counts and execution behavior of its actors are regulated by parameters. The parameter values may be defined at the time the actors or functional blocks are connected together (static), or at runtime (dynamic). In the case of dynamic parameters, these usually determine some modes of operation of the functional blocks or the resulting graphical program. The parameters assume values from a finite set, and are updated only at iteration boundaries.

Heterochronous Data Flow (HDF)—a hierarchical program of Cyclo-Static Data Flow (CSDF) and Finite State Machine (FSM) actors. This model enables a decoupling of control and concurrency. The operational semantics require that state transitions are executed only at iteration boundaries of the SDF model.

Parameterized HDF (PHDF)—a parameterized version of HDF in which actor data production and consumption counts and execution behavior are regulated by parameters (see PCSDF actor definition above). HDF is often defined to include parameterization, and so the designation PHDF is used herein when that specific characteristic is being highlighted.

Parameterized Block—an actor or block (e.g., a functional block) that accepts parameters in the context of PCSDF, or HDF/PHDF.

Schedule—a sequence of actor firings that respects data dependencies and production and consumption counts (infinite or periodic).

Iteration—a segment of a schedule that starts from a given state of the execution of the data flow program and that ends at the time in which the data flow program execution first enters the same state.

Iteration boundary—the points where an iteration starts or stops.

Execution Time (ET)—a bound on the duration needed from the time a functional block starts execution of a firing until the time it completes execution of that firing (typical units are seconds or cycles). "Maximum Execution Time" is the longest time under which the block will correctly complete for all inputs. If the bound is the smallest possible Maximum Execution Time and it is the same for all possible combinations of the inputs, then the execution time is Exact. Otherwise, it is Inexact, and it corresponds to the Worst-Case Execution Time (WCET).

Actor Initiation Interval (II)—the minimum time required between consecutive firings of a functional block in order to get a correct execution. The interval are measured from the beginning of the first firing to the beginning of the second firing (typical units are seconds or cycles).

Throughput—the number of tokens produced or consumed on a specified port or terminal per unit time (typical units are samples/second or samples/cycle).

Mode—a phase of a functional block's execution (as in CSDF), or a state (or value) of a specification or required execution property of a functional block that is configurable at runtime (as in dynamic PCSDF).

Clumping—a method for optimizing data flow programs which groups actors into "clumps" and replaces the communication mechanisms (typically FIFO buffers) within a clump with a different one, typically one that is available only with a restricted implementation. For instance, a clump of actors that is implemented on a single FPGA or processor can communicate directly among themselves using wires, registers, or other simple direct connections. If the actors are instead implemented across different FPGAs or processors, the communication mechanism may well be a much slower Ethernet or other similar networking or peer to peer mechanisms.

Backpressure-less implementation—an implementation style that does not require a downstream actor (e.g., functional block) to control data flowing from upstream actors based on its ability to process data.

Access Pattern (AP)—collectively the Input Patterns and Output Patterns of an actor. An Access Pattern is a representation of the cycles on which tokens are consumed (described as start of consumption and end of consumption in case of multi-cycle consumption of a token) on an input terminal and or produced (described as start of production and end of production in case of multi-cycle production of a token) on an output terminal, respectively.

One embodiment of AP comprises a collection of Input Patterns which are a sequence of Boolean values equal in number to the ET of a functional block, wherein each true value in the sequence denotes consumption (both start and end) of a token at an input terminal of the functional block on the corresponding cycle of the execution of the block and output patterns which are a sequence of Boolean values equal in number to the ET of the block, wherein each true value in the sequence denotes production (both start and end) of a token at an output terminal of the functional block on the corresponding cycle of the execution of the block.

The use of access patterns as disclosed herein is novel and a significant advancement to SDF. Because SDF compilation techniques have always limited themselves to the time at which all tokens are available (whether that time is obtained statically from actor ETs or dynamically from a function as described in Liveris ("Retiming for Synchronous Data Flow Graphs" by N. Liveris, C. Lin, J. Wang, H. Zhou, and P. Banerjee published in Design Automation Conference, 2007. ASP-DAC '07. Asia and South Pacific)), they have been limited, simplistic, and missed significant optimization opportunities. The invention of access patterns enables a wide new range of optimization opportunities, such as pipelining and overlapping the execution of actors.

Output patterns are abbreviated OP, and input patterns are abbreviated IP. IP is also a standard abbreviation for intellectual property, which is a term and abbreviation used in this application. The difference should be evident from the context.

Objective Function—a function whose value is to be maximized or minimized.

Producer-Consumer Constraint—a constraint that guarantees that a token is produced before being consumed.

Auto-Concurrency Constraint—for an actor, a constraint that guarantees that the time between successive firings of the actor is at least its Initiation Interval. In other words, one actor cannot be simultaneously working on two different input token sets. Auto-concurrency constraints guarantee that an actor has completed processing one set of input tokens before starting on the next set.

Buffer Size Constraint—A constraint that guarantees for a channel that at all points in time the number of the available buffers is greater than or equal to the number of tokens that has been produced and being produced through that time on that channel minus the number of tokens that has been consumed prior to that time on that channel plus the number of tokens initially present on that channel. In other words, buffer size constraints guarantee that data tokens are not lost or overwritten because a producer overwrites previously generated tokens before the consumer has time to read them. Buffers hold tokens in transit from a producer to a consumer, and a buffer size constraint ensures that the size of the buffers is large enough that the consumer will read the token before the producer overwrites it with a later value.

Linear Constraint—an equality or inequality that is comprised of additions and subtractions of linear terms. A linear term is either a constant or a product of a constant and a variable.

Quadratic Constraint—an equality or inequality that can be expressed as the additions and subtractions of quadratic terms, at least one of which is the product of two variables. A quadratic term is either a linear term or a product of two linear terms.

Difference Constraint—an equality or inequality of the form of $x_1-x_2<=b$ ($x_1$ and $x_2$ are variables, and b is a constant).

Propositional Constraint—a constraint comprised of variables combined with logical operators.

Integer Linear Constraint—a linear constraint that further requires the variables take on only integer values.

Exact and Inexact Formulation—an exact formulation is a problem formulation that precisely captures all constraints inherent in a problem. Inexact formulations, on the other hand, may relax constraints, yielding a problem that is different from the intended problem, but that has some characteristic that makes it more desirable. For instance, it may be possible to solve the inexact formulation but impossible to solve the exact formulation due to its computation complexity. For example, consider the problem of determining whether the equation $3x+2y=7$ has any integer solutions (i.e., x and y are both integers) in the region $0<=x<=2$ and $0<=y<=1$. The Exact Formulation ($3x+2y=7$; $0<=x<=2$; $0<=y<=1$; x is an integer; y is an integer) can be difficult to solve. Relaxing the constraints by removing the requirement that x and y be integers and allowing them to be real produces an Inexact Formulation which is simpler to solve by using the Intermediate Value Theorem from calculus. Furthermore, if there are no real solutions to the Inexact Formulation, it is easy to conclude that there are no integer solutions to the Exact Formulation, since an integer solution also qualifies as a real solution.

Solution Mechanism—a mechanism for finding a bound or approximation to the minimum or maximum of an objective function subject to constraints. A solution mechanism which finds the exact minimum or maximum is known as exact. Any others are known as inexact (or approximate).

MILP (Mixed Integer Linear Programming) Solver—a solution mechanism that solves an optimization problem using integer linear programming.

MIQCP (Mixed Integer Quadratic Constraint Programming) Solver—a solution mechanism that solves an optimization problem using quadratic programming.

SMT (Satisfiability Modulo Theories) Solver—a solution mechanism that solves an optimization problem specified as logical formulas and constraints with respect to combinations of background theories expressed in first-order logic.

Simulation of a data flow program—executing a data flow program on an architecture other than the implementation target. "Simulation" in this application includes both behavioral simulation (in which the functionality of the data flow program is executed, but not necessarily the target implementation) and emulation (in which the target implementation is directly executed on a different target, usually by emulating the target's functionality).

Scheduling Scheme—a method that defines the times at which actors execute (also known as firing).

Static Fine-Grained Scheduling—a scheduling scheme that is constructed at compile time (i.e., during analysis) and assigns fixed start times to firings of actors in a data flow program.

Regular Periodic Scheduling—a static fine-grained scheduling scheme where all actors execute the same schedule repeatedly with a fixed time interval between successive firings. The fixed time interval is the schedule period of an actor. This definition is based on common definition in this field in literature.

r-Periodic Scheduling—a static fine-grained scheduling scheme in which the actor firing repeats periodically every r iterations. This definition is based on common definition in this field in literature.

Regular 1-Periodic Scheduling—a 1-periodic scheduling scheme where each actor is scheduled periodically in a single iteration. Based on both r-periodic scheduling and regular periodic scheduling, regular 1-periodic scheduling is proposed for better scheduling flexibility than regular periodic scheduling and less scheduling complexity than r-periodic scheduling.

Actor Symmetry—A relation on the actors defined by the following. An actor is symmetric to itself. Two actors are symmetric to each other if their respective upstream actors are symmetric to each other, their ETs are identical, and their IIs are identical.

Channel Symmetry—Similarly, a relation on channels defined by the following. Two channels are symmetric to each other if their source actors are symmetric to each other and have identical production patterns and their sink actors are symmetric to each other and have identical consumption patterns.

Hierarchical Partitioning—a graph transformation similar to clumping (but performed differently and for different reasons) in which groups of actors in a graph are collapsed together into a single actor, communications within the group are abstracted away, and communications between actors in two different groups are abstract up as communications between the groups.

Various embodiments of a system and method for optimizing a data flow program which is augmented with access pattern information are described herein. The data flow program may include a plurality of actors (also referred to herein as "nodes" or "functional blocks") that communicate with each other according to data flow semantics. Each actor may be configured to perform a particular function or operation that receives input data values referred to as input tokens (referred to as "consuming" the input tokens) and/or produces output data values referred to as output tokens. For example, a first actor may perform a first function which produces a first token as output, which is then provided to a second actor which consumes the first token as input and performs a second function which produces a second token as output, and so on. A data flow program can be visually represented as a directed graph where the actors of the data flow program are shown as nodes in the graph, and each edge between a given pair of nodes represents a channel indicating that data produced by one of the nodes (the producer) is sent to and consumed by the other node (the consumer).

The present system and method may provide an application development environment software tool which enables a user to create a data flow program by specifying the desired actors and the data flow connections among the actors. The application development environment may be configured to analyze the data flow program and generate an implementation of it, which may be either a software implementation or a hardware implementation (or both). For example, the application development environment may generate a software implementation by compiling the data flow program into a software program configured to be executed by one or more processors. The application development environment may generate a hardware implementation of the program by generating hardware configuration information (e.g., a hardware configuration program) that can be used to configure an FPGA or other programmable hardware element. Unless otherwise noted, an "implementation" of a data flow program is used in a general sense herein to mean that the implementation can be either a software implementation and/or a hardware implementation.

The application development environment may enable the user to specify one or more objectives or requirements for the implementation of the data flow program, and may attempt to generate an implementation that meets these objectives. The objectives are goals that may be specified in terms of various aspects of the program's execution behavior or resource. Various examples of optimization objectives that can be specified by the user, such as buffer size, execution time, and resource minimization, are described below.

One task that the application development environment needs to perform in creating an implementation of a data flow program is to determine an execution schedule for the actors. Consider for example, a simple data flow program in which a producer actor u is connected to a consumer actor v. According to convention, the data flow program is implicitly understood to execute in a periodic manner such that the actors u and v are executing iteratively, where the tokens produced by u get placed into a FIFO buffer and are then removed and consumed by v. In creating the implementation of the data flow program, the application development environment needs to determine an execution schedule that ensures a balance between the production of the tokens by u and their consumption by v.

Suppose for example that the actor u produces two tokens each time it is executed, and v consumes three tokens each time it is executed. Thus, for every three executions of u, there needs to be two executions of v (since three executions of u produce 6 tokens, and two executions of v consume a balancing number of 6 tokens). The schedule also needs to ensure that producer-consumer concurrency constraints are met so that the actor v does not attempt to consume tokens before they have been produced by u. In this case, there are multiple possible schedules that fit these criteria. For example, in one schedule the actors may be periodically executed in the order u,u,u,v,v. In this schedule, the 6 tokens produced by the 3 executions of u need to be stored in a buffer until v starts consuming them. In another schedule the actors may be periodically executed in the order u,u,v,u,v. Under this schedule, only 4 tokens need to be buffered between u and v. The application development environment may be configured to analyze the program and determine which schedule to use for the implementation based on the particular optimization objective(s) specified by the user (and based on other information as described below).

Another task that the application development environment needs to perform in creating an implementation of a data flow program is to determine the resource allocation needed. One example of resources to be allocated is FIFO buffers used for the transfer of the data tokens between the actors. The buffer between each pair of producer-consumer actors needs to be large enough to hold the tokens produced by the producer actor until they are consumed by the consumer actor, without overwriting a yet unconsumed token (satisfying the buffer size constraint). The buffer sizes needed may depend on which execution schedule is selected. For example, one schedule may require a smaller buffer size than another schedule (as in the previous example), but the second schedule may have other advantages over the first schedule, such as achieving greater throughput. Thus, the application development environment may attempt to find whichever combination of schedule and buffer allocation works best to achieve the user's desired optimization objective(s).

The application development environment may be configured to receive a data flow program, receive user input specifying the user's desired optimization objective(s) for the implementation of the data flow program, and receive input specifying characteristic information which specifies various execution characteristics of the actors in the data flow program. The application development environment may perform a method that analyzes the characteristic information and generates an optimized implementation of the data flow program (e.g., having an optimized schedule and/or optimized resource usage) according to the user's desired optimization objective(s).

The characteristic information received by the application development environment may include the execution times (ET) of the actors. In some embodiments the execution time may be expressed in terms of clock cycles of the device on which the actor executes, e.g., processor cycles or clock cycles of an FPGA or other programmable hardware element. In other embodiments the execution time may be expressed in terms of time units, e.g., in microseconds or another time unit.

The characteristic information received by the application development environment may also include the initiation intervals (II) of the actors. In some cases, the initiation interval for an actor may be less than the execution time of the actor, e.g., if the actor utilizes pipelining techniques that enable a new instance of the actor to be fired before the previous instance finishes executing.

The characteristic information received by the application development environment may also include access pattern information for one or more of the actors in the data flow program, which may enable better optimizations to be achieved, as described below. The "access pattern information" for the actor may refer to either input pattern information for the actor and/or output pattern information for the actor. The "input pattern information" for an actor is information indicating when the actor's input tokens are consumed relative to the beginning of the actor's execution. For example, the input pattern information may specify the particular cycles on which input tokens are consumed by the actor (e.g., consumed on an input terminal of the actor). For example, suppose that the execution time for one firing of an actor is five cycles, and suppose that the input count (the number of tokens consumed by the actor during each firing) is two. The two input tokens may be consumed (i.e., read from the FIFO buffer so that the actor can begin processing them) at various cycles during the actor's execution. The input pattern can be expressed as a list or sequence of values, where each of the values corresponds to one of the cycles during the execution of the actor and specifies the number of tokens consumed by the actor on that cycle.

Thus for example, if the execution time of the actor is five, then the input pattern could be expressed as a list of five values, such as [1,0,0,1,0], which indicates that the first input token is consumed on the first cycle during the actor's execution, and the second input token is consumed on the fourth cycle (and no input tokens are consumed on the other cycles). As another example, the input pattern could be [0,1,1,0,0], which indicates that the first input token is consumed on the second cycle during the actor's execution, and the second input token is consumed on the third cycle. As another example, the input pattern could be [2,0,0,0,0], which indicates that both input tokens are consumed on the first cycle during the actor's execution. (In some embodiments only one token can be consumed by an actor during each cycle, in which case the input pattern can be expressed as a sequence of Boolean values equal in number to the execution time of the actor, where each True value in the sequence denotes consumption of a token at an input terminal of the actor on the corresponding cycle of the execution of the actor.) In other embodiments the input pattern information can be specified in terms of time units (e.g., microseconds, etc.) instead of clock cycles.

The "output pattern information" for an actor is information indicating when the actor's output tokens are produced relative to the beginning of the actor's execution. For example, the output pattern information for an actor may indicate the particular cycles on which output tokens are produced by the actor (e.g., produced on an output terminal of the actor). The output pattern can be expressed as a list or sequence of values, where each of the values corresponds to one of the execution cycles of the actor and specifies the number of tokens produced by the actor on that cycle. For example, suppose that the execution time for one firing of an actor is four cycles, and suppose that the output count (the number of tokens produced by the actor during each firing) is three. The output pattern could be expressed as a list of four values, such as [0,1,1,1], or [0,1,0,2], etc. In other embodiments the output pattern information can be specified in terms of time units (e.g., microseconds, etc.) instead of clock cycles.

Thus, the application development environment may receive execution characteristic information for the actors in the data flow program, such as execution times, initiation intervals, and/or access pattern information of the actors, and may utilize this information in generating the implementation of the data flow program. The use of detailed access pattern information which indicates the particular cycles during an actor's execution when input tokens are consumed and/or output tokens are produced enable the application development environment to achieve better optimizations than would be possible without the use of such access pattern information. Various examples of the use of access pattern information in optimizing data flow program implementations are described below.

FIG. 1A—Computer System

FIG. 1A illustrates a computer system 82 configured to execute various software programs according to the methods described herein.

As shown in FIG. 1A, the computer system 82 may include a display device configured to display one or more programs as they are created and/or executed. The display device may also be configured to display a graphical user interface or front panel of the program(s) during execution. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more graphical programs or software tools which are executable to perform the methods described herein. Additionally, the memory medium may store an application development environment used to create and/or execute data flow programs. The memory medium may also store operating system software, as well as other software for operation of the computer system. Various embodiments further include receiving or storing instructions and/or data upon a carrier medium.

Figure 1B:
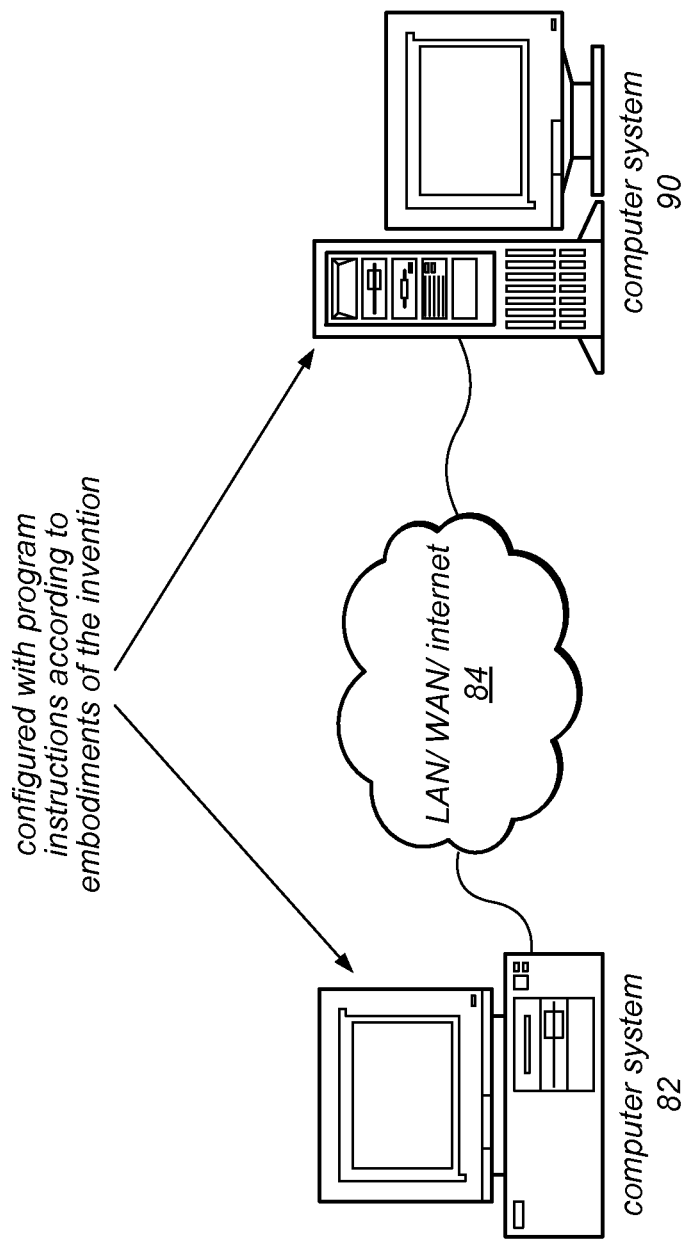
FIG. 1B illustrates a network system comprising two or more computer systems that may implement an embodiment of the present invention.

FIG. 1B—Computer Network

FIG. 1B illustrates a system including a first computer system 82 that is coupled to a second computer system 90. The computer system 82 may be coupled via a network 84 (or a computer bus or any other communication mechanism) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a program in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device coupled to the computer system 82. The device may include a programmable hardware element and/or may include a processor and memory medium which may execute a real-time operating system (RTOS). In one embodiment, the graphical program may be downloaded and executed on the device. For example, an application development environment with which the graphical program is associated may provide support for downloading a graphical program for execution on the device in a real-time system.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, digital signal processing, etc. Exemplary test applications where the graphical program may be used include hardware-in-the-loop testing and rapid control prototyping, among others.

However, it is noted that embodiments of the present invention can be used for a plethora of applications and are not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
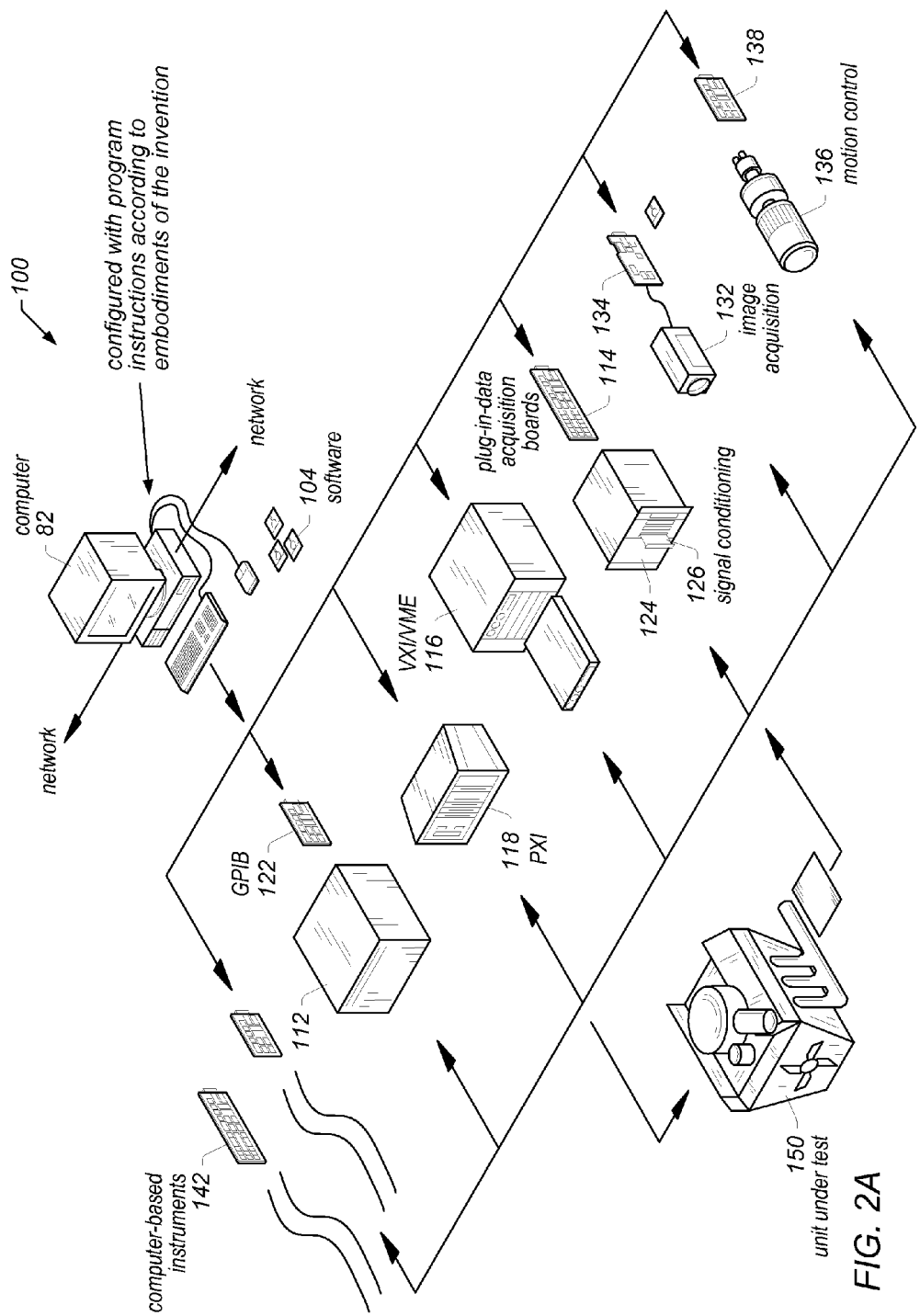
FIG. 2A illustrates an instrumentation control system according to one embodiment of the invention.

FIG. 2A illustrates an exemplary instrumentation control system 100 which may implement embodiments of the invention. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB (general purpose interface bus) instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the UUT or process 150, or may be coupled to receive field signals, typically generated by transducers. The system 100 may be used in or for a digital signal processing application, in a data acquisition and control application, in a test and measurement application, an image processing or machine vision application, a process control application, a man-machine interface application, a simulation application, or a hardware-in-the-loop validation application, among others.

Figure 2B:
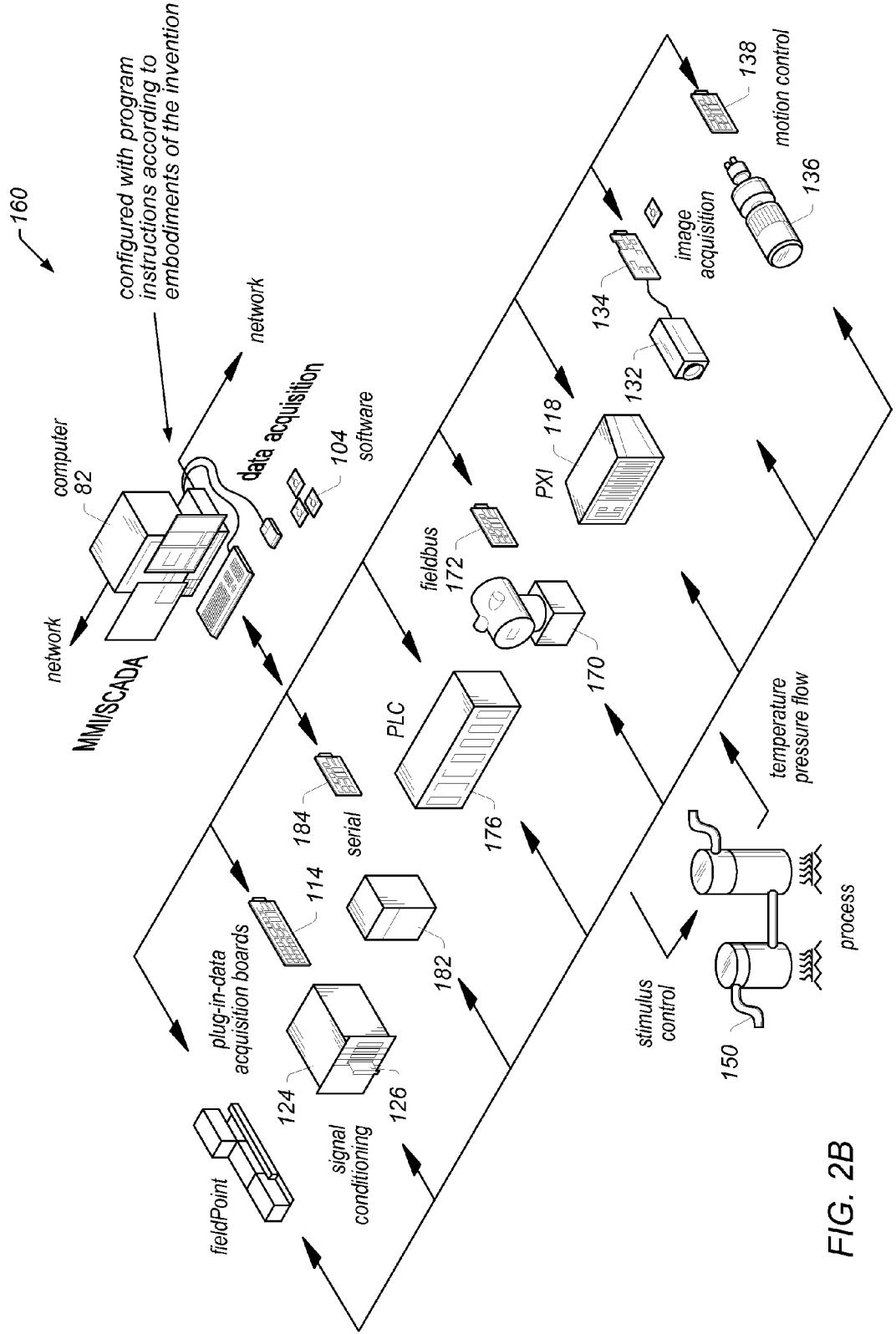
FIG. 2B illustrates an industrial automation system according to one embodiment of the invention.

FIG. 2B illustrates an exemplary industrial automation system 160 which may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

FIG. 3A is a high level block diagram of an exemplary system which may execute or utilize graphical programs. FIG. 3A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a program, such as a graphical program, that specifies or implements the functionality of one or both of the controller 92 and the plant 94. For example, a control engineer may use a modeling and simulation tool to create a model (e.g., graphical program) of the plant 94 and/or to create the algorithm (e.g., graphical program) for the controller 92.

FIG. 3B illustrates an exemplary system which may perform control and/or simulation functions. As shown, the controller 92 may be implemented by a computer system 82 or other device (e.g., including a processor and memory medium and/or including a programmable hardware element) that executes or implements a graphical program, or a program generated based on a graphical program. In a similar manner, the plant 94 may be implemented by a computer system or other device 144 (e.g., including a processor and memory medium and/or including a programmable hardware element) that executes or implements a graphical program, or may be implemented in or as a real physical system, e.g., a car engine.

In one embodiment of the invention, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real-time execution, e.g., a device including a processor that executes a real-time operating system (RTOS), or a device including a programmable hardware element.

In one embodiment of the invention, one or more graphical programs may be created which are used in performing Hardware in the Loop (HIL) simulation. Hardware in the Loop refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a graphical program or a program generated based on a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs which perform data acquisition, analysis and/or presentation, e.g., for digital signal processing, measurement, instrumentation control, industrial automation, modeling, or simulation, such as in the applications shown in FIGS. 2A and 2B, may be referred to as virtual instruments.

Figure 4:
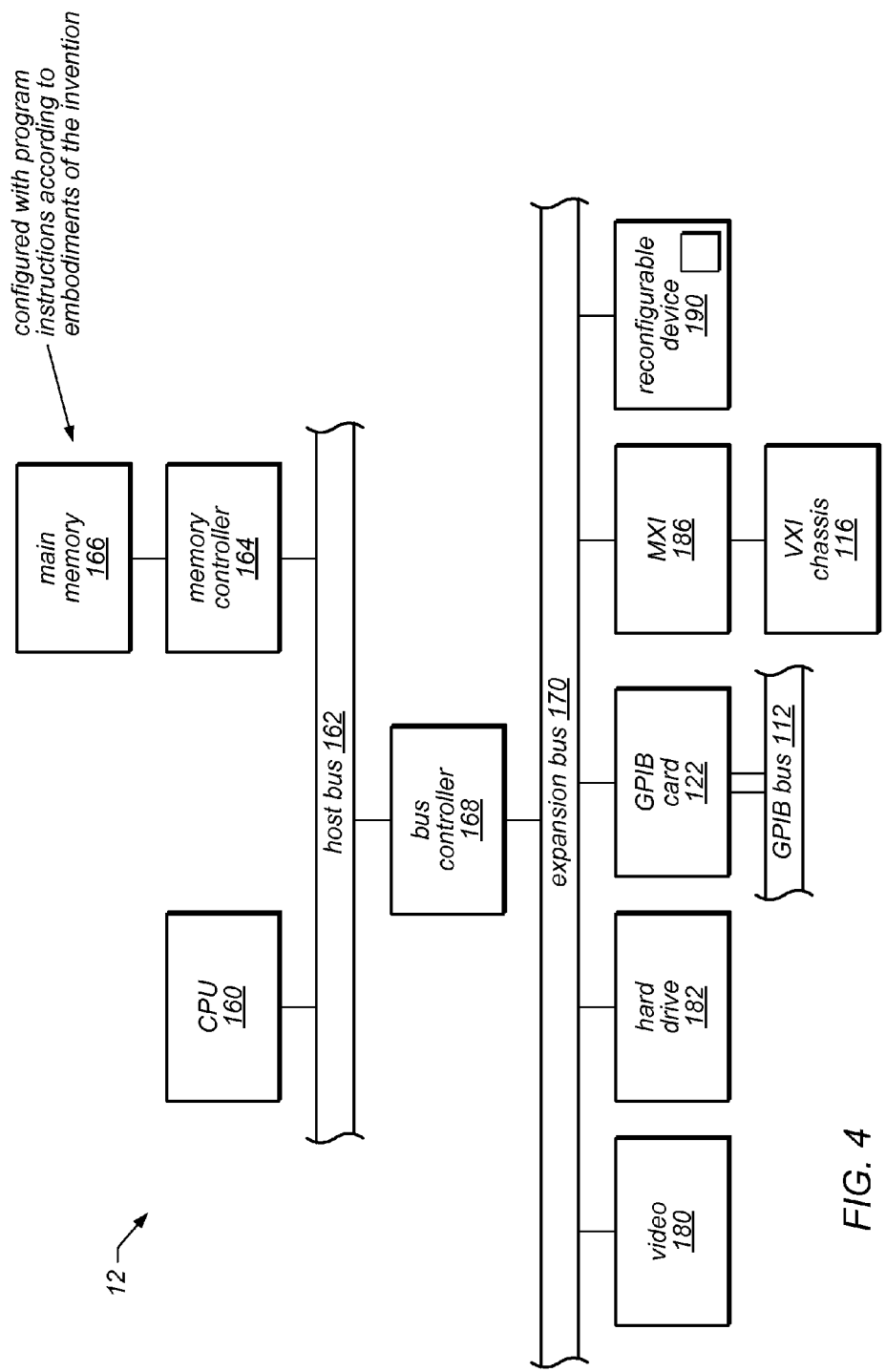
FIG. 4 is an exemplary block diagram of the computer systems of FIGS. 1A, 1B, 2A and 2B and 3B.

FIG. 4—Computer System Block Diagram

FIG. 4 is a block diagram representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, or any others, as desired. A memory medium, typically comprising RAM and referred to as main memory, 166 is coupled to the host bus 162 by means of memory controller 164. The main memory 166 may store program instructions implementing embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a RTOS. The device 190 may also or instead comprise a programmable hardware element. The computer system may be configured to deploy a graphical program or a program generated based on a graphical program to the device 190 for execution on the device 190. The deployed program may take the form of graphical program instructions or data structures that directly represent the graphical program, or that were generated based on the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program. In some embodiments, the graphical program and/or the program generated from the graphical program are data flow programs. In a further embodiment, the generated program may be a hardware configuration program, and may be deployed to a programmable hardware element. Moreover, in some embodiments, the generated program may be suitable for deployment in a distributed manner, e.g., across multiple, possibly heterogeneous, targets. Thus, for example, a first portion of the program may be directed to a CPU based platform, while another portion may be targeted for a programmable hardware element.

Graphical Specification and Constraint Language

FIGS. 5-12 are directed to a graphical specification and constraint language for specifying and implementing a program with required execution properties. More specifically, the graphical specification and constraint language may allow, facilitate, or provide for, specification of a model of computation and explicit declaration of required execution properties for programs, in addition to specifying the program functionality. In various embodiments, the graphical specification and constraint language may be useable via a graphical or textual interface. In other words, the language may be presented to designers with textual and/or graphical syntax.

For example, in one exemplary embodiment, the specification and constraint language may include one or more of the following features:

- formal semantics defined over the graphical design constructs (functional blocks, terminals, wires, etc.) in a (graphical) designer tool;
- the ability to constrain multiple aspects, including structure, behavior and timing; or
- the availability of both graphical and textual syntax.

Constraint usage in a design flow may include one or more of:

- the combination of functional specification (with graphical design constructs in the designer tool) and design intent (with required execution properties);

automatic design parameter tuning to meet design intent; or automatic constraint manipulation during design transformation (e.g., various optimizations to increase performance or resource utilization).

The specification and constraint language may facilitate analysis and optimization of graphical programs developed in the language. For example, one or more software tools, e.g., a designer tool, may exploit the relationship between the formal data flow semantics and underlying timing models of target platforms (or hardware actors) for analysis and code generation. By utilizing such (hardware) models in combination with specified execution requirements via the specification and constraint language, some tasks or operations, such as the "stitching together" of functional blocks, e.g., IP blocks, e.g., for implementation in hardware, may be performed more easily, efficiently, effectively, and/or more reliably, as will be described in more detail below. Note that the terms "designer tool" and "development environment" may be used interchangeably.

Figure 5:
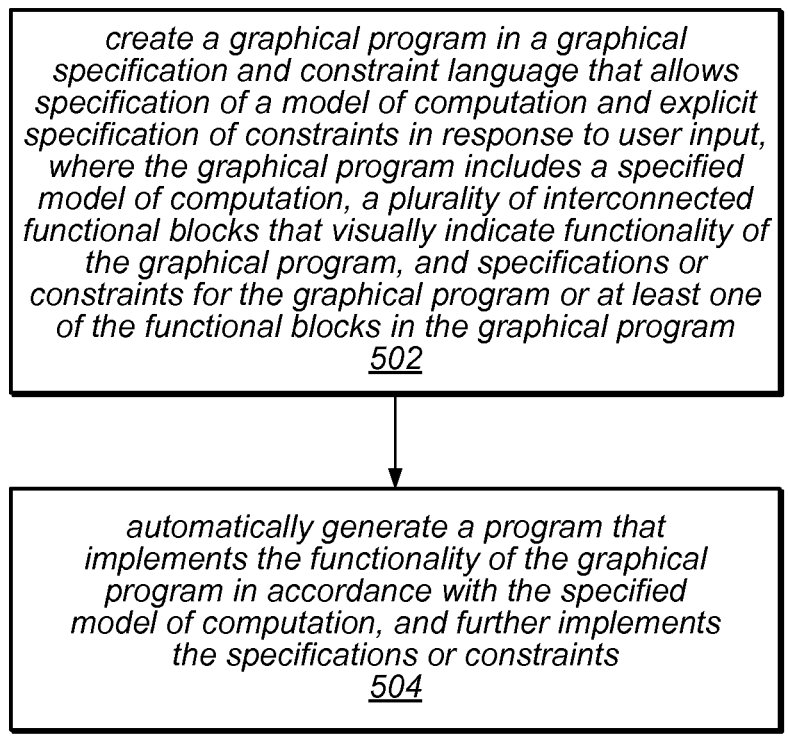
FIG. 5 is a flowchart diagram illustrating one embodiment of a method for creating a program.

FIG. 5—Flowchart of a Method for Creating a Program

FIG. 5 illustrates a method for creating an implementation program from a graphical application program. The method shown in FIG. 5 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

First, in 502 a graphical program (which may be referred to as a diagram) may be created on the computer system 82 (or on a different computer system), e.g., in response to user input. For example, the graphical program may be created or assembled by the user arranging on a display a plurality of nodes or icons (also referred to herein as functional blocks) and then interconnecting the nodes to create the graphical program. In response to the user assembling the graphical program, data structures may be created and stored which represent the graphical program. The nodes may be interconnected in a data flow format, although in other embodiments, at least some of the nodes may be interconnected in a control flow or execution flow format, as desired. The graphical program may thus comprise a plurality of interconnected nodes or icons (functional blocks) which visually indicate the functionality of the program. As noted above, the graphical program may comprise a block diagram and may also include a user interface portion or front panel portion. Where the graphical program includes a user interface portion, the user may optionally assemble the user interface on the display. As one example, the user may use a designer tool to create the graphical program. As another example, the user may use the LabVIEW graphical programming development environment (possibly with suitable extensions) to create the graphical program. In an alternate embodiment, the graphical program may be created in 502 by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired. The graphical program may implement a measurement function that is desired to be performed by the instrument. For example, in an exemplary embodiment, the graphical program implements digital signal processing functionality. The graphical program may be or include a graphical data flow program.

As noted above, in some embodiments, a graphical program development environment may be provided which includes a graphical specification and constraint language that allows specification of a model of computation and explicit declaration of required execution properties. Thus, in some exemplary embodiments, the graphical program may be written in the graphical data flow specification and constraint language. The graphical data flow program may thus include a specified model of computation, a plurality of interconnected functional blocks that visually indicate functionality of the graphical data flow program in accordance with the specified model of computation, and specifications or required execution properties for the graphical data flow program or at least one of the functional blocks in the graphical data flow program.

In some embodiments, the specification and constraint language may be considered to be a combination of a specification language and a constraint language, although the two may overlap somewhat, and some distinctions between specifications and required execution properties may be subtle, e.g., based on context, as discussed below.

In one exemplary embodiment, the graphical program may be developed via a software tool, e.g., a designer tool, which provides a graphical design environment for data flow oriented system design. The basic building constructs in the designer tool may include functional blocks (which may also be referred to simply as "blocks"), terminals, and wires. Blocks may be designed with data flow semantics, and may communicate with each other via terminals (on the blocks) through wires connecting the blocks. The design process from a user's viewpoint may thus include selecting (and/or creating) the appropriate blocks, arranging them, and connecting the terminals of the blocks using wires. To make the design process more efficient, a rich library of primitive blocks may be provided. Moreover, the designer tool may also provide or accommodate third party function blocks, e.g., IP blocks, and/or user-defined function blocks, which may be organized into a user library.

As noted above, the designer tool may include or utilize a graphical data flow specification and constraint language that allows explicit declaration of required execution properties, in addition to component-based (e.g., functional blocks and their interconnections) design. Note that required execution properties may convey certain information more effectively than the component-based design aspects of the language. For example, the component-based design portion of the language, which may be referred to as the component or specification language, may be used to implement or present a "skeleton" of the program or system, which includes individual functional blocks and the structural connectivity among those blocks, whereas constraint-related aspects of the language, which may be referred to as the constraint language, may represent properties associated with the building blocks, with the structural connectivity, with the program or system performance, and so forth. Moreover, rather than simply describing various properties of the blocks or their connectivity, required execution properties may be used as a means to convey design space exploration intent. Thus, required execution properties may specify or indicate the direction in which designers would like to tune the system, e.g., to improve or optimize system performance or resource utilization.

Note that a specification is usually within some domain of discourse, while a constraint is generally outside the domain.

For example, if the domain of discourse is an untimed model of computation (static data flow for example), then any timing declaration may be considered a constraint. But if the domain of discourse is timed data flow, then timing may be part of the specification. There can be different domains of discourse supported by a single designer tool.

In some embodiments, the constraint language may be defined over a set of subjects, such as, for example, entities (including functional blocks, terminals and wires), properties (structural, behavioral or timing) associated with the entities, and constants. In some exemplary embodiments, the specifications or required execution properties may be with respect to one or more of: throughput of terminals on the functional blocks, throughput of the graphical program, clock rate of the (possibly graphical) program, buffer sizes between functional blocks, or latency (or delays) between functional block inputs and corresponding functional block outputs, among others.

Relations among entities may be described by Boolean operators, arithmetic operators, or temporal operators. Subjects and relations may thus form the foundation of the specification and constraint language. Note that the language may define precise and formal semantics, but in some embodiments may be presented to designers with both textual syntax and graphical syntax, as mentioned above. Thus, the graphical specification and constraint language may integrate well with or into the graphical design environment of the designer tool.

In some embodiments, the specifications or required execution properties included in the graphical program may include one or more of: input count (IC), output count (OC), execution time (ET), initiation interval (II), input pattern (IP), and/or output pattern (OP).

Input and output patterns may be referred to collectively as access patterns. Thus the term "access pattern" may refer to an input pattern or an output pattern.

Note, however, that the above items are meant to be exemplary only, and a skilled practitioner will readily recognize that other items or terms may be used as desired. For example, in some embodiments, the specifications or required execution properties may also include information regarding parameters or states of the functional blocks or target platforms. As one example, the ET may specify an amount of time and a flag denoting whether the execution time is exact or worst case. As another example, in some embodiments, the input pattern (IP) or output pattern (OP) may be a Boolean sequence that has a length of at most the value of II. As a further example, in some embodiments, the IP and/or OP sequences may not be Boolean, e.g., may be integers, and the sum of the sequence elements is equal to IC or OC, respectively.

Note that in some embodiments in which AP is represented as Boolean sequences, the beginning of the IP sequence aligns with the beginning of firing, whereas the end of the OP sequence aligns with the end of firing.

In some embodiments, the specifications or required execution properties may have a standardized format, such that the functional blocks (e.g., IP blocks) can be described by third parties. For example, tools or specifications such as IP-XACT may be extended to include or define an interface for accessing the information regarding implementation and the high-level model of computation for the functional blocks.

In one embodiment, in addition to the foundational or basic constraint language, a set of required execution properties commonly used by designers may be provided, e.g., throughput constraint, latency constraint, etc., which may not only provide convenience to designers, but may also allow the designer tool to associate or invoke more effective assisting tools to analyze the graphical program with respect to particular required execution properties. For example, when the designer adds a throughput constraint to the system, a static analysis tool may be invoked to determine the actual throughput, and therefore to determine whether the constraint is met. In contrast, if the designer expresses the same throughput constraint via the basic constraint language, a more elaborate flow may be engaged, e.g., running a simulation tool and checking the timed trace against the constraint.

To meet these unique performance and resource needs, the designer tool may provide a framework for analyzing programs/applications and/or application models, explore tradeoffs between performance and resource usage, or select implementation strategies. Through specifications and/or required execution properties on the graphical program (which may be referred to as a diagram), the designer tool may capture the user's intent for the application and may use the framework to provide early feedback on the design while also generating efficient and performant implementations.

Figure 6A:
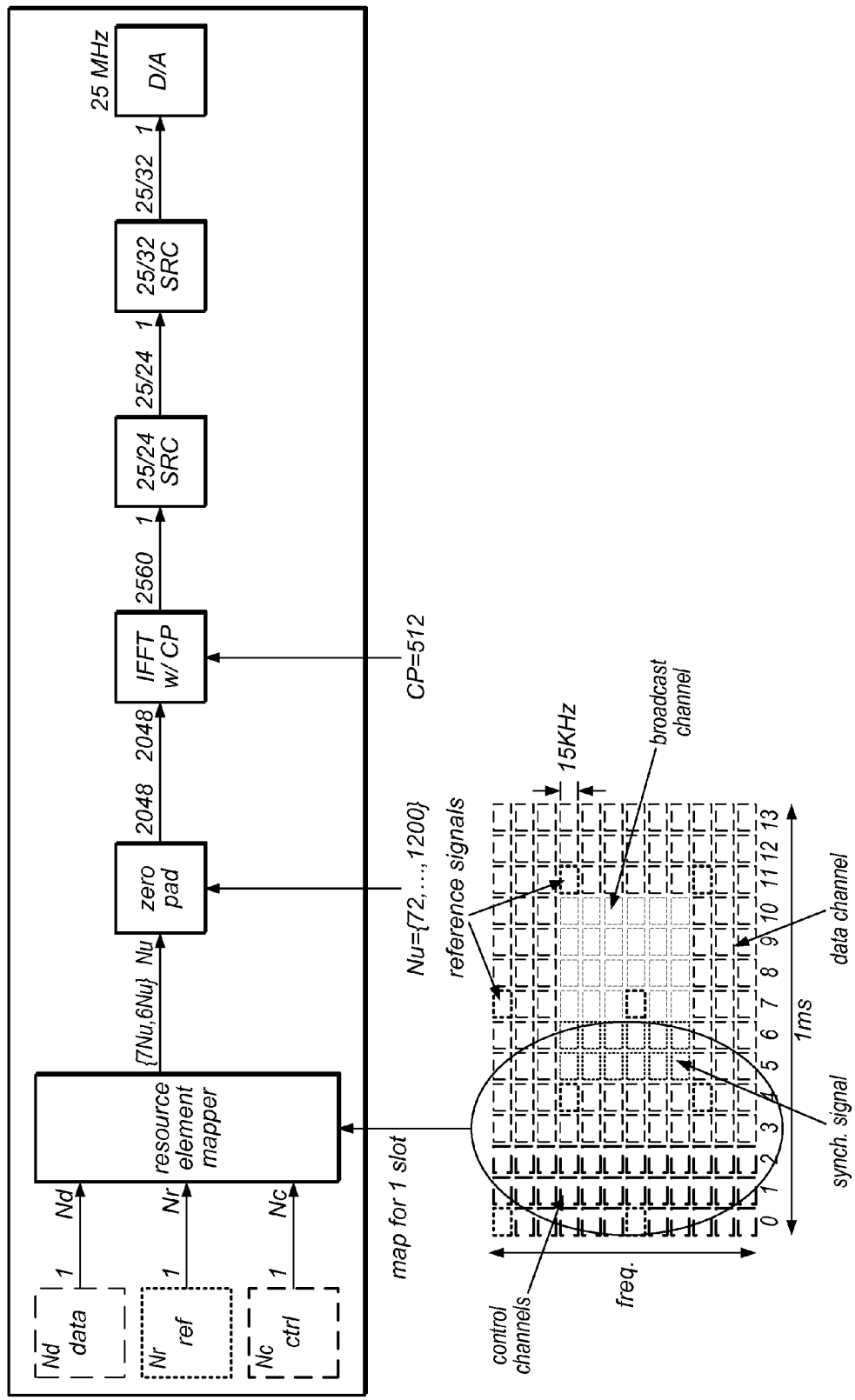
FIG. 6A illustrates an orthogonal frequency division multiplexing (OFDM) transmission modulation algorithm for a communication protocol, according to one embodiment.
Figure 6B:
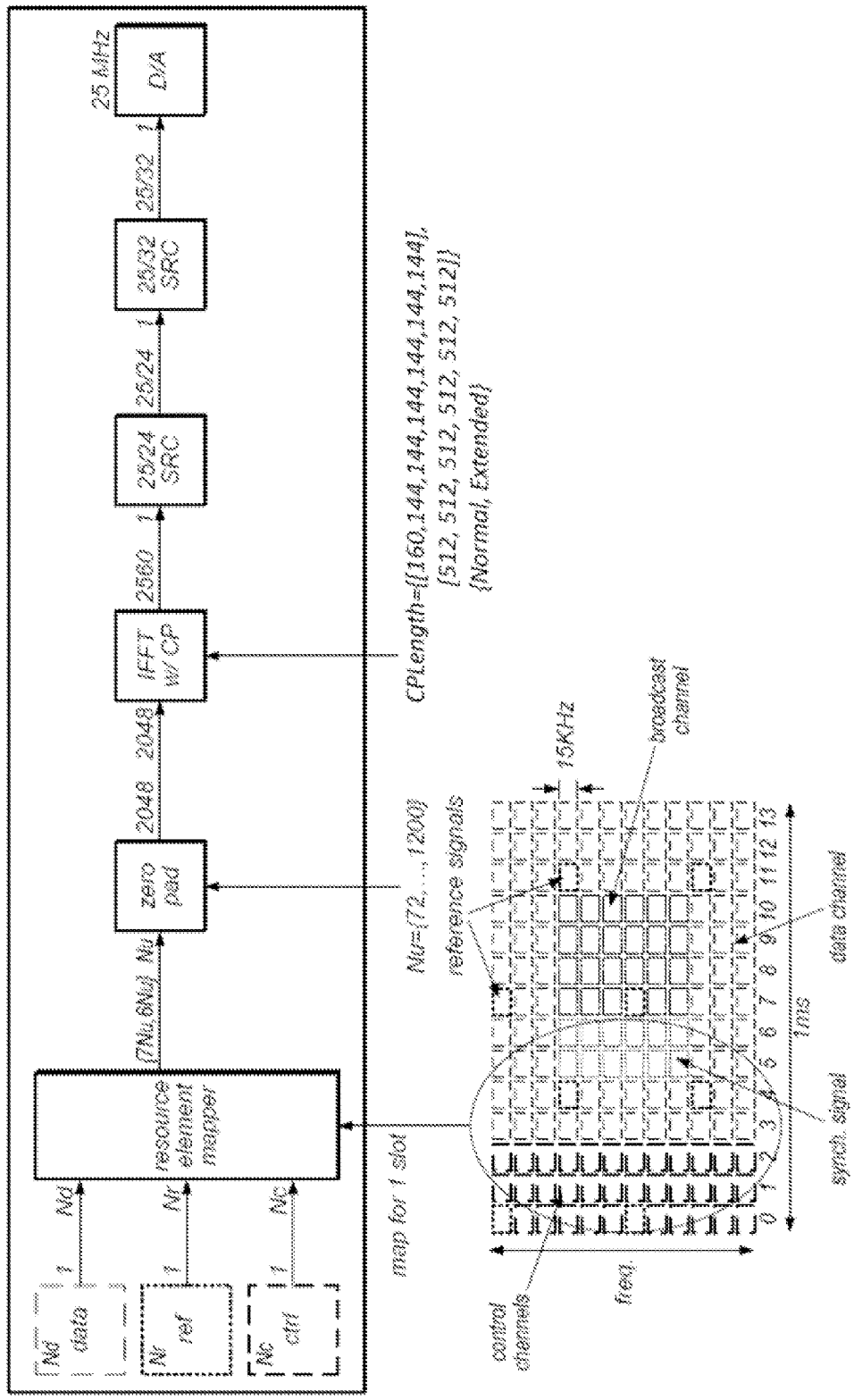
FIG. 6B illustrates a parameterized version of the OFDM transmission modulation algorithm of FIG. 6A, according to one embodiment.

FIG. 6A is a drawing of an exemplary orthogonal frequency division multiplexing (OFDM) transmission modulation algorithm for a communication protocol. This drawing was created by a signal processing domain expert and shows how these algorithms are typically drawn when specifying design elements early in the design process. Common elements that are shown include: functional block identification, data flow relationships between functional blocks, and data unit (or token) production and consumption. For example, as may be seen, the functional block identifiers shown include identifying labels, such as "Resource Element Mapper", "Zero Pad", "IFFT w/CP", "25/24 SRC", "25/32 SRC", and "D/A". Data flow relationships among the identified functional blocks are indicated by directional wires or arrows connecting the functional block identifiers. Data unit (or token) production and consumption are indicated by numeric values displayed proximate to the wires, where values on incoming wires (to functional blocks) denote token or data consumption per firing of the block, and values on outgoing wires (from functional blocks) denote token or data production per firing of the block. Thus, the drawing of FIG. 6A indicates how a user might typically indicate functional blocks implementing a desired algorithm.

Figure 7A:
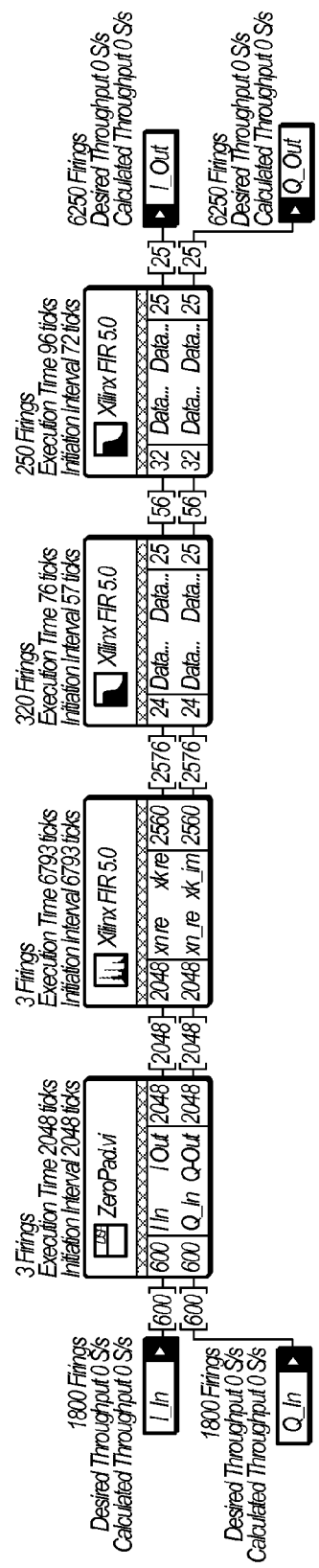
FIG. 7A illustrates the OFDM algorithm of FIG. 6A represented by or in an exemplary designer tool, where the algorithm is represented or specified by a graphical program expressed in a graphical specification and constraint language, according to one embodiment.

FIG. 7A shows the algorithm (OFDM) of FIG. 6A represented by or in an exemplary designer tool, where the algorithm is represented or specified by a graphical program or diagram (per 502 above) expressed in the above mentioned graphical specification and constraint language. As shown in FIG. 7A, the graphical program includes functional blocks corresponding to those identified in the drawing of FIG. 6A, and further includes the data unit (or token) production and consumption values (rates) indicated in that figure. Thus, in some embodiments, the graphical specification and constraint language may provide a mechanism for (and the graphical program of 502 may include) specification of such production and consumption rates, described in more detail below with reference to FIGS. 8A-8C.

Note that at least one of the functional blocks, e.g., the ZeroPad block, is labeled "ZeroPad.vi", which indicates a LabVIEW graphical program (or subprogram), i.e., a VI or Virtual Instrument, also known as a function node, that is associated with or included in the functional block, and implements core functionality of the block. Similarly, others of the functional blocks of FIG. 7A indicate third party IP blocks such as Xilinx FFT 7.0 and Xilinx FIR 5.0, which are respectively associated with or included in the functional blocks. Thus, in some embodiments, one or more of the functional blocks may be implemented by extending or wrapping pre-existing graphical program nodes or IP blocks.

As also shown in FIG. 7A, in this example, the graphical program also includes additional information regarding the functional blocks and their interconnections. For example, note that execution time and initiation interval (both in clock cycles or ticks) for each functional block are displayed above the block. Thus, an FIR functional block with execution time of 163 ticks and an initiation interval of 144 ticks requires 163 clock cycles to complete a single execution, and requires at least 144 clock cycles between firings. Moreover, in this particular example, the number of firings per program cycle is also shown for each functional block. Thus, the FIR functional block with "320 firings" indicated will execute 320 times over the course of a single program execution iteration. As may also be seen, FIG. 7A includes buffer sizes displayed on the wires connecting the functional blocks, e.g., a buffer of size 56 is interposed between the two FIR functional blocks. Note that the size of such buffers may be a limiting factor for throughput, and so is a candidate item for modification, as will be shown and described below.

As noted above, in some cases, simple component-based specifications (coupled functions or functional blocks) may not be adequate for users to describe their applications. For example, in the example of FIG. 6A, the design is not constrained regarding resource utilization or throughput. In some embodiments, the designer tool may be configured to estimate throughput and execution behavior and present the estimates to the user to aid in developing the application. However, while it may be useful for the designer tool to determine and provide such throughput and execution estimations to users, they may also want to specify required execution properties that are key elements of their design. For example, the user may not be able to modify the timing of a block or may need to connect their application directly to hardware I/O that requires a specific data rate. These specified required execution properties may provide guidance to the designer tool to help it provide optimal implementations to meet specific demands of the application.

As noted above, in various embodiments, specifications or required execution properties supported by the designer tool (and possibly included in the graphical program) may include or be with respect to throughput of terminals on the functional blocks, throughput of the graphical program, clock rate of the graphical program, buffer sizes between functional blocks, or latency between functional block inputs and corresponding functional block outputs, among others. The designer tool may take these required execution properties as inputs to the analysis framework and report back whether or not a specific constraint can be met, as well as additional information regarding the rest of the graphical program (application), as will be described in more detail below. Additionally, in some embodiments, the specifications or required execution properties may be with respect to the graphical program itself. Thus, for example, the graphical program may include one or more specifications or required execution properties on the graphical program, including one or more of: throughput of the graphical program, or buffer sizes between functional blocks of the graphical program, among others.

As may be seen by comparing FIGS. 6A and 7A, the designer tool may capture design specifications in a way that mirrors how a user might naturally draw their algorithm. Thus, the tool may allow the user to intuitively specify or express their desired application by allowing them to wire functional blocks (nodes) together, set token input and output rates, and specify timing or behavioral elements of each block independently.

Based on the design shown, how the application will execute may be inferred or estimated, as well as how resources are utilized. Additionally, performance metrics of throughput and latency may also be determined or estimated by analyzing the graphical program.

Figure 8A:
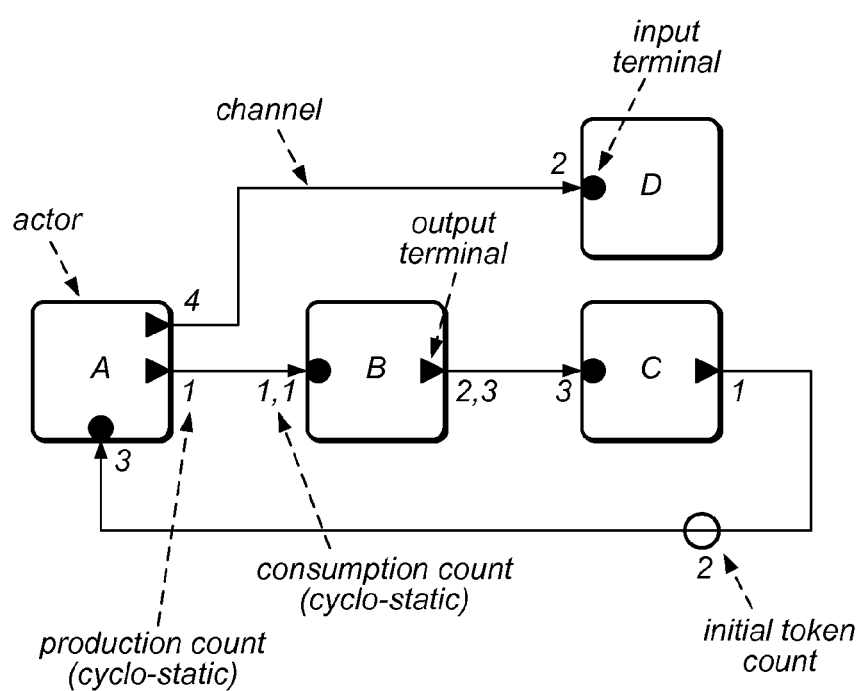
FIGS. 8A-8C illustrate an exemplary specification of token consumption and production rates in a graphical program, according to one embodiment.

In some embodiments, as illustrated in FIG. 8A, the diagram may represent a varying relation of token production and consumption rates. For example, a cyclo-static behavior for an actor may be described or specified by a comma separated token consumption/production rate, e.g., (1, 1) for consumption and (2, 3) for production, which means that in a first phase the actor will consume 1 token and produce 2 tokens, and in a second phase the actor will consume 1 token and produce 3 tokens. The next time around the actor will repeat phase 1 and then 2 again, and so forth. Thus, a static cyclic description or specification of token consumption-production relations for the data flow diagram may be provided. Such a pre-specified modal behavior is generally referred to as Cyclo-Static Data Flow, or CSDF. Note, however, that any other representations of the token consumption/production rates may be used as desired. For example, as illustrated in FIG. 8A, in some embodiments the token consumption/production rates may be displayed at the terminals to which they apply, and may not be parenthesized. As may be seen, actor A consumes 3 tokens and respectively produces 4 tokens and 1 token at its two output terminals. Actors B, C, and D also denote their respective token rates at respective terminals. Note that in the channel from actor C to actor A includes a specified initial token count (2), which may break the cyclic dependency of the programs to allow actor A to start firing.

In some embodiments, the user may chose to express relations between token production or consumption rates of different parts of the diagram or program. For example, note that in FIG. 6A the parameter Nu is referred to in different locations, and consumption and production rates are expressed as functions of such a parameter. Furthermore, in some embodiments, a range of possible values may be expressed or specified, and at a later use, the same user, or a different user of this part of the diagram, may commit a specific value to that parameter, therefore binding (still statically) the new value to all other usages of the same label or reference in the program. Such a generalized model of CSDF is known as parameterized CSDF, or PCSDF. Once this parameter value has been defined or bound, the analysis may be performed on the resulting graph, which may ensure that the resulting graph is valid and, consistent, and further optimizations can be applied to it to achieve a performant implementation.

In one embodiment, at least one of the specifications or required execution properties may specify tokens consumed and produced in a plurality of graphically indicated phases or modes. Moreover, in some embodiments, it may be important to specialize or restrict the CSDF actors to token production/consumption values of 0 or 1, which may be denoted "0-1 CSDF". More specifically, the number of tokens consumed and produced may be respectively restricted to be 0 or 1 at each phase. This approach may provide a good balance between the flexibility of being able to specify or declare different phases of the execution of the action, while still keeping the model analyzable at reasonable complexity.

In some embodiments, as is the case for PCSDF models, the number of tokens consumed and produced may be resolved at the time the functional blocks are connected, e.g., at edit time. Said another way, the method may include configuring the at least one functional block when the functional blocks of the graphical program are connected together. The configuring may determine values for IC, OC, ET, IP, and OP for the at least one functional block, either directly or indirectly (e.g., via intermediate calculations).

Thus, a functional block's context in the graphical program may impact its token-related (or other) parameters. Additionally, the number of tokens consumed and produced may be specified as a different functional block in the graphical program.

In some embodiments, a configuration scope may be determined for the at least one functional block when the at least one functional block is connected. The at least one functional block may then be configured at runtime in accordance with the determined configuration scope. The configuring may determine values for IC, OC, ET, IP, and OP for the at least one functional block.

In one embodiment, the at least one functional block may have multiple possible configurations of IC, OC, ET, II, IP, and OP. The method may include determining a configuration from the possible configurations based on the specifications or required execution properties of the at least one functional block, of another functional block, or of the graphical program.

Furthermore, in some embodiments, this value assignment to a parameter in a PCSDF program may be performed in a dynamic manner, where the value of the parameter is not known until runtime. In order to be able to analyze all possible relations between parameters a domain of such parameter space should be known statically before the analysis occurs. For the diagram to be analyzable, the possible times at which parameters change may be restricted to execution iteration boundaries.

In one embodiment, the analysis is performed by exhaustively analyzing all the possible parameter values, and combinations of multiple parameters. In another embodiment the analysis is performed in a symbolic manner, where the development environment or designer tool keeps track of the relations of the different parameters and modes in a symbolic manner, and therefore may produce or generate expressions that describe multiple possible runtime behaviors.

Figure 8B:
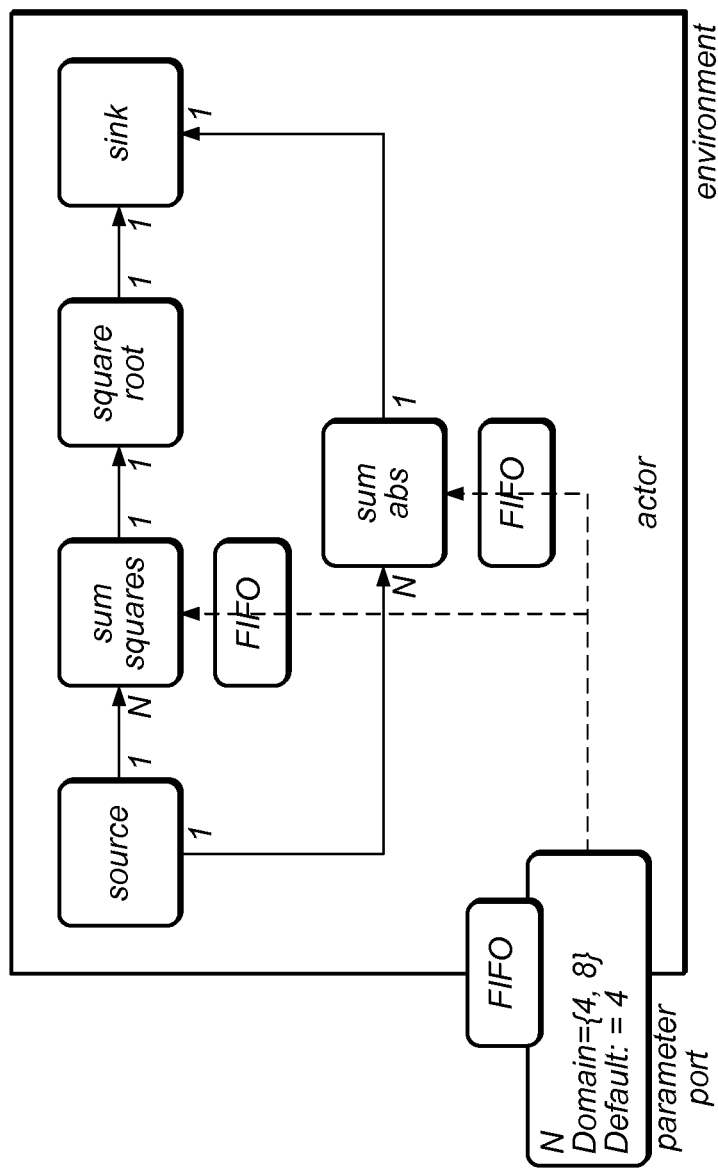

As is shown in FIG. 8B, similar to data terminals passing data to the program at runtime, parameter terminals may pass parameter values from the environment to a running program. These parameter values may be distributed to the diagram according to the model described above. For example, in one embodiment, as multiple iterations may overlap in time, buffering elements organized as FIFOs may be used to regulate the flow between different parameters, and the points at which they are consumed in time.

Figure 8C:
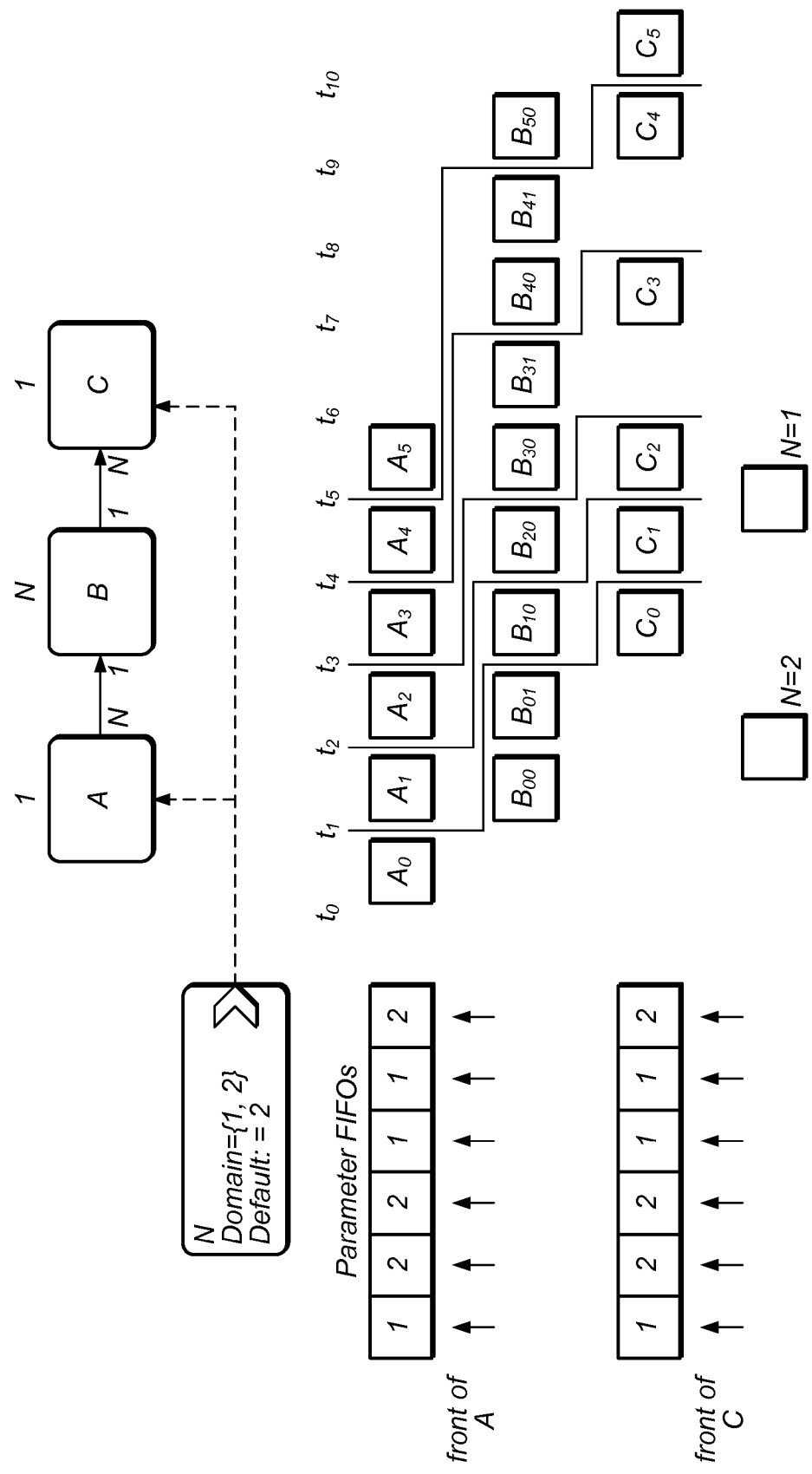

The resulting schedule for the program in FIG. 8A as computed by one embodiment is shown in FIG. 8C. This schedule ensures organized transfer of both parameter and data values, while still allowing for overlapping execution to increase throughput.

Hierarchy

In one embodiment, a portion of the graphical program (or data flow diagram) may be selected to be treated as a reusable unit (e.g., as a functional block in a different graphical program), with similar properties to that of a functional block, e.g., including a model of computation, and specifications and required execution properties such as IC, OC, ET, II, IP and OP. Such a portion may form a hierarchical arrangement (sub-diagram) for which these characteristics can be computed, e.g., by the design tool, based on the model of computation, specification or required execution properties, and connectivity of the selected portion of the graphical program. More generally, the data flow diagram (or graphical program) may be hierarchical, including one or more sub-diagrams. Furthermore such sub-diagrams may conform to all of the properties of the actor definition language (ADL) described herein. A sub-diagram may be represented as an actor within a graphical program, and upon a specific action on that actor, the actors, interconnections, specifications or required execution properties, and configurations contained within the sub-diagram may be selected or shown for display, editing, or analysis.

Structural Program Descriptions

Figure 29:
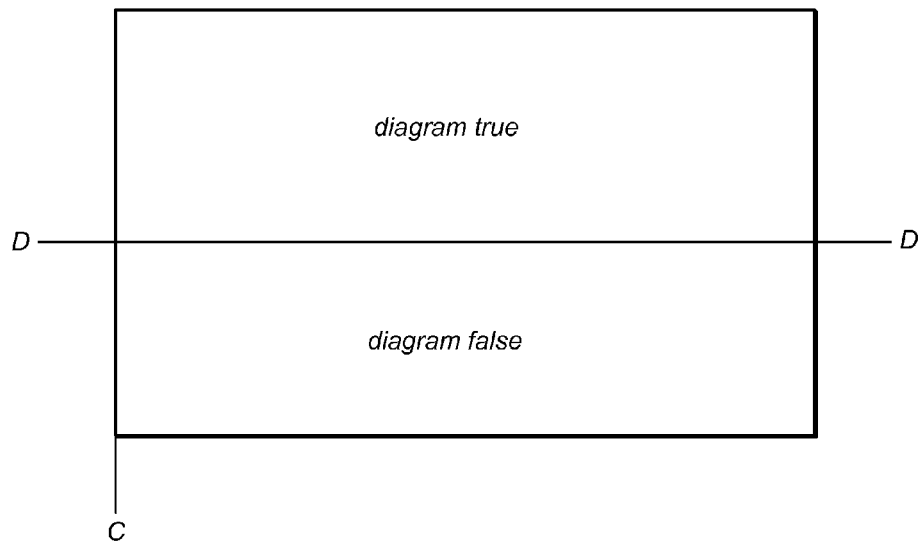
FIG. 29 is a high-level illustration of an if-then-else version of a switch/select or case structure, according to one embodiment.

In one embodiment, the graphical program may include structured programming elements that segment a graphical program into portions, where the portions are visible at the same graphical level, but within visual boundaries. They may form a hierarchy, and rules may be specified as to how interconnections are made within, outside, and across such boundaries. One such structural element is a switch/select or case structure, a simple if-then-else construct of which is illustrated in FIG. 29. As shown, it has data terminals D, and a control terminal C. Depending on the control value, data may flow in one segment (diagram) or the other. For one embodiment of such structural elements, exemplary rules may be defined as follows:

Let the inner diagrams be the ones connected to the "right" side of the switch and "left" of select (also referred to as the inner vertical of a future structure);

No (data or parameter) wire may cross from/to the inner diagrams (above) to/from any sub-diagram connected to the outer part of the switch/select (before or after the switch/select pair or corresponding structure); and The inner sub-diagrams may not connect to each other.

It should be noted that terminals/ports may connect (externally) otherwise disconnected components, so the rules above may apply to these elements as well.

Thus, in some embodiments, one or more of the functional blocks may comprise respective hierarchical elements. The hierarchical elements may include a case structure, or a sub-diagram, comprising a respective plurality of interconnected functional blocks. Other hierarchical elements may be utilized as desired.

Continuing the method of FIG. 5, in 504, a program may be generated that implements the functionality of the graphical program in accordance with the specified model of computation, and further implements the specifications or required execution properties. In some embodiments, the program may be targeted for implementation in hardware, e.g., the program may be useable to configure a programmable hardware element, such as an FPGA, to perform the functionality subject to the specifications or required execution properties. For example, the method may include generating a hardware configuration program based on the program, where the hardware configuration program is useable to configure a programmable hardware element, such as an FPGA.

Alternatively, the program may be targeted to a processor based platform, and thus may be compiled and/or interpreted for execution by one or more processors. More generally, in various embodiments, the generated program may be targeted for execution on any of a variety of platforms, including, for example, collections of FPGAs (or other programmable hardware elements), multi-core processors, multi-processor systems, embedded processors, or any combinations thereof. Thus, the platform may be homogenous or heterogeneous.

In various embodiments, the generated program may be a textual data flow program, e.g., in the C programming language, or a graphical data flow program. For example, the generated data flow program may be a LabVIEW graphical program (VI).

In some embodiments, the generated program or description may not be data flow, but rather may be in an imperative program form. Furthermore, a more specific hardware-centric description, e.g. one at the register transfer level (RTL, e.g., VHDL or Verilog, SystemC), may be used for implementation directly. Similarly, when targeting (instruction level) processors or many cores or graphical processing units (GPUs), descriptions or programs more suitable for those targets may be generated directly, e.g., annotated or modified imperative code, such as C/CUDA (Compute Unified Device Architecture), or OpenCL. Thus, in various embodiments, the generated program may be of any type desired.

In some embodiments, the method may further include analyzing the graphical program, including analyzing the specifications or required execution properties, thereby producing analysis results. The automatic generation of the program may then be performed based on the analysis results.

In one embodiment, at least some of the model of computation, and specifications or required execution properties, may be projected onto a lower dimensional space to simplify and speed at least a portion of the analyzing. Examples of such lower-dimensional projections include a simplified model of computation, or a less specified or constrained access pattern. Thus, for example, the analysis tool may chose to ignore access patterns specifications from specific functional blocks, and provide a resulting implementation that consumes all tokens before running a given functional block, and similarly produces all the tokens before signaling a connected functional block that it has completed its operation. Moreover, in some embodiments, simple analysis may be performed in real-time, and complex and more time-consuming analysis may be performed as a background process as time permits in an asynchronous manner, e.g., while the method (e.g., designer tool) performs other functions.

In one embodiment, the steps of the analysis may be stored, codified, or remembered, as a model transformation during (design) exploration, and may be reproduced for either code generation, or secondary (design) exploration.

In some embodiments, the designer tool may utilize or include various models to aid in analyzing the graphical program. For example, in one embodiment, the designer tool may include one or more platform models that may include information regarding target platforms, and/or one or more application models that include information regarding applications or graphical programs. In one embodiment, a platform model is or includes a set (i.e., unchanging) model of a platform element. For example, it may be a model (including for example, clock speed, FPGA resources, etc.) of a piece of hardware or a set of known parameters of a software block, such as, for example, how long it will take to execute, how many resources it will consume, and so forth. An application model is a model of the actual application itself, and includes which blocks are connected together, how they will execute, and so forth.

In one embodiment, the specification or required execution properties may include one or more user-provided specifications. The method may automatically convert the one or more user-provided specifications into a corresponding one or more required execution properties before the analyzing and automatically generating the program. For example, a user provided specification for throughput at the model of computation level may result in two required execution properties at lower levels: a constraint that specifies the clock frequency at which the program on the hardware element should execute, and a constraint on the number of cycles the program should take overall, resulting in a total amount of time that the program takes to execute. Similar required execution properties can be directly or indirectly applied for buffer sizes and latency.

Further details regarding the analysis of the graphical program are provided below.

FIG. 9-13—Exemplary Designer Tool

FIGS. 9-13 are directed to an exemplary designer tool and its use, according to various embodiments. However, it should be noted that the embodiments described are meant to be exemplary only, and are not intended to limit the designer tool or its products to any particular form, function, or appearance.

Figure 9:
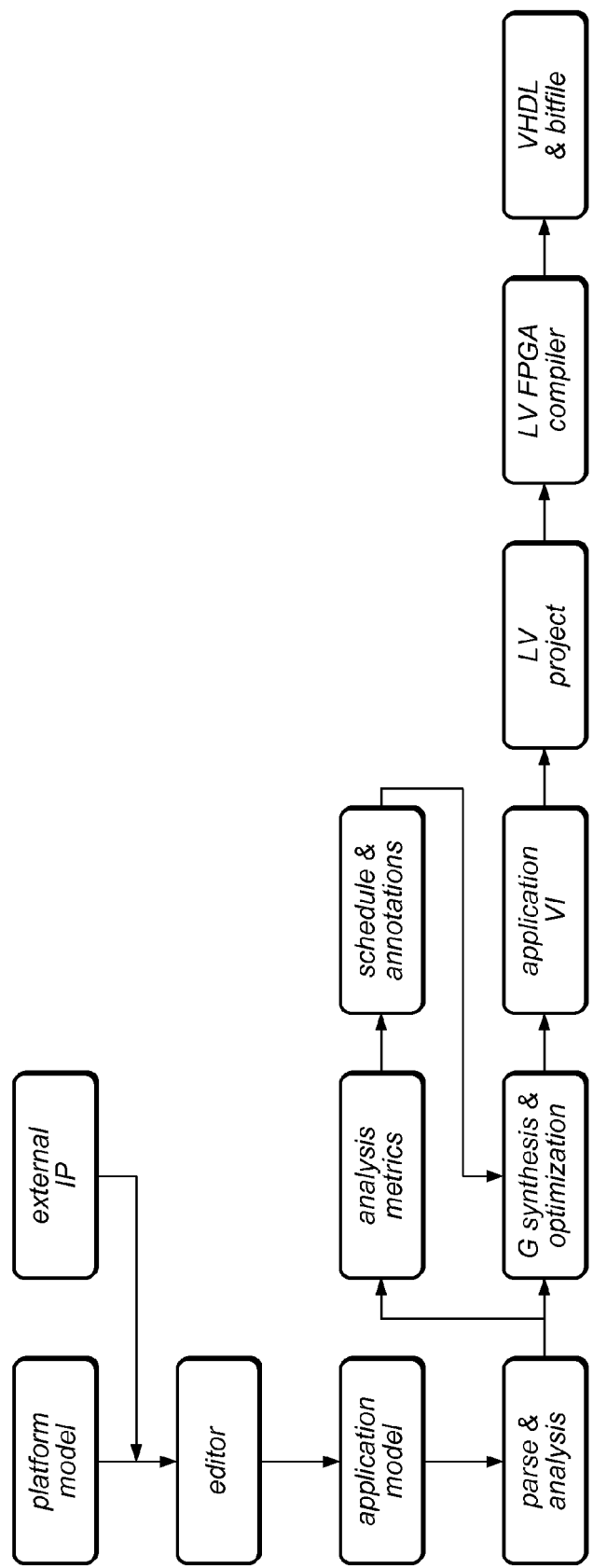
FIG. 9 illustrates an exemplary high-level architectural diagram for a designer tool, according to one embodiment.

FIG. 9 illustrates an exemplary high-level architectural diagram for a designer tool, according to one embodiment. According to this exemplary architecture, specifications and/or required execution properties may be introduced or specified by the user via the designer tool (e.g., via an editor portion of the tool) or through the design of their functional blocks, e.g., their IP blocks. For functional block-specific requirements, these specifications or required execution properties may be either properties of the functional block (such as execution time and initiation interval) or known properties of how a block relates to the platform library or model. Thus, as shown in FIG. 9, the specifications or required execution properties may be provided to the editor (of the designer tool) from the platform model, or external IP (e.g., functional blocks), although in other embodiments, the user may provide input to the editor specifying the specifications or requirements.

Once set, these specifications or required execution properties may be applied to the application model, analyzed, displayed to the user, and/or synthesized to generate lower-level program code, such as, for example, lower-level G code, which is the graphical programming language of the LabVIEW graphical program development environment provided by National Instruments Corporation. For example, in the exemplary embodiment shown in FIG. 9, the editor may provide or apply the specifications or required execution properties to the application model, which is then parsed and analyzed to produce analysis metrics, and may also be used for synthesis and optimization, e.g., of program code, e.g., graphical program code, such as G code.

As also shown, the analysis metrics may be used to generate a schedule and annotations for the program, the results of which may be provided to the G synthesis and optimization process or component(s). Moreover, the synthesis and optimization may generate an application VI (graphical program), as shown, which may be included in a project, such as a LabVIEW project as shown. The project may then be compiled by a compiler to generate a hardware configuration program or file. For example, in one embodiment a LabVIEW FPGA compiler may compile generated G code to produce VHDL and/or a bitfile, which may then be used to configure a programmable hardware element, such as an FPGA. Note, however, that the architecture and process shown in FIG. 9 is exemplary only, and is not intended to limit the designer tool (or development environment) to any particular form, function, or appearance.

Using Specifications and/or Required Execution Properties to Analyze Performance and Resource Utilization A common use case for the designer tool disclosed herein is to analyze for performance, or, more specifically, to determine whether the design (as expressed by the graphical program) is able to achieve a certain throughput (data units/time unit). In this scenario, the input to analysis may be the graphical program (which may be referred to as a diagram design or design diagram), where the graphical program includes the specification elements of the design and the specified required execution properties, e.g., performance requirements. Analysis by the designer tool may then determine whether or not the required properties are met (e.g., are implementable). A very basic exemplary tool flow may include:

1. Run scheduling analysis against the application model;
2. Extract functional blocks with timing into an execution trace;
3. Run the execution trace through an analyzer (which may include a constraint description); and
4. Report whether or not the constraint was met.

Figure 10:
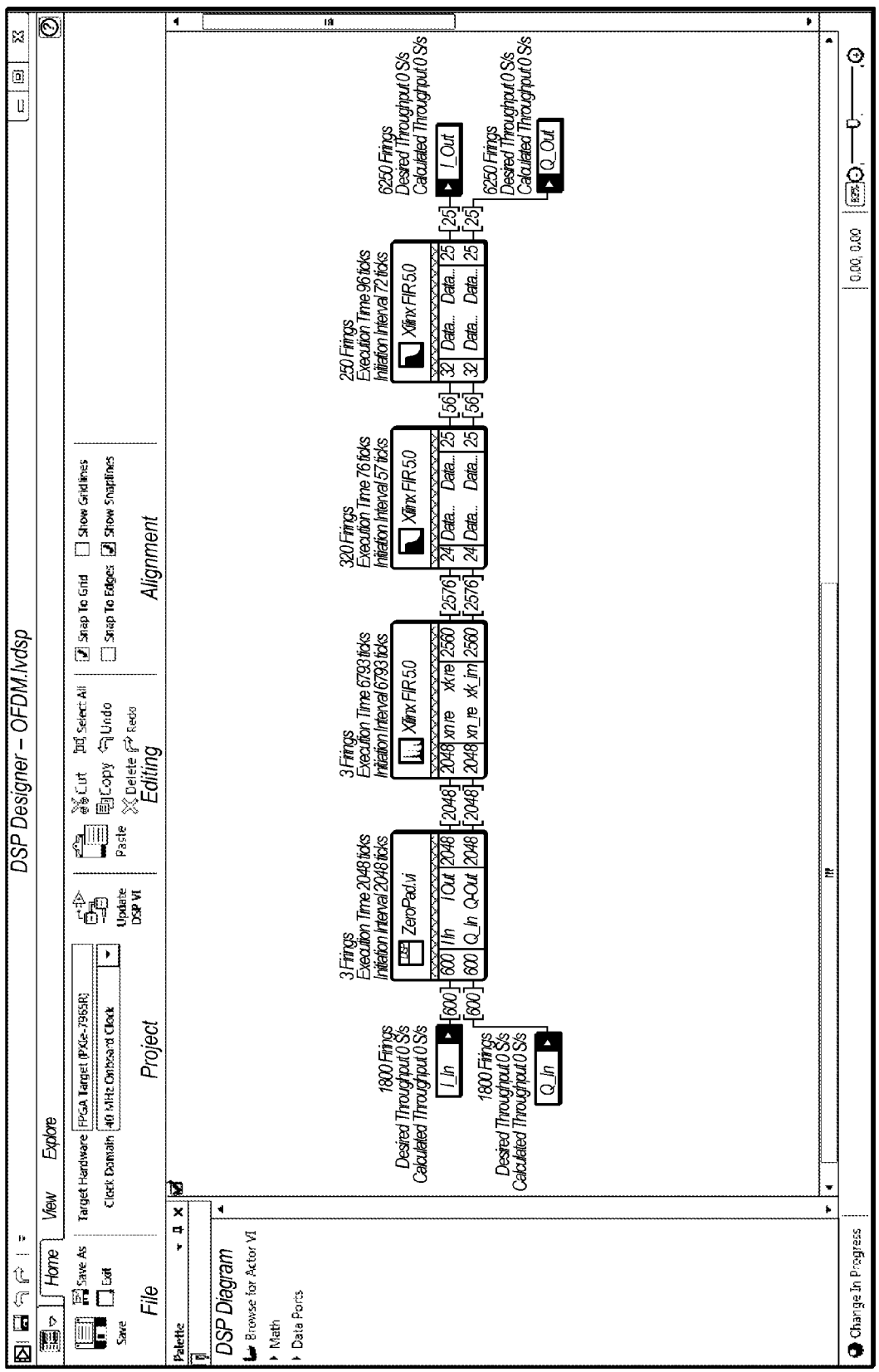
FIG. 10 is a screenshot illustrating a completed graphical program in the context of an exemplary embodiment of the designer tool, according to one embodiment.

For a more concrete example of this, consider the OFDM application of FIG. 7A, where the user has a completed graphical program or diagram. In this scenario, there are already multiple relationships specified by the user (e.g., data flow relationships via wiring) and by the functional blocks (data production and consumption rates). FIG. 10 is a screenshot illustrating the completed graphical program (application/diagram) in the context of an exemplary embodiment of the designer tool. Note that there are also multiple required execution properties already included and displayed in the design based on execution time and initiation interval for each block.

In one embodiment, based on the information already provided at this level, the designer tool (via the analysis framework) may check for model consistency, determine relative firing counts, and reason about resource utilization. For example, the buffer sizes between the FFT and FIR may be sized to a depth of 2576 elements. Since there are no throughput requirements set in the graphical program, the buffers may be set to a minimum size such that the application will not deadlock.

Figure 11:
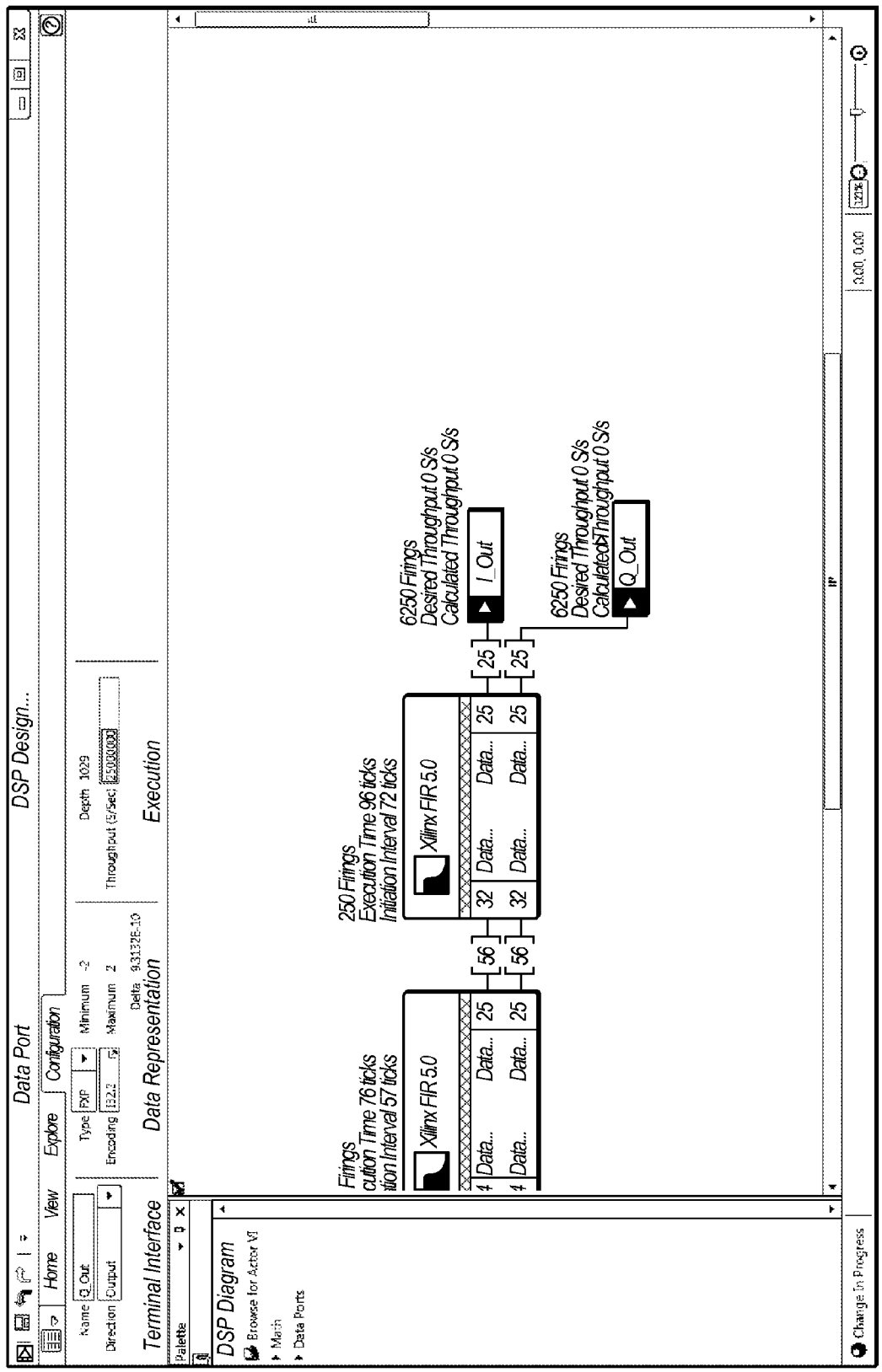
FIG. 11 illustrates an exemplary specification of desired throughput as an execution requirement on output terminals of a graphical program, according to one embodiment.

Now, assume that the user wishes to set a throughput constraint on the outputs (FIFOs) to match the expected data rate of the I/O (25 MS/s (Mega Sample/second) in this case). FIG. 11 illustrates specification of this desired throughput as a constraint on both output terminals of the program, as indicated by "Desired Throughput 25000000 S/s" (Sample/second) display in the "Execution" ribbon along the top. Once set, analysis performed by the designer tool may identify whether the throughput constraint can be met, and if not, where the bottleneck may be. In this particular case, the throughput constraint cannot be met, which may be reported by the designer tool.

Figure 12:
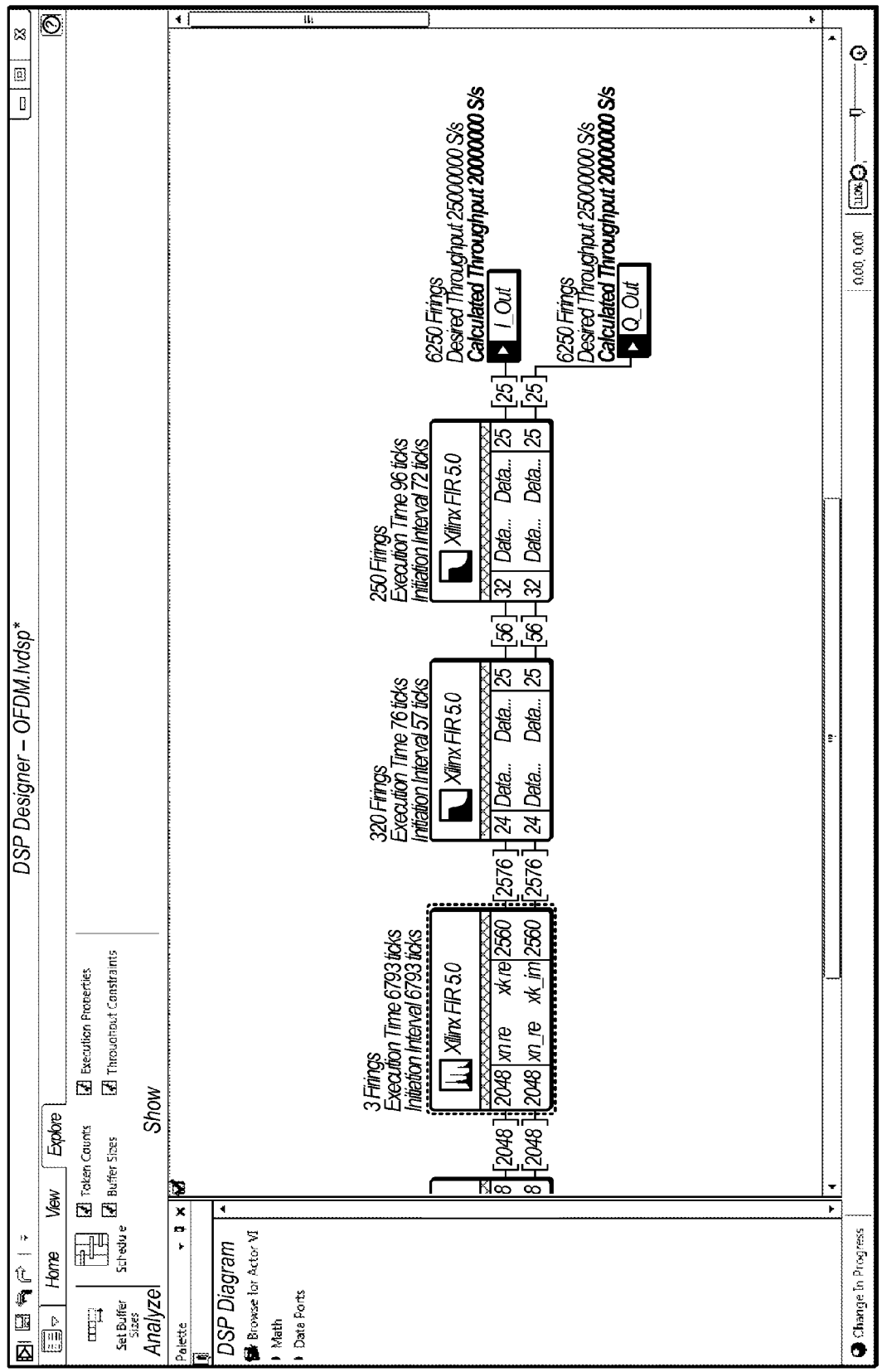
FIG. 12 illustrates an exemplary embodiment of the graphical program of FIG. 11 enhanced with a completed report detailing how well the execution requirements were met.

FIG. 12 illustrates the graphical program of FIG. 11, but where the graphical program includes a report regarding the constraint. More specifically, results of the analysis are indicated in FIG. 12 by text in the calculated throughput on each terminal, which reads: "Calculated Throughput 20000000 S/s". FIG. 12 further indicates where a bottleneck might exist (indicated by a border around the suspected functional block, in this case, the FFT functional block). Providing this information early in the design may help the user identify performance gaps which the user can iteratively refine. For example, the user may iteratively modify the design of the offending block until the throughput constraint is met, or modify the constraint so that it is met by the design.

Alternatively, in some embodiments, the user may not be presented with such details until they have set a constraint and the designer tool has reported whether or not the constraint has been met. Then, the user may begin refining the design or constraint(s), where these details may be displayed by the designer tool to aid in the process. Thus, in some embodiments, the designer tool may be configured to display these details or not, depending on context, user input, etc.

Figure 13:
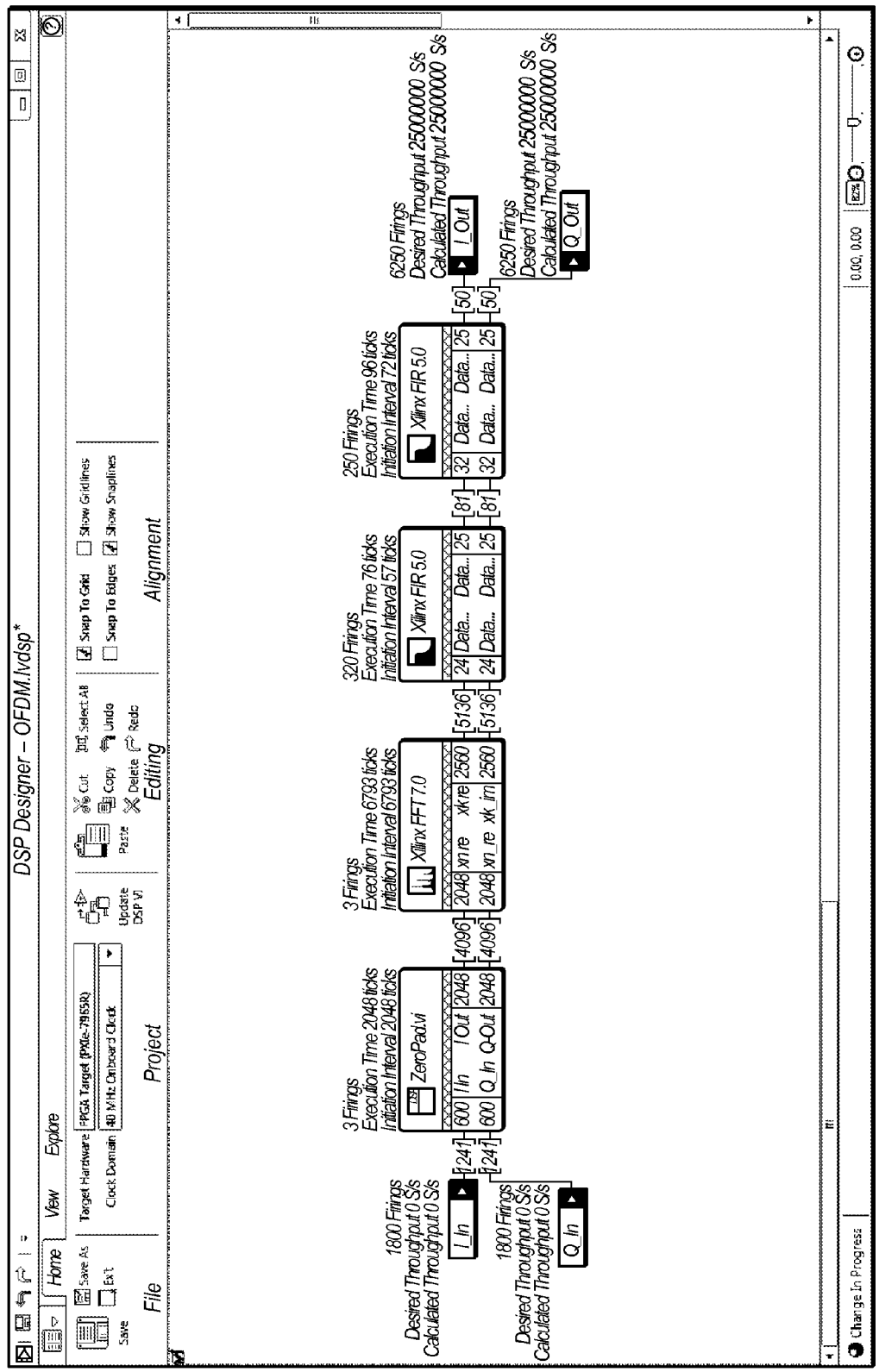
FIG. 13 illustrates the graphical program of FIG. 12 after the buffers have been (re)sized to meet a constrained throughput, according to one embodiment.

Another aspect of design exploration for required execution properties relates to modifying resource usage to meet a specific constraint. Consider the same OFDM example shown in FIG. 10. The buffers set in this example are recommended when no throughput requirements exist on the diagram. If throughput on the outputs is set to a larger number, e.g., 25 MS/s, the buffer sizes may need to be increased to meet this throughput constraint. FIG. 13 illustrates the graphical program after these buffers have been (re)sized to meet a throughput of 25 MS/s on the outputs. In other words, in this exemplary embodiments, the designer tool analyzed the original graphical program (of FIG. 10), and automatically generated the graphical program of FIG. 13 (via modification of the original graphical program), with appropriate buffer sizes for meeting the throughput constraint. Note, for example, that the buffer between the two FIR functional blocks has been increased from 56 to 81. As may be seen, the other inter-block buffers have also been automatically increased to meet the throughput constraint.

A Framework for Analysis and Implementation of Programs

Figure 15:
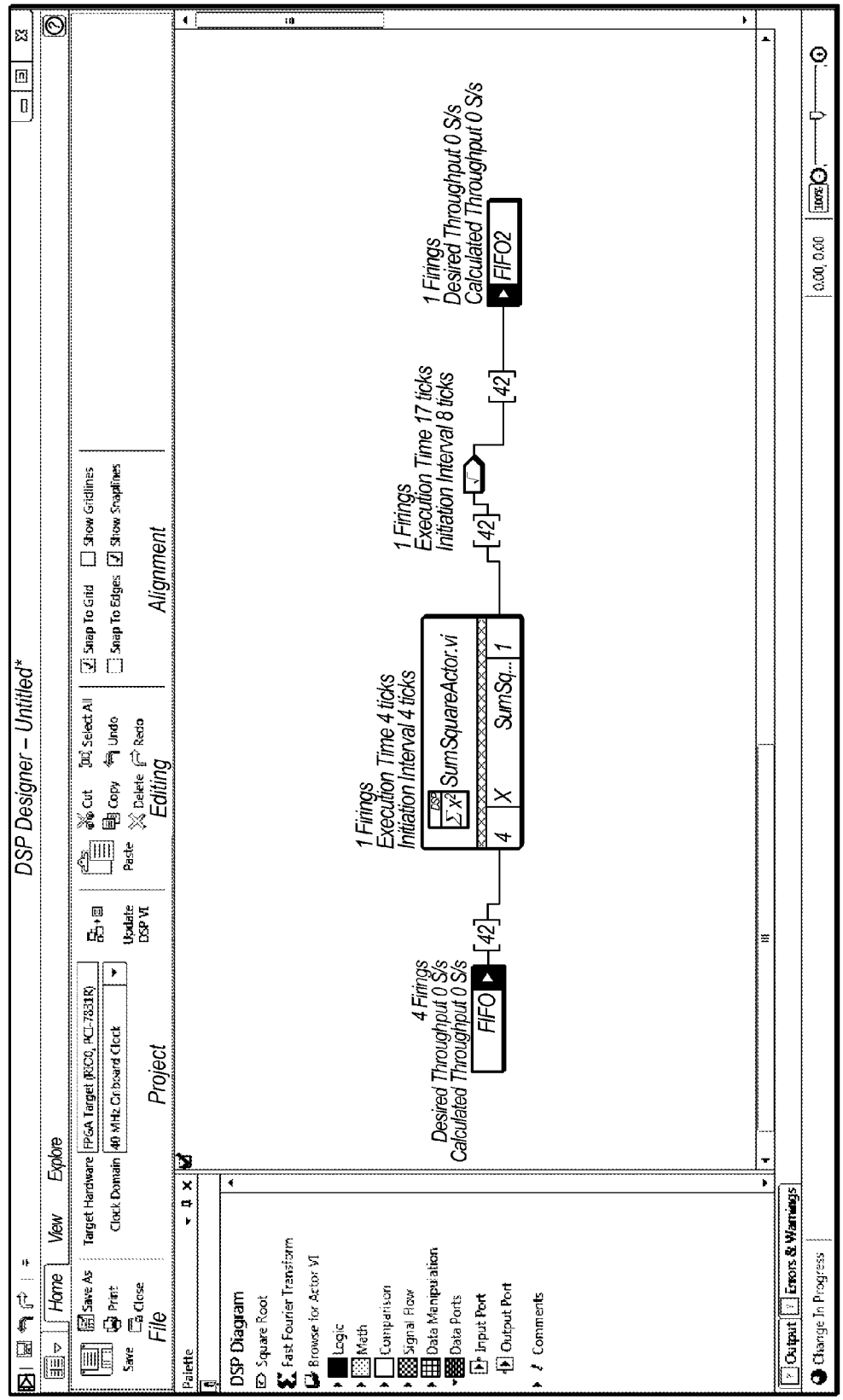
FIG. 15 is a screenshot of an exemplary graphical program that computes the root-mean squared for a set of four values, according to one embodiment.

The following describes processes or activities that are invoked or performed as a user defines a graphical program (diagram), and then invokes the analysis and code generation activities to produce a constrained implementation of the program, e.g., in LabVIEW FPGA, in accordance with a framework for developing programs with required execution properties. Various aspects of the framework are described or illustrated with respect to an exemplary digital signal processing example. More specifically, an exemplary design flow is described with respect to a DSP graphical program as shown in FIG. 15, and that follows steps outlined in a flowchart shown in FIG. 16, described in detail below.

As noted above, in some embodiments, the models and/or programs may be data flow models or programs.

Figure 14:
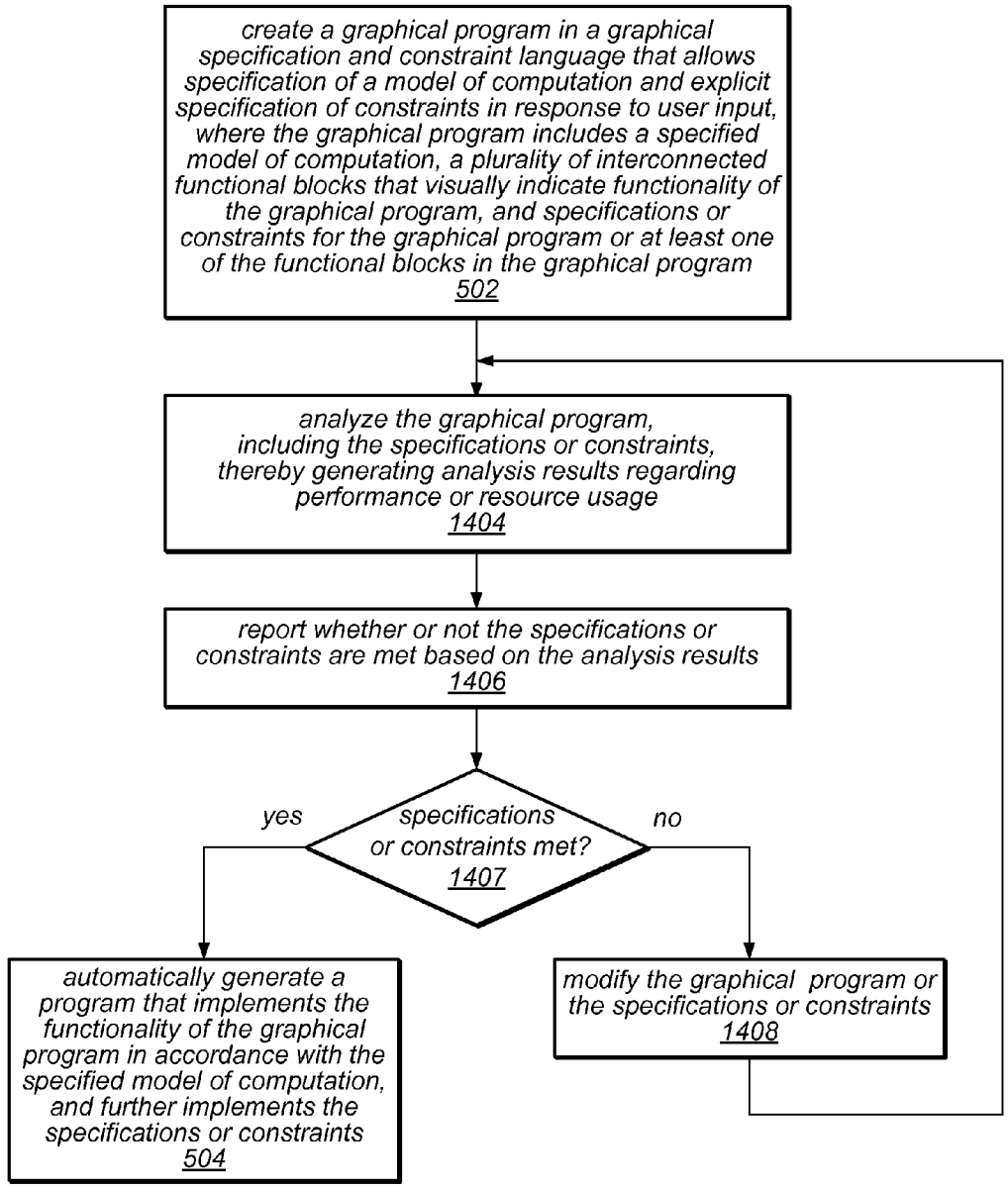
FIG. 14 is a flowchart diagram illustrating one embodiment of a method for creating an implementation program from a graphical program.

FIG. 14—Flowchart of a Method for Developing a Program

FIG. 14 illustrates a method for developing an implementation program. The method shown in FIG. 14 may be used in conjunction with any of the computer systems or devices shown in the any of the previous figures, among other devices. In various embodiments, some of the method elements shown may be performed concurrently, in a different order than shown, or may be omitted. Additional method elements may also be performed as desired. Note that where method elements are the same or similar to method elements described previously, descriptions may be abbreviated. As shown, this method may operate as follows.

First, in 502 a graphical program (which may be referred to as a diagram) may be created on the computer system 82 (or on a different computer system), e.g., in response to user input, as described above with reference to FIG. 5. As discussed above, in some embodiments, the user may use a designer tool to create the graphical program, while in other embodiments, the user may use a provided graphical program development environment which includes a graphical specification and constraint language that allows specification of a model of computation and explicit declaration of required execution properties, e.g., the LabVIEW graphical programming development environment (possibly with suitable extensions), to create the graphical program. As also mentioned above, in some embodiments, the graphical program is a graphical data flow program. As described above with reference to FIG. 5, the graphical program may include a specified model of computation, a plurality of interconnected functional blocks that visually indicate functionality of the graphical program in accordance with the specified model of computation, as well as graphically indicated specifications or required execution properties for at least one of the functional blocks in the graphical program.

FIG. 15 is a screenshot of an exemplary graphical program (or diagram) that specifies or implements a simple DSP algorithm that computes the root-mean squared for a set of four values. As FIG. 15 shows, this diagram includes two functional blocks (which may also be referred to as actors): SumSquareActor and SquareRoot (indicated by the radical sign), as well as two data terminals to communicate with the external world.

In this particular example, the functional block SumSquareActor is defined as a static data flow (SDF) actor that on each firing consumes 4 tokens of type Fixed Point (Signed 16 bit word length and 16 bit Integer word length (S 16, 16)) and produces 1 token of type Fixed Point (Unsigned 32 bit word length and 32 bit Integer word length (U32, 32)). As indicated, the actor/functional block has an execution time of 4 cycles and an initiation interval of 4 cycles, and is configured to compute the sum of the squared values of the input tokens.

Similarly, the SquareRoot functional block is defined as an SDF actor that on each firing consumes 1 token of type Fixed Point (Unsigned 32 bit word length and 32 bit Integer word length (U 32, 32)) and produces 1 token of type Fixed Point (Unsigned 16 bit word length and 16 bit Integer word length (U 16, 16)). The actor has an execution time of 17 cycles and an initiation interval of 8 cycles, and is configured to compute the Square Root of the input token.

In 1404, the graphical program may be analyzed, including analyzing the specifications or required execution properties, thereby generating analysis results, e.g., regarding performance or resource usage of the graphical program. Further details regarding the analysis are provided above and below.

In 1406, the method may include generating a report regarding whether or not the specifications or execution requirements are met (e.g., are implementable), based on the analysis results. Note that the report may be presented via any of a variety of ways, e.g., textually, or graphically, and within, or outside of, the displayed program. For example, as illustrated in FIG. 12, discussed above, in one embodiment, information indicating whether or not the specifications or required execution properties are met (e.g., are implementable) may be presented graphically within the graphical program (e.g., the DSP diagram).

In 1407, a determination may be made as to whether or not all the required execution properties were met, e.g., based on the analysis and/or report.

In 1408, the graphical program and/or the specifications or required execution properties may be modified, e.g., in response to determining that at least one of the execution requirements was not met. The graphical program and/or the specifications or required execution properties may be modified in response to user input, i.e., manually, or may be modified programmatically, e.g., automatically via software, e.g., by an expert system, or other artificial intelligence technique.

As FIG. 14 indicates, in some embodiments, the method elements 1404 through 1408 may be repeated one or more times. In other words, each time the analysis/report indicates that at least one constraint was not met, the graphical program or the required execution properties may be modified, after which the (modified) graphical program may be analyzed, and a report generated.

In 504, a program may be automatically generated based on the graphical program in accordance with the specified model of computation, e.g., in response to determining that all required execution properties have been met, where the program implements the functionality of the graphical program, and further implements the specifications or required execution properties.

As noted above, in various embodiments, the generated program may be a graphical program, or a textual program, and may or may not be a data flow program. Moreover, in some embodiments, the method may include generating a hardware configuration program based on the program, where the hardware configuration program is useable to configure a programmable hardware element, such as an FPGA, although in other embodiments, any other type of platform may be targeted, as desired.

Figure 16:
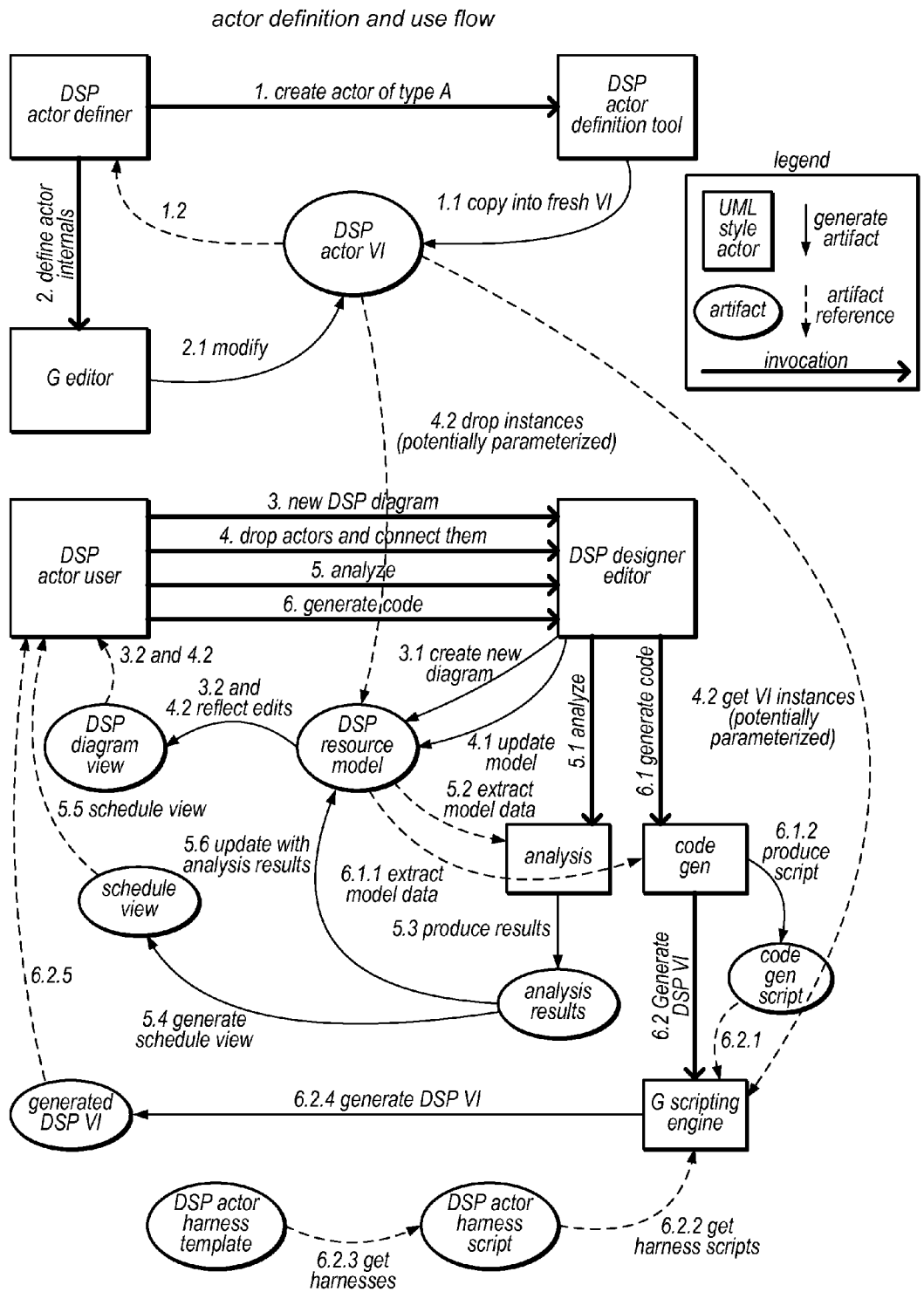
FIG. 16 is an illustrative flowchart describing the application of the method of FIG. 14 to a digital signal processing (DSP) application, according to one embodiment.

FIG. 16 is an illustrative flowchart that represents or describes one embodiment of the method of FIG. 14 as applied to a digital signal processing (DSP) application. Note that in the flowchart of FIG. 16, numbered actions are associated with or represented by directional links or arrows between entities, such as actors/functional blocks and artifacts or aspects of the designer tool. The following describes exemplary embodiments of these activities and entities with respect to the example DSP application, per the numbered and labeled elements of FIG. 16. The example is further described in terms of LabVIEW graphical programs, referred to as VIs, although this is not intended to limit the technique to any particular type of programs.

1. Actor creation (SumSquareActor):

As FIG. 16 shows, in one embodiment, the first activity involves creation of one or more functional blocks or actors, as indicated by the arrow labeled "1. create actor of type A" at the top of the figure. The user is defining an actor that is backed by (e.g., for which the core functionality of the actor is implemented by) a VI, e.g., a graphical program or node. The user, e.g., the DSP actor definer of FIG. 16, specifies the terminals of the actor, by specifying direction (input, output), tokens produced (consumed), and data type, for each terminal, e.g., by invoking and using the designer tool, e.g., a DSP actor definition tool.

1.1. The designer tool may generate a VI (graphical program or portion) with an interface that conforms to the specification defined by the user.

It should be noted that in general, an "SDF actor" refers to a computing entity that takes a set of input data and produces a set of output data. Such actors may be used in graphical or textual program development environments.

2. The user may implement the functionality of the actor (compute the sum of squares), e.g., may define the internals of the actor. For example, as shown in FIG. 16, 2.1, the user may use a G editor, as provided by National Instruments Corporation, to create and/or modify the VI for the actor (the DSP Actor VI shown).

3. The user may create a new DSP graphical program (diagram) using the DSP diagram editor.

3.1. An internal model may be created to reference or maintain an association with the functional blocks or actors (or other elements or objects) that the user includes on the graphical program. In other words, the internal model may include objects that correspond to the functional blocks or actors in the graphical program/diagram.

3.2. Some of the internal model objects may be displayed in the designer tool, e.g., in a visual DSP diagram (graphical program) view, for the user to edit.

4. The user may edit the DSP diagram or graphical program by dropping functional blocks or actors onto the diagram/program and connecting terminals of compatible data types. For example: the user may drop a call to the SumSquareActor functional block into the diagram.

4.1. User edits may result in the addition or modification of objects in the internal model. The added call to SumSquareActor may result in the addition of a corresponding actor object to the internal model. This resource object may contain many of the above mentioned actor properties, such as the terminal configuration (production/consumption count, direction, and data type), the path to the backing implementation VI, and its execution time and initiation interval.

4.2. Some of these edits may be reflected in the visual view of the diagram. For example, adding the call to SumSquareActor may result in the additional of the SumSquareActor.vi functional block shown in FIG. 15.

5. When the user has completed editing the diagram he may choose to apply analysis to the diagram. The analysis has a number of purposes, including, for example, checking the internal model for validity and schedulability, computing a valid schedule for the graphical program, and/or calculating buffer sizes between actors, among others. For details on each of these see below.

5.1. The user request for analysis may invoke a call into an analysis module (e.g., analysis portion of the designer tool) with directives for the aspects of analysis to be performed. As noted above, in one embodiment, the analysis may be performed in such a way that simple analysis is performed in real-time, but more complex and more time-consuming analysis is performed as a background process as time permits in an asynchronous manner. See FIG. 16 and its detailed description for further description of the types of analysis performed based on relative complexity.

5.2. The analysis module may extract relevant information from, or pieces of, the internal model, including information about all the actors on the diagram and their connections.

5.3. The analysis module may report the results of the requested operations.

5.4. If the analysis results in a schedule, then a schedule view (e.g., of the designer tool) may be updated 5.5. The user may interact with the new schedule in the schedule view.

5.6. The analysis results may be used to update the internal model. For example, the size of a FIFO between two actors may be set to achieve a desired throughput.

6. The user may choose to generate code for the graphical program, e.g., the DSP diagram. In this example, the code generation activity may generate a VI that implements the SDF behavior of the DSP diagram; however, other implementations are contemplated, such as VHDL, SystemC, DFIR (Data Flow Intermediate Representation—an internal LabVIEW representation). In this particular example, the generated implementation may be self-timed; however, in other embodiments, a fully scheduled centralized controlled implementation may be generated, and/or a combination of the two, as desired.

6.1. The user request may invoke a call to a code generation engine, as shown.

6.1.1. The code generator may extract relevant information from the internal model, including, for example, the actors and their configuration, and the connections between actors and their properties, such as implementation type and FIFO sizes. Based on this information the code generator may produce a script that defines the content of the resulting DSP VI.

6.2. The G scripting engine may take the code generation script and produce a VI that implements the behavior of the DSP diagram.

6.2.1. The code generation script may include instructions regarding how each actor is to be realized, e.g., by calling a specific script (see 6.2.2 below) that defines how the actor will be instantiated inside a harness (or wrapper) that makes the actor compatible with the other actors to which it is connected. The code script may also define the code that will be generated for each connection between the actors.

6.2.2. Each actor instance may be described by a parameterized harness script that defines how the actor will be embedded in code that realizes a compatible interface on its connections.

6.2.3. The harness script may refer to a template that defines the common elements of code that are independent of the given parameters.

6.2.4. From the code generation script the G Scripting Engine may produce the DSP VI that realizes the desired behavior of the DSP Diagram.

Auto-Selecting Harness Logic for Parameterized Blocks

In one embodiment, harnessing logic for one or more of the functional blocks may be automatically determined, e.g., selected or generated. Moreover, in some embodiments, multiple harnesses may be selected for the same functional block based on a multitude of scenarios. FIG. 16, described above, illustrates an exemplary use flow for the processes/techniques disclosed herein, and the following is a description of how an actor harness template and actor harness script may be determined, e.g., created and/or selected, according to one embodiment.

There are numerous criteria by which the actor harness may be determined. For example, harnessing logic may be determined based on functional block interconnects, e.g., functional block interconnect storage requirements, or the functional block's configuration, e.g., as an SDF or a PCSDF functional block. For example, in the first case (i.e., determining the harnessing logic based on functional block interconnects), a harness may be determined for a specific block or group of blocks based on whether or not blocks are "clumped" together. Clumping is a method by which FIFO buffers between blocks (which serve as a harnessing boundary) may be removed and replaced with another implementation, e.g., a simple wire, a register, or a combination of FIFO and registers. In this case multiple functional blocks may be harnessed or clumped together into a single harness. Note that when performing various clumping (or other) optimizations, a functional block or functional blocks with the same functionality may have different implementation logic. The method for determining this relationship may be performed by analysis tools (e.g., included in or associated with the development environment) applied to the resource model and code generated.

In an example of the second case, where the functional block's configuration determines the harnessing logic, a functional block with the same functionality may have different harnessing logic based on whether it has a SDF configuration or a PCSDF configuration. Adding a parameter terminal may automatically change the underlying implementation(s).

Figure 7B:
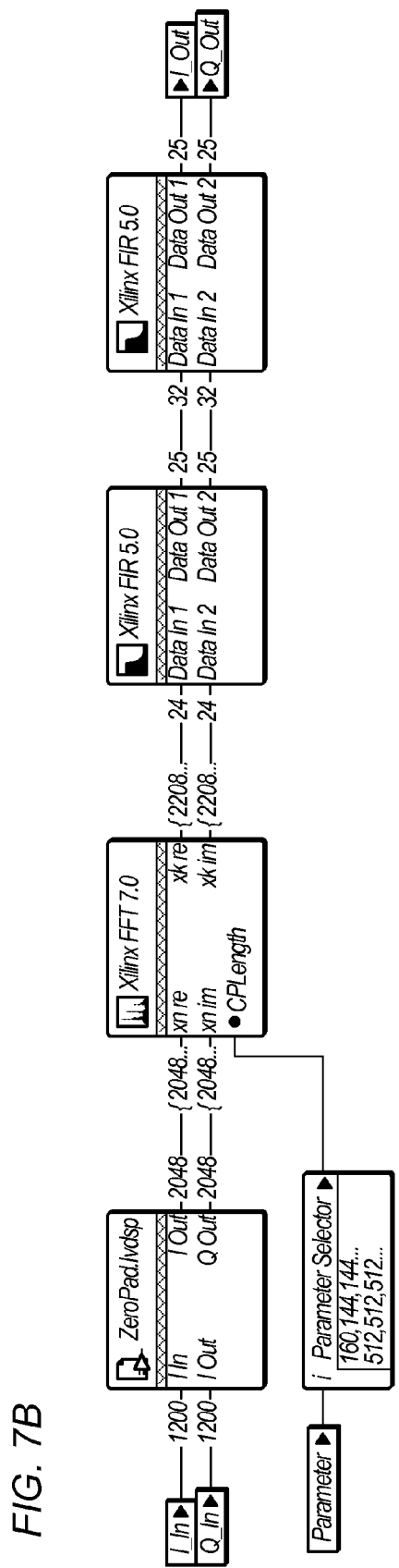
FIG. 7B illustrates a parameterized version of the ODFM algorithm of FIG. 7A, the parameterization being focused on the FFT actor, according to one embodiment.

The application examples shown in FIGS. 6A, 6B, 7A, and 7B may be used to illustrate how the FFT (FFT is an abbreviation for Fast Fourier Transform, an operation commonly performed in signal processing) block can have different harnessing (logic) based on its specification. Consider FIG. 7B, which shows an application identical to FIG. 7A with the exception that the FFT block has parameterized the cyclic prefix length, see the bottom left element. In other words, FIG. 7B shows a parameterized version of the algorithm of FIG. 7A. In this example there are two modes for the FFT, "normal" and "extended," FIG. 6B, which shows a parameterized version of the algorithm of FIG. 6A, shows how the parameterized values for each of these modes. When in extended mode, the CP length is constant of 512 for 6 phases and when in normal mode the CP length varies as shown in a cyclic pattern for 7 phases of 160, 144, 144, 144, 144, 144 and 144 sequentially.

The specification of the parameter value for CP mode and the resulting CP lengths specified as an input to the FFT automatically change the harnessing logic for that block and changes the block model of computation from synchronous data flow to parameterized cyclo-static data flow.

When generating code for this FFT there are several aspects of the harnessing logic that should be accounted for. First, the parameter values for CP mode should only change on an iteration boundary of the graph. This may vary based on the diagram and may or should be accounted for using internal counting logic at the harnessing layer. This can be particularly challenging as multiple iterations of the graph may be running concurrently, with multiple values of multiple parameters involved in the concurrent execution. In one embodiment, the counting logic implemented in the harness may keep a global count of the iteration and number of required phases for each iteration, and may only read the parameter value when the iteration boundary is detected. Thus, for example, in some embodiments, harnessing logic for the at least one functional block may be determined to ensure that runtime updates to the at least one functional block's configuration occur on iteration boundaries. Similarly, in some embodiments, harnessing logic for the at least one functional block may be determined to ensure that data flow for the at least one functional block occurs according to the runtime updates of the at least one functional block's configuration.

Additionally, the parameter value may impact the input and output token counts on the terminals of their owning blocks (in this particular case the token count of the output terminals of the FFT are the transform length (2048)+the CP length). To account for this, logic that enforces the PCSDF semantics may account for this relationship at runtime. In other words, harnessing logic for at least one of the functional blocks may be determined, e.g., selected or generated, to provide logic for updating input and output token counts for each parameter value at runtime.

Static Analysis of Data Flow Models

One possible use of the designer tool is to provide a development environment for high performance multi-rate streaming RF and DSP applications on FPGA targets. Static data flow (SDF) and cyclo-static data flow (CSDF) models are natural and convenient for capturing these applications and generating efficient implementations.

In one embodiment, the graphical program (DSP diagram) may include a back end compile time static analysis framework to help the designer reason about important program or model properties. The analysis framework may include a toolbox of methods that operate on different models and may provide interesting trade-offs between computation efficiency and quality of results. Important static analysis features related to SDF and CSDF models may include:

1. Model validation, which may include: checking whether an SDF/CSDF graph of the program is consistent and can execute in bounded memory, and/or computing a repetitions vector and symbolically simulating one iteration to verify that the model/program is deadlock free.

2. Minimum buffer size estimation, which may include: given an SDF/CSDF graph, computing lower bounds on buffer sizes for the channel for a valid functional execution.

3. Throughput computation, which may include: determining the throughput of the SDF/CSDF graph based on static performance models for the individual actors.

4. Optimum buffer size computation given throughput required execution properties, which may include: computing sizes for the channel buffers in the SDF/CSDF graph to meet throughput execution requirements set by the user on ports and terminals.

5. Schedule computation, which may include: computing a schedule of actor executions.

6. Data flow pipelining and function parallelization, which may include: unrolling multiple iterations of the data flow graph and allocating and scheduling actors to custom microarchitecture models that allow multiple function unit instances for the application actors.

7. Fusion and clustering optimizations, which may include: composing multiple actors into a single cycle, hence obviating the need for state elements between them based on the inter- and intra-cycle timing models for the actors; retiming and C-slowing may be related optimizations used to improve throughput and achieve higher clock frequencies.

8. Fine grained scheduling for hardware targets, which may include: extending general scheduling techniques to include specific required execution properties related to hardware targets, such as: (a) internally pipelined functional units and IP, (b) IP configuration selection from a set of parameter choices, (c) choice on number of parallel instances of certain functional units, (d) allocation of buffers to memories, or (e) customizable micro-architecture configuration.

9. Implementation strategy selection, which may include: selecting harnessing strategies to compose communicating actors in the SDF model, trading-off performance and resource usage; and exploring a hybrid implementation strategy that selects between self-timed and fully-specified schedule executions for different parts of the DSP diagram.

The analysis framework may include many methods that provide interesting trade-offs between computation efficiency and quality of results. The DSP diagram and/or the designer tool may provide intuitive means, e.g., knobs, for the user to select a suitable effort-quality point and invoke the appropriate analysis method. Optionally, some easy analysis routines, such as model validation and minimum buffer size estimation, may run in the background while the user is editing the diagram.

In one embodiment, a default implementation generated by the designer tool may be a FIFO-based token-vacancy implementation; that is, every channel may have a FIFO, and an actor (functional block) may be fired if and only if all of its inputs have sufficient tokens and all of its outputs have sufficient vacancies. In one embodiment, homogeneous clumping may be implemented, e.g., generating alternative, leaner implementations for homogeneous regions of a diagram or graphical program, e.g., a DSP diagram.

For that purpose, the tool may:

Identify homogeneous regions, i.e., homogeneous clumps in a DSP diagram (or other graphical program). Homogeneous clumps may contain only certain types of actors.

Each homogeneous clump is considered to be a composite actor having multiple inputs and multiple outputs. This composite actor itself is homogeneous.

A leaner backpressure-less implementation is generated inside each homogeneous clump. Following are four choices of implementations:

ShiftRegister-based, backpressure-less;

DelayWithStorage-based, backpressure-less;

DelayWithInitiationInterval-based, backpressure-less; or

FIFO-based, backpressure-less.

The top-level diagram now has the composite actors corresponding to homogeneous clumps in addition to the other actors.

A FIFO-based, token-vacancy implementation may then be generated for the top-level diagram. Throughput required execution properties may be considered while generating either of the above implementation styles.

As an example of the above, in some embodiments, the harnessing logic may be part of control logic for the at least one functional block, and may be related to optimization or simplification of the generated program. For example, in one embodiment, the IC of a first functional block and the OC of a second functional block may correspond in rate to each other one to one, and ET, II, IP and OP may match, and the corresponding generated program may be optimized or simplified with a control structure that is re-used for the first and second functional blocks. The setup above is generally described as homogeneous clumping.

In addition to homogeneous clumping, the tool can identify heterogeneous clumping, where the IC and OC of connected functional blocks may not be necessarily one, but could have different relative rates, and could account for the access patterns. In this case, the optimization occurs by looking at each cycle of execution and identifying when to fire each of production and consumption circuits of the connected functional blocks. As an example of this behavior, the IC of a first functional block and the OC of a second functional block may correspond in rate to each other n to m, and ET, II, IP and OP may match, and the generated program may be optimized or simplified with a control structure that is re-used for the first and second functional blocks at appropriate rates.

In a further embodiment, the graphical program may be compiled into a collection of sub-sections of the original program that exhibit one of the synchronous behaviors above, or may be more suitable for general self-timed (asynchronous) computation. Such a collection of subcomponents is usually referred to as GALS (Globally Asynchronous Locally Synchronous) behavior.

Furthermore, as a specialization of homogeneous clumping, the tool can consider the case when the ET of a given block takes less than one cycle, when compiled into a hardware element. In such a case the tool is able to combine multiple of such blocks into a larger block that still fits into one cycle of the execution on the target hardware element. As an example, the IC of a first functional block and the OC of a second functional block may correspond in rate to each other one to one, and ET, II, IP and OP may match and the sum of the ETs needs to be less than one, e.g., are all equivalent to or round down to 0, and the generated program may be optimized or simplified with a control structure that is collapsed into a single control structure for one cycle.

Figure 17:
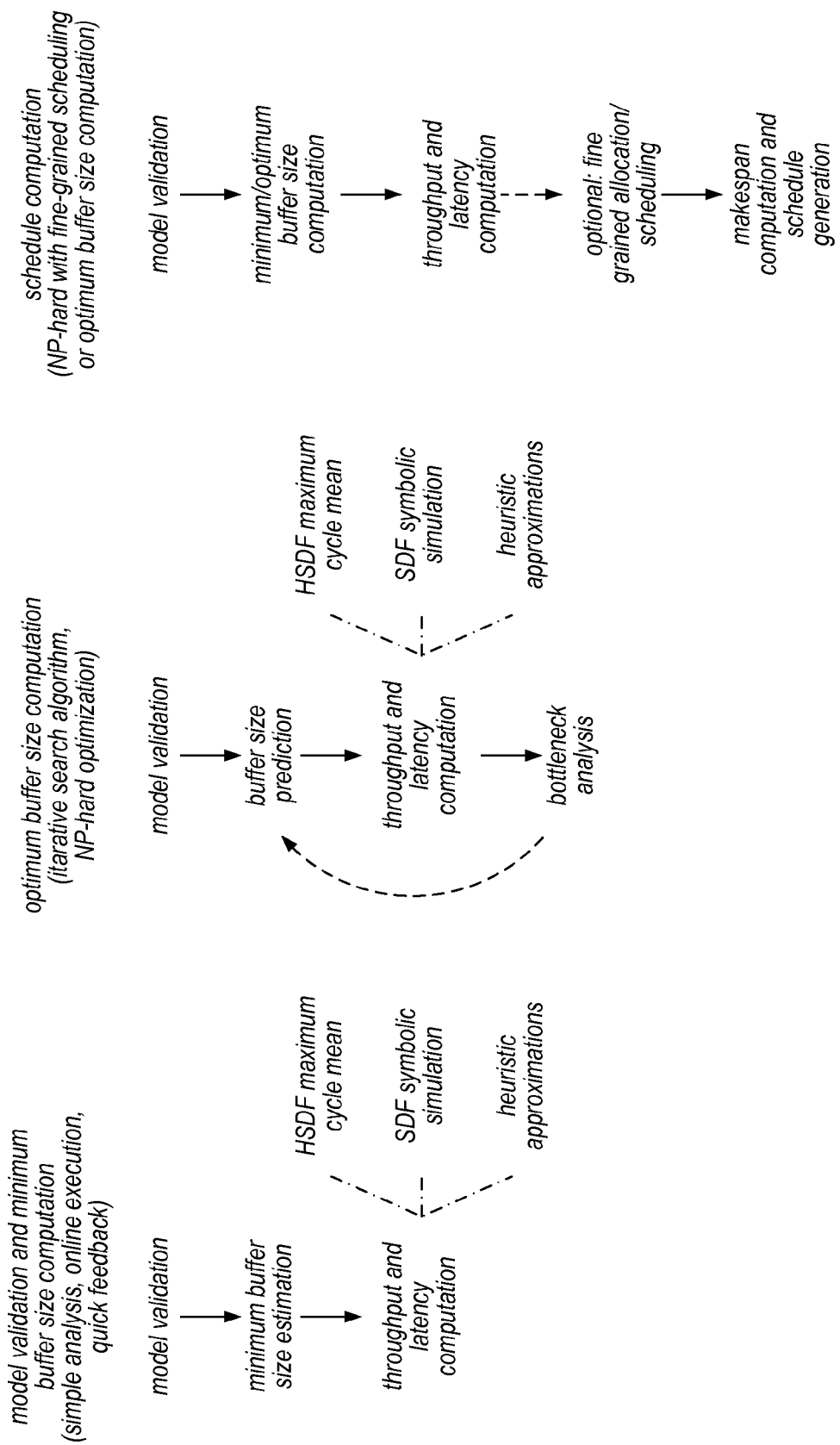
FIG. 17 illustrates exemplary algorithmic flow and dependencies between methods for exemplary analysis services, according to one embodiment.

FIG. 17 illustrates exemplary algorithmic flow and dependencies between methods for three prominent analysis services. In this example, model validation and minimum buffer size computation are fast analysis methods intended to provide immediate feedback. These methods, like type checking, may be run as a periodic background task during edit time. As shown, in this exemplary embodiment, model validation and minimum buffer size computation may include: model validation, minimum buffer size estimation, and throughput and latency computation. Moreover, the throughput and latency computation may include computing an HSDF (homogeneous static data flow) maximum cycle mean, executing an SDF symbolic simulation, or various heuristic approximations.

As also shown, in one exemplary embodiment, optimum buffer size computation may include: model validation, buffer size prediction, throughput and latency computation, and bottleneck analysis, where buffer size prediction, throughput and latency computation, and bottleneck analysis may be performed in an iterative manner. As above, the throughput and latency computation may include computing an HSDF (homogeneous static data flow) maximum cycle mean, executing an SDF symbolic simulation, or various heuristic approximations. Note that optimum buffer size and schedule computations are inherently NP-hard computations; however, the user may optionally choose to invoke approximate heuristics that do not guarantee optimality but which try to provide sufficiently good results. The DSP diagram and/or the designer tool may provide intuitive means, e.g., knobs, for the user to select a suitable effort-quality point and invoke the appropriate analysis method.

Thus, various embodiments of the above method and framework may facilitate development of constrained programs.

Actor Definition Language for Specifying Functional Blocks

The following describes methods and means for creating a functional block for use in a graphical program implemented in a graphical specification and constraint language. In some embodiments, the functional block may be useable to configure a programmable hardware element, such as an FPGA.

A primary feature of this approach is the inclusion of annotations in the functional block to aid in the development and/or optimization process. More specifically, embodiments of the techniques described herein may allow designers to create self-describing functional blocks (e.g., IP blocks) by annotating functional block information that can be used in both high-level models for user interaction and low-level models for underlying tool functionality. Each functional block may include a description of both the interface to the implementation (protocol) and the model of computation under which the functional block is to be analyzed. Prior art approaches usually provide an interface to the functional block that is tightly tied to its implementation in hardware, i.e., the user needs to use the low level protocol to interface that functional block with other functional blocks in the system. In embodiments of the approach disclosed herein, the user may utilize a high level model of computation (e.g. SDF, PCSDF, or HDF) in which it is easy to formally describe the relation between blocks, but the functional blocks may interact with the designer tool by providing low level protocol information to generate an efficient implementation.

Figure 18:
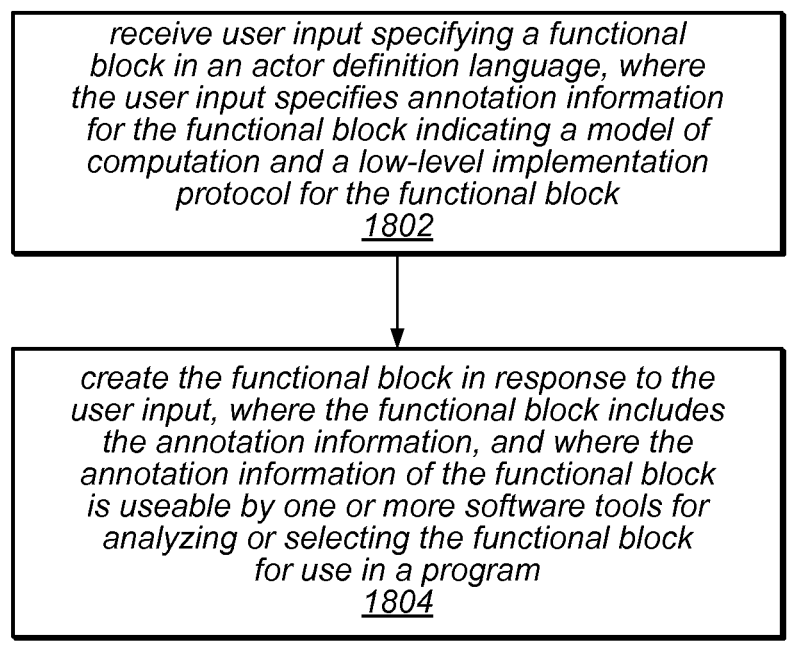
FIG. 18 is a flowchart diagram illustrating one embodiment of a further method for creating an implementation program for a functional block from an actor definition language specification.

FIG. 18—Flowchart of a Method for Defining a Functional Block for a Program

FIG. 18 illustrates a method for developing an implementation of a function block from an input received in an ADL. The method shown in FIG. 18 may be used in conjunction with any of the computer systems or devices shown in the above Figures, among other devices. In various embodiments, some of the method elements shown may be performed concurrently, in a different order than shown, or may be omitted. Additional method elements may also be performed as desired. Note that where method elements are the same or similar to method elements described previously, descriptions may be abbreviated. As shown, this method may operate as follows.

First, in 1802, user input may be received specifying a functional block in a graphical specification and constraint language. The user input may specify annotation information for the functional block indicating a model of computation and a low-level implementation protocol for the functional block.

In one embodiment, the annotation information may include one or more of the specifications or required execution properties described above with reference to FIG. 5.

As with the above-described specifications or required execution properties, in some embodiments, the annotations may have a standardized format, such that the functional blocks (e.g., IP blocks) can be described by third parties.

In 1804, the functional block may be created in response to the user input, where the functional block includes the annotation information, and where the annotation information of the functional block is useable by one or more software tools for analyzing or selecting the functional block for use in a program, e.g., a graphical program. Moreover, in various embodiments, any of the aspects and features described above regarding specifications or required execution properties may apply to the annotation information of the functional block.

In some embodiments, a programmatic interface may be defined to query functional blocks about their protocol interface and high level models they support, as well as supported configuration search or optimizations mechanisms (which may be used by the designer tool during design space exploration). In other words, a programmatic interface (e.g., API, tool, etc.) may be defined for utilizing the annotations in the functional blocks.

For example, SDF characteristics, actor timing, and data access patterns can be considered as defining different configurations of the actor. Thus, a programmatic interface may allow tools to query about those configurations. Different configurations in different contexts may yield different performance or take different amounts of resources. Optimization tools with a suitable programmatic interface can thus use annotations to search through the configurations and try to find optimal design points.

In some embodiments, the approach described herein may facilitate or provide for tool-assisted implementation of the functional blocks.

For example, in one embodiment, given the implementation of core logic of the functional block (e.g., provided by the designer or third party), a harnessing (or wrapping) mechanism may be provided for implementing a standard interface for inter-block communications. This harnessing mechanism may be negotiated between a tool and the functional block to agree on what harness should wrap or surround the functional block for proper connection to other functional blocks.

It should be noted that in some embodiments, the approach described herein may also be valid for software implementation; however, the implementation details and protocols would be different from those for hardware implementations (e.g., on FPGAs), although, at least in some embodiments, the model specification may be the same. For example, for software, the implementation protocol may be different from that of hardware. A common case may be function-call-like, where data transfer may be described at an abstract level as a chunk of data in the memory passed through the function by reference. A more detailed level might involve sequential transfer of data, such as with DMA (direct memory access). Thus, the same specification mechanism may be used for software directed functional blocks, but with different protocol/data access patterns.

In one embodiment, the programmatic interface may be utilized by various associated tool/editing/design time operations.

Moreover, in some embodiments, the annotations may be used to implement or facilitate advanced validation and optimization capabilities, such as for example:

1. Simulation at multiple timing accuracy levels, e.g. untimed simulation at the model of computation level and timed simulation at the implementation protocol level;
2. Abstract functional block compatibility checking regarding timing and communication protocols; or
3. Design optimization based on the additional implementation oriented information, e.g., buffer minimization by (partial) rate matching, among others.

Static Data Flow Actor Definition Language

The following describes exemplary embodiments of a static data flow actor definition language, and may be particularly useful for hardware implementation. For brevity, the static data flow actor definition language may be referred to simply as an ADL (actor description language).

Static data flow is a popular model of computation for many application domains, including, for example, multimedia, signal processing, communication, etc. Currently, SDF models can be implemented by software in a much more streamlined way than by hardware. This is because traditional implementation platforms are generally based on DSPs or micro-processors. Therefore, SDF model implementation techniques have been extensively focused on software. However, with the rapid advance of the programmable hardware (e.g., FPGA) technology, SDF models are increasingly deployed on hardware, especially for those requiring high performance. Although the fundamental issues of SDF models, such as consistency, scheduling etc., remain the same, there are significant distinctions when deploying SDF models on hardware versus on software. For example, with software implementation, data exchange between actors is generally achieved by passing a reference that points to the data; in contrast, with hardware implementation, data are generally transferred physically from one actor to the next.

As a result, when describing SDF actors with hardware as the intended implementation, additional information can be introduced into the definition, so that the hardware implementation process will be more streamlined with assisting tools digesting the definition and generating the proper logic for connecting the actors consistent with the SDF semantics. Moreover, the actor definition may provide an exact description of the actor's behavior, not only of token flow at the SDF semantics level, but also a cycle accurate description at the implementation level. Therefore, the actor definition may serve multiple purposes: SDF behavior description, cycle accurate timing description, functional block (actor) integration guideline, etc.

The following describes one embodiment of an actor definition language (or language extension), in which a one-input-one-output actor is assumed. For multiple input/output actors, the techniques described may be intuitively extended.

TABLE 1

| SISO (single input-single output) ADL | | |
|---|---|---|
| | Parameter | Description |
| Traditional SDF Actor Definition | Input Count | The number of tokens consumed at an input terminal by one firing of the actor |
| | Output Count | The number of tokens produced at an output terminal by one firing of the actor |
| New Parameters with the Emphasis on Hardware Implementation | Execution Time | The number of cycles that an actor needs to finish its firing |
| | Initiation Interval | The minimum number of cycles from one firing of an actor to its next firing |
| | Is Exact | A flag indicating whether the execution time is an exact (constant) number or an upper bound (worst case) |
| | [Input Pattern] | A Boolean array. Aligned with the beginning of the firing. Each true value denotes the consumption of a token by the actor |
| | [Output Pattern] | A Boolean array. Aligned with the end of the firing. Each true value denotes the production of a token by the actor |

Table 1 presents some of the various parameters which can be specified for a functional block or actor, and included as an annotation in the functional block. The first two—input count and output count—are known and used in traditional SDF actor definition. The subsequent parameters are new, and may be particularly useful for hardware implementation. It should be noted, however, that the particular parameters and symbols (or acronyms) described are exemplary only, and are not intended to limit the ADL to any particular set of parameters or symbols.

Input count (IC) indicates or specifies the number of tokens consumed at an input terminal by one firing of the actor, as described in the "Terms" section above. In other words, the value of IC denotes the number of input data elements consumed by the functional block each time the functional block executes (fires).

Output count (OC) indicates or specifies the number of tokens produced at an output terminal by one firing of the actor, as described in the "Terms" section above. In other words, the value of OC denotes the number of output data elements produced by the functional block each time the functional block executes (fires).

Execution Time (ET) indicates or specifies the number of (clock) cycles that an actor needs to finish its firing, as described in the "Terms" section above. In other words, the value of ET (e.g., in clock cycles) denotes the total number of clock cycles required to complete execution of the functional block.

Initiation Interval (II) indicates or specifies the minimum number of (clock) cycles from one firing of an actor to its next firing, as described in the "Terms" section above, i.e., the minimum time between successive executions of a functional block.

Is Exact (IE) is a flag indicating whether the execution time is an exact (constant) number or an upper bound (worst case), where, for example, a value of TRUE denotes an exact number.

Input Pattern (IP) in this embodiment is a Boolean array that is aligned with the beginning of the firing. Each true value in the array denotes the consumption of a token by the actor. In other words, the sequence of values in the IP correspond to at least a subset of the minimum number of clock cycles between successive firings of the functional block, where for each true value, an input token is consumed at an input terminal at or in the corresponding clock cycle. Thus, an IP of (1,0,1,0) indicates consumption of an input token (data element) at the input terminal every other cycle. Input Pattern is more generally described in the "Terms" section above.

Output Pattern (OP) in this embodiment is a Boolean array that is aligned with the end of the firing. Each true value denotes the production of a token by the actor. Thus, the sequence of values in the OP correspond to at least a subset of the minimum number of clock cycles between successive firings of the functional block, where for each true value, an output token is consumed at an output terminal at or in the corresponding clock cycle. Thus, an OP of (1,0,1,0) indicates production of an output token (data element) at the output terminal every other cycle. Output Pattern is more generally described in the "Terms" section above.

As noted above, input patterns and output patterns may be referred to collectively as access patterns.

Thus, the above parameters may be used to annotate functional blocks, where the annotations are useable for a wide variety of purposes.

FIGS. 19-22—Examples of Annotated Functional Blocks

FIGS. 19-22 illustrate exemplary embodiments of annotated functional blocks (e.g., IP blocks). Note that in the following examples, the annotations are presented in the following format:

<IC, OC, II, ET, IE, IP, OP>

However, it should be noted that the format, e.g., order of parameters, and the particular parameters and symbols used are exemplary only, and that other formats and parameters/symbols may be used as desired. Nor is it required that all of these particular parameters be provided; the specification in this embodiment is illustrative only. Fewer or more parameters can be provided.

Figure 19:
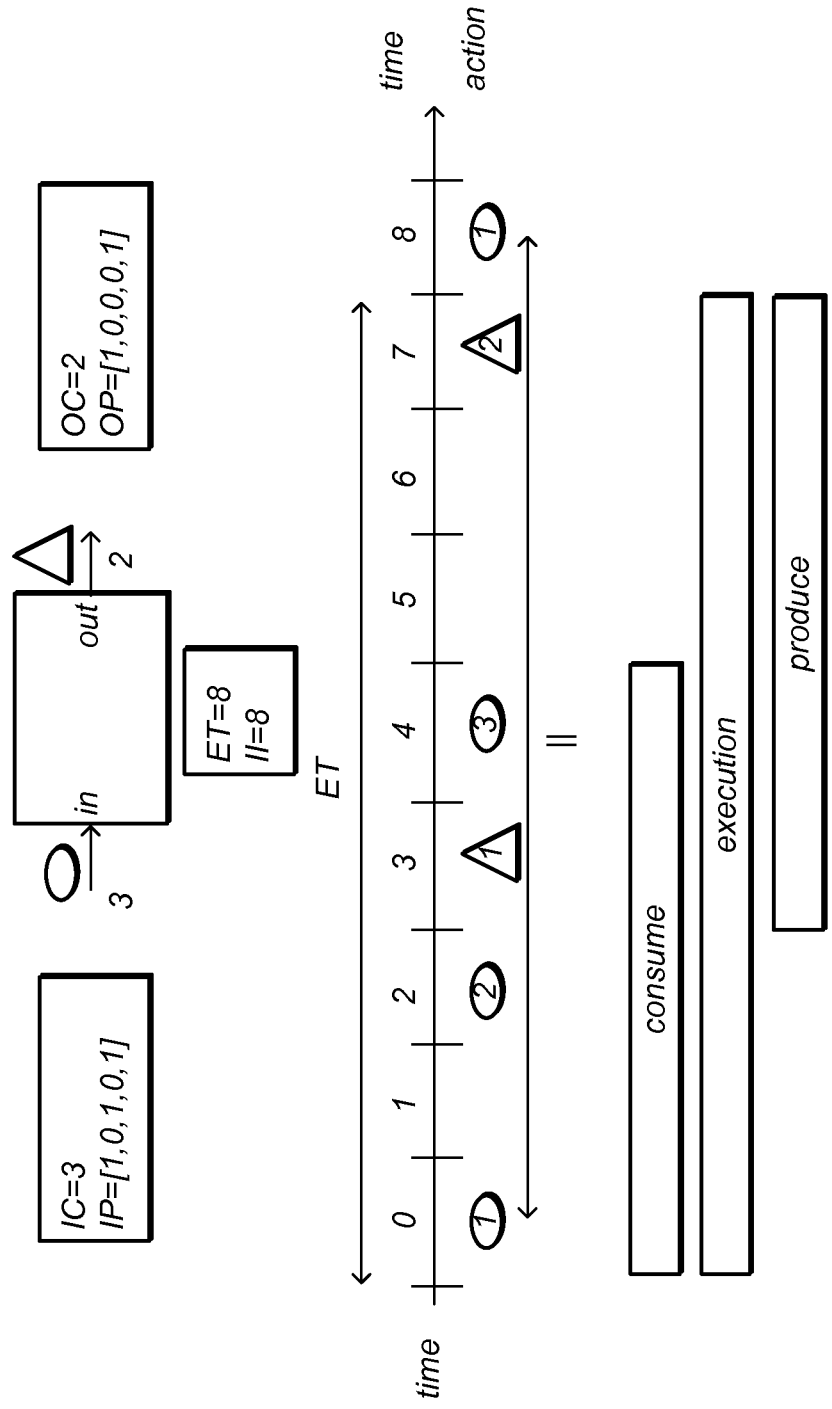
FIGS. 19-22 illustrate various examples of annotated functional blocks and different possible embodiments of access pattern (AP) information.

FIG. 19 illustrates a non-pipelined functional block (actor) with a specified exact execution time. As shown, the annotation for this functional block is:

<3,2,8,8,T,[1,0,1,0,1], [1,0,0,0,1]>

As indicated in FIG. 19, the input count (IC) for this functional block is 3, and the input pattern (IP) is [1,0,1,0,1], meaning that each execution of the block consumes three data elements, and these three data elements are consumed at a rate of one every other clock cycle during execution of the block.

A time-line shown below the functional block in FIG. 19 illustrates the activities of the functional block during execution per the annotation information, i.e., over the 8 clock cycles (cycles 0-7) between successive firings of the block (with the first cycle of the next firing shown as cycle number 8). For example, note that input to the functional block, represented by ovals (which are numbered in the time-line), are shown being consumed at cycles 0, 2, and 4 (and beginning again at cycle 8). As indicated by the "consume" bar below the time-line, the functional block consumes data between cycle 0 and cycle 4 (inclusively). As the annotation and time-line also indicate, the II (initiation interval) is 8 (clock cycles), meaning that the beginning of each firing is separated by at least 8 clock cycles.

Continuing through the annotation information, the execution time (ET) for this functional block is 8 cycles, which means that the block requires the entire II (also set to 8) to complete execution. The Boolean term Is Exact (IE) is set to True (T), thus indicating that the ET is exact, not just an upper bound. The OC is 2, and the output pattern (OP) is [1,0,0,0,1], which means that two output tokens (data elements), indicated by triangles (numbered in the time-line) will be produced by the functional block during a single execution, and that the two tokens/output data will be produced at the fourth (cycle 3) and eighth (cycle 7) clock cycles. Note that the output pattern is aligned with the end of the execution period, whereas the input pattern is aligned with the beginning FIG. 20 illustrates a non-pipelined actor with worst case execution time, annotated thusly:

<3,2,8,8,F,[1,0,1,0,1], [1,0,0,0,1]>

Figure 20:
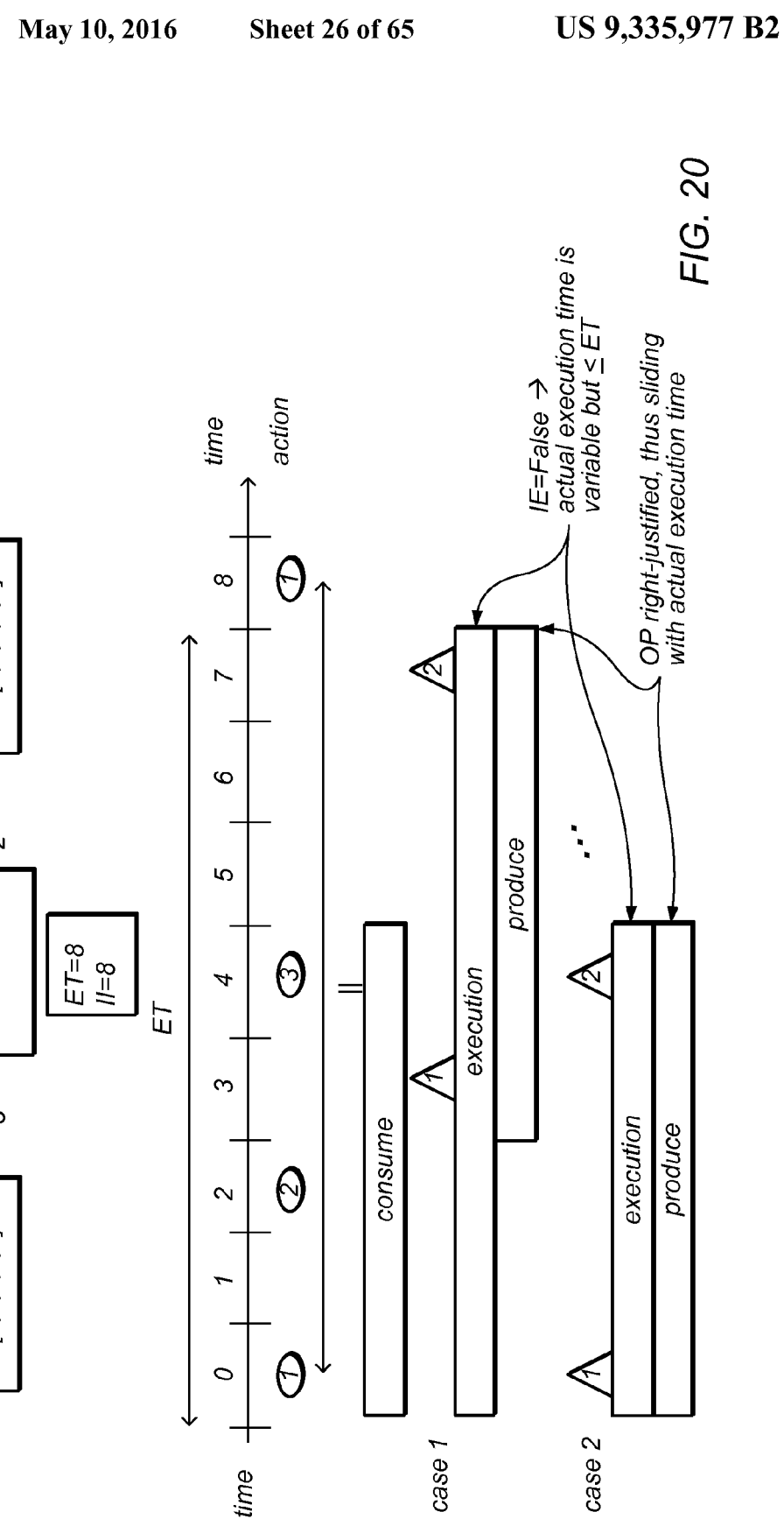

As indicated in FIG. 20, the only difference in annotation with respect to the example of FIG. 19 is that "Is Exact" (IE) has a value of False (F). Thus, the ET indicated is an upper bound, and thus is not a reliable indicator of when outputs will be produced. This lack of certitude in the execution time results in multiple possible output schedules, as indicated by the exemplary two cases shown below the time-line of FIG. 20. As shown, in case 1, the functional block executes over the entire II, and so the two output tokens are produced at cycle 3 (fourth cycle) and cycle 7 (eighth cycle), as with the functional block of FIG. 19. In contrast, in case 2, the execution only takes 5 cycles (cycles 0-4), and so, aligning the output pattern with the end of the execution gives cycles 0 and 4 as the output cycles, i.e., the clock cycles in which the functional block generates the respective output tokens/data.

Figure 21:
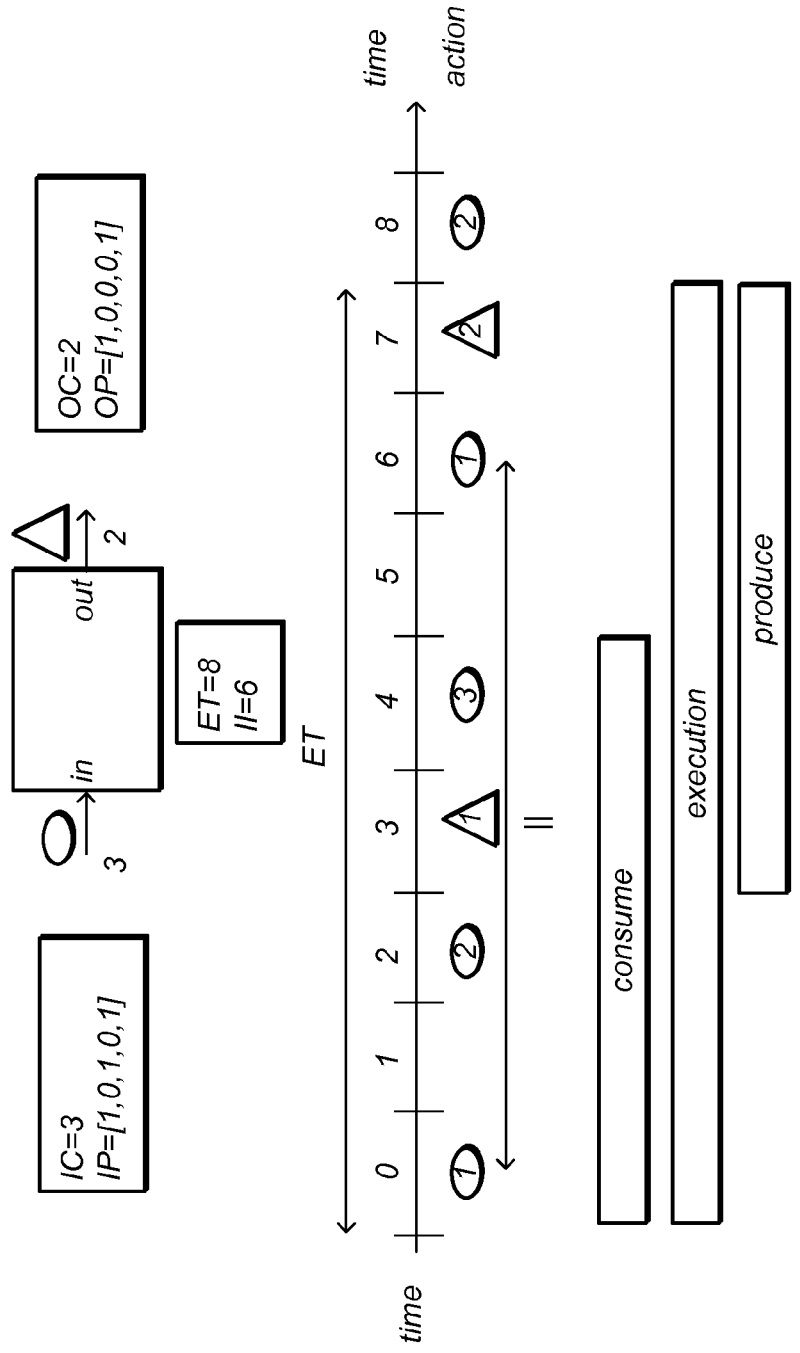

FIG. 21 illustrates a pipelined actor with exact execution time, annotated thusly:

<3,2,6,8,T,[1,0,1,0,1], [1,0,0,0,1]>

As may be seen, the only difference in annotation with respect to the example of FIG. 19 is that the II is 6 rather than 8, which means that although the execution time is 8 cycles, and is exact, the functional block fires again after 6 cycles, as indicated by the time-line. Thus, the functional block executes over the entire II plus two clock cycles. Now, aligning the input pattern with firing cycle 0 (but in the subsequent firing, cycle 6) again gives cycles 0, 2, and 4 as input consumption cycles (but in the subsequent firing, cycles 6 and 8). However, since the output pattern aligns with the end of the execution time, the two output tokens are again produced at cycles 3 and 7.

Figure 22:
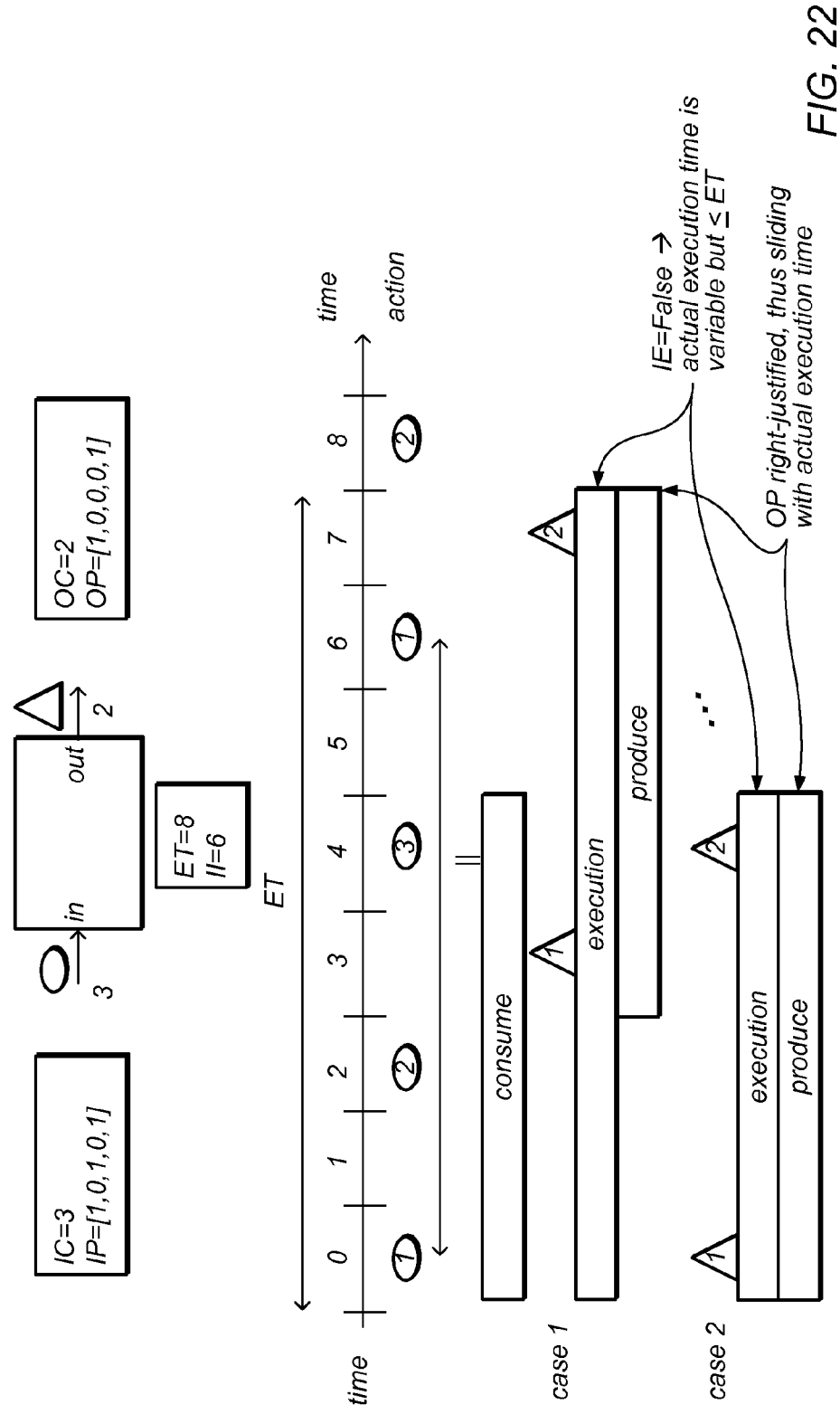

FIG. 22 illustrates a pipelined actor with worst case execution time, annotated thusly:

<3,2,6,8,F,[1,0,1,0,1], [1,0,0,0,1]>

In the example of FIG. 22, all annotation terms are the same as the example of FIG. 21, except for "Is Exact" (IE), which has a value of False (F), and the II, which is 6 (as with the example of FIG. 21. Thus, regarding the two exemplary cases shown below the time-line in FIG. 21, and the input and output patterns, inputs are consumed on cycles 0, 2, and 4 (then subsequently in cycles 6, 8, and 10 (not shown)); in case 1, with execution time of 8, outputs are produced at cycles 3 and 7, whereas in case 2, with execution time of 5, outputs are produced at cycles 0 and 4.

In some embodiments, additional information may be included in or added to the tuple of information, e.g., information regarding the internal implementation of the actors, such as the use of output buffers that could eventually be used by the designer tool for rate matching optimizations, or the existence of combinational implementation options that can be used for fusion optimization, among others.

Extension of ADL to Actors with Multiple Inputs and Multiple Outputs

As noted above, the techniques disclosed herein are also applicable to functional blocks with multiple inputs and/or outputs.

For example, in the seven tuple <IC, OC, II, ET, IE, IP, OP>, II, ET and IE are explicit parameters for actor timing, and may apply to all actors regardless of the number of inputs and outputs. Each of the other four parameters is for just one input or output. When the ADL is extended to multiple inputs and outputs, the four parameters may be augmented with an additional dimension. For example, the input count for a two-input actor may become a vector, e.g., IC_m=<3,2>; and the input pattern for the same actor may be a matrix, e.g., IP_m=<[1,1,1,0], [1,0,1,0]>. Thus, one embodiment of the augmented seven tuple for multi-input-multi-output actors may be:

IC_m, OC_m, II, ET, IE, IP_m, OP_m>.

Meta Patterns

In the representation above, matrices are used to capture all the possibilities of <IP> and <OP>, but may be resource and/or computationally intensive. However, a significant percentage of actors (functional blocks) demonstrate certain patterns across all the inputs and/or outputs, referred to herein as "meta-patterns". A meta-pattern can be applied to a single IP or OP, or used as a type of "short hand". For example, when only one meta-pattern is specified for all the IPs or OPs, the meta-pattern may apply to each and everyone pattern in the set.

Exemplary meta-patterns include the following:

1. meta-pattern 1—evenly distributed.

An evenly distributed meta-pattern takes one optional parameter, range. It specifies the number of clock cycles over which all the tokens (n) will spread out evenly. By default, the range is equal to II, but the user can indicate a smaller range, in which case, range may be left-justified for inputs, and right-justified for outputs. In one embodiments, the relationship between n and range is:

when n>1, there exists a non-negative integer k, s.t. n+(n−1)k<=range<n+(n−1)(k+1). In this case, all the tokens will be separated by k cycles, and the first token comes in the first cycle for inputs, or the last token comes in the last cycle for outputs;

when n=1, the only token comes at the center cycle of the range if range is odd; if range is even, the token comes at the cycle before the center for inputs, or the cycle after the center for outputs.

2. meta-pattern 2—"as soon as possible" (ASAP) or left packed.

As its name suggests, all the tokens may be packed one per cycle at the beginning (left-hand side) of the range. Note that ASAP works the same way for inputs and outputs.

3. meta-pattern 3—"as late as possible" (ALAP) or right packed.

In this meta-pattern, all the tokens may be packed one per cycle at the end (right-hand side) of the range. Note that, like ASAP, ALAP works the same way for inputs and outputs.

The following describes various examples of meta-patterns:

Suppose actor A has two inputs and one output. A partial characterization of the actor is <<3,2>, <3>, 5, 10, True, [ ], [ ]>.

<<3,2>, <3>, 5, 10, True, even, even>=<<3,2>, <3>, 5, 10, True, [10101, 10001], [10101]>

<<3,2>, <3>, 5, 10, True, (even,3), even]>=<<3,2>, <3>, 5, 10, True, [11100, 10100], [10101]>

<<3,2>, <3>, 5, 10, True, [(even, 3), (even,4)], [even,3]>=<<3,2>, <3>, 5, 10, True, [11100, 10010], [00111]>

<<3,2>, <3>, 5, 10, True, asap, alap>=<<3,2>, <3>, 5, 10, True, [11100, 11000], [00111]>

<<3,2>, <3>, 5, 10, True, (alap,4), (asap,4)>=<<3,2>, <3>, 5, 10, True, [01110, 00110], [01110]>

. . . (and so forth).

This mechanism may be implemented or complemented with a GUI that shows the actual patterns. In addition, various symbols or layout icons or buttons may be provided for graphical interaction with users. For example, icons/buttons similar to those used to indicate text justification (formatting) in work processor programs may be used to represent and/or specify meta-patterns.

In addition to the access patterns summary description for a particular block, one embodiment may allow a high-level description of the salient observable or internal states of a functional block via a state machine or set of state machines, that describe the state and time at which input tokens are consumed, the state and time at which output tokens are produced, and the relation between inputs and outputs by yet another state machine or general function. Such a set of state machines may be described on the interface of the block, similar to IP and OP, described above.

Extensions of ADL to CSDF and PCSDF

When representing actors within a CSDF or PCSDF environment, the ADL description for SDF actors described above may be extended in multiple dimensions to reflect the multiple phases in CSDF description, and the multiple configurations that are represented by parameters selectable when the actor is instantiated. Furthermore if the model is 0-1 CSDF, then a restriction is imposed on the valid values in the multi-dimensional matrix that represents it, e.g., for IC and OC, and for ET, II, IP, and OP. It should be noted that actors that can take multiple cycles for a computation can have an IC of (1, 0, 0, 0, . . . ), where a token is consumed in a first phase, then compute for 3 more phases, and then have a corresponding OC (0, 0, 0, 1).

Figure 23:
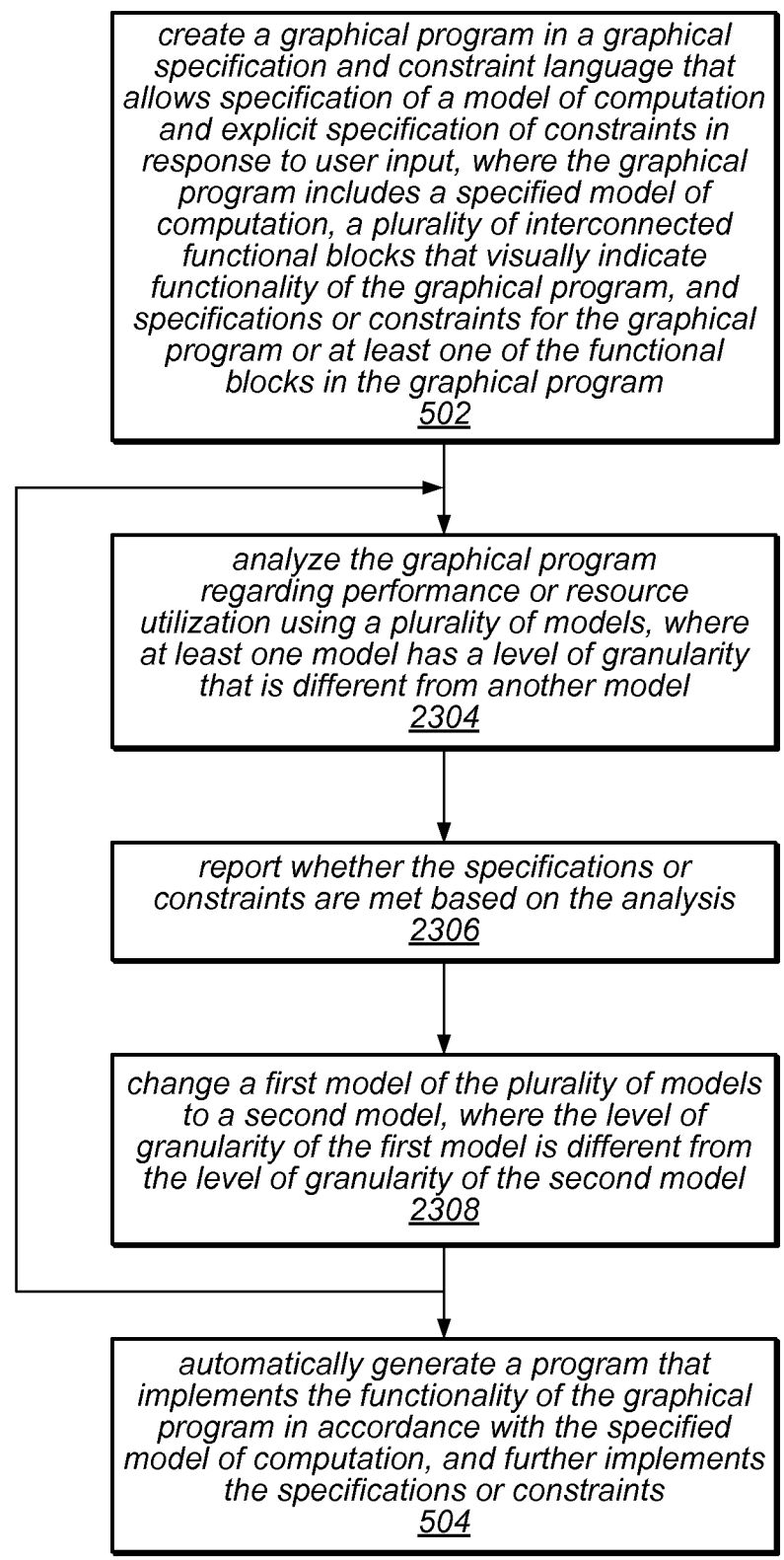
FIG. 23 is a flowchart diagram illustrating one embodiment of yet another method for creating a implementation program from a graphical program, using models of different resolutions.

FIG. 23—Iteratively Varying Model Resolution Based on Estimation

FIG. 23 illustrates a method for creating an implementation program. The method shown in FIG. 23 may be used in conjunction with any of the computer systems or devices shown in the previous figures, among other devices. In various embodiments, some of the method elements shown may be performed concurrently, in a different order than shown, or may be omitted. Additional method elements may also be performed as desired. As shown, this method may operate as follows.

In 502, a graphical program may be created in a graphical specification and constraint language that allows specification of a model of computation and explicit declaration of required execution properties, similar to those described above. The graphical program may include a specified model of computation, a plurality of interconnected functional blocks that visually indicate functionality of the graphical program in accordance with the specified model of computation, and specifications or required execution properties for the graphical program or at least one of the functional blocks in the graphical program.

In 2304, the graphical program may be analyzed, including the required execution properties, thereby generating analysis results regarding performance (e.g., timing) or resource utilization. The analysis may be performed prior to conversion of the graphical program to a hardware description (e.g., the analysis may be performed at a specification level).

In one embodiment, the analysis may involve estimating the performance or resource utilization for the plurality of functional blocks using a plurality of models. Each model may have an associated level of granularity (also referred to as resolution or accuracy). Thus, a model having high resolution may be more accurate in terms of performance and/or resource utilization, but may require more computation/time for the estimation. Additionally, different models may be used for different portions of the graphical program. For example, a first model may be associated with a first one or more functional blocks within the graphical program and a second model may be associated with a second one or more functional blocks within the graphical program. The first model may have a different level of resolution than the second model. According to various embodiments, the level of resolution may be specified manually by the user or may be specified automatically, e.g., according to various thresholds or heuristics.

In some embodiments, at least some of the plurality of models may be stored in a database keyed by a combination of functional block identification, the specified model of computation, the specification or required execution properties, and functional block interconnections. The database may be a global database or a distributed database, or any other type of database as desired.

As one example, a first functional block may relate to a filtering function. There may be two models associated with the filtering function, e.g., a first model that uses prior filtering data to predict the performance and/or resource utilization of the filtering function (e.g., based on prior filtering data) and a second, higher resolution model that is able to provide cycle accurate simulations of the filter. Accordingly, the first model may be at a lower level of resolution than the second model, but may provide an estimation more quickly than the second model. Thus, the analysis of the graphical program may utilize various models of different levels of granularity for estimating the performance or resource utilization for the plurality of functional blocks.

Based on the analysis of 2304, in 2306, the method may report whether or not the specifications or required execution properties are met based on the analysis results, similar to descriptions above.

In 2308, at least one model of the plurality of models may be changed based on the analysis (2304) and/or reporting (2306) above. For example, at least a first model of the plurality of models may be changed to a second model that is at a different level of granularity or resolution. This change of model may be performed manually (by the user specifying the change of granularity) or automatically (by software specifying the change of granularity, e.g., based on thresholds or heuristics).

For example, where a model of a functional block (or portion of the graphical data flow diagram) has not been changed in the last iteration (or several iterations), it may be assumed that that model does not require further changes, and a more accurate model may be used in order to provide a better estimation for that portion of the graphical program. This may be especially beneficial for later iterations since the estimate for that portion may be reusable without further computation. Similarly, a model or functional block may be changed to increased resolution where that portion of the graphical data flow diagram has met its specified required execution properties.

In further embodiments, models or functional blocks that are undergoing many changes or are outside of a threshold from the specified required execution properties may automatically have lower levels of resolution (e.g., since knowing exactly how deficient the present design is largely unnecessary outside a certain threshold).

Similar to above, the plurality of models may have different levels of granularity after 2308. Alternatively, all of the models may be at the same level of granularity, e.g., in 2304 and/or 2308. However, in one embodiment, at least one of the originally used models or the modified models has a different level of granularity for a first portion of the graphical program than another model (within the same set of models).

As shown, the method may repeat the analysis, reporting, and changing in an iterative fashion (e.g., until the required execution properties are met and/or the models have all reached a desired level of resolution). Note that in the final iteration, where an end condition has been met, the changing in 2308 may not be performed.

In 504, as described above, a program that implements the functionality of the graphical program in accordance with the specified model of computation and implements the specifications or required execution properties may be automatically generated. The program may be used for programming a programmable hardware element (or for generating a hardware description for programming the programmable hardware element).

Further Embodiments

The following describes various embodiments of iterative refinement of sub-block timing and resource estimation technique for design space exploration of a graphical program. Generally, timing and resource estimation may be used for design space exploration, including FFT timing information, clumping estimations, and iteration of these estimations. More specifically, timing and resource estimation may be used for early feedback to the user. Iterative refinement of timing and resource models may be used based on higher level constructs. These models may be used for feeding back more accurate modeling results to the tool. Additionally, different model approximation resolutions may be used for different subsets of a diagram during design.

Graphical programs according to some embodiments of the invention may be based on a model of computation that is suitable for modeling of timing characteristics of compiled design at a high level of abstraction. Based on a number of measurements of the characteristics of the individual actors on the target device, and a model of the interaction of these actors within a given application, a quick estimate of the timing may be generated. In some embodiments, the high-level estimate may be accurate to about 30% of actual, which may be useful for both user decisions as well as automatic design space exploration.

In general, high-level timing analysis plays a critical role in achieving an efficient FPGA-based hardware design (although embodiments described herein are not limited to hardware designs and may also apply to software). Timing analysis can be performed at cycle level or sub-cycle level: cycle-level timing analysis reports latency in clock cycles while sub-cycle-level timing analysis estimates execution delay in nanoseconds/picoseconds. To enable early compile-time timing analysis, a library that contains corresponding timing characterization of each building construct may be used. In the following, characterization of sub-cycle-level execution delays and how this could enable a compile-time (high-level) timing analysis at the sub-cycle level are described, which may be used to facilitate automatic design space exploration. Furthermore, the following also describes analysis heuristics that may be used to model parameters including resource utilization, options to synthesis tools, etc. to improve estimation accuracy.

To expedite and ease the design process, and as described above, the system-level design environment may provide functional blocks, e.g., high-level building primitives, such as Intellectual Property blocks. Generally, prior art systems utilize timing analysis after either mapping or PAR (place and route). Post-mapping timing analysis requires that logic synthesis be completed while post-implementation timing analysis occurs after placement and routing are finished. It is well known that both logic synthesis and placement and routing may take a long time.

In the present embodiments, timing analysis and optimization may be performed at a high level, e.g., at the specification level. As indicated above, the timing analysis and optimization may be at cycle level (in clock cycles) or at sub-cycle level (in nanoseconds/picoseconds). Accordingly, there are two levels of delay characteristics of building constructs to enable the above mentioned analysis and optimization.

Timing characteristic of primitives is only known after FPGA compilation. As mentioned above, this may take a long time. Even worse, it may report a timing error. Thus, in embodiments described herein, timing and resource estimation may be performed at the specification level through platform modeling. Platform modeling may be based on (or include) user's specification of the platform based on a tool vendor provided platform library. An example of user specification of a platform is a particular FPGA platform used for design implementation and examples of platform library include timing library, resource library, and/or power library, etc.

The following provides examples of analysis and optimization that may be performed.

Find critical path—Compute the worst-case execution time in nanoseconds of the longest path in an identified combinational sub-diagram that will be implemented on an FPGA platform at some clock frequency.

Predict whether logic will likely fit in the specified clock period—Compare the predicted worst-case execution time (WCET) with the specified clock period and report whether combinational delay will likely fit in the specified clock period.

Compute fastest feasible clock rate—Convert the predicted WCET to frequency and report it as the fastest feasible clock rate.

Automatic pipelining/fusion—When WCET prediction suggests logic could not fit in specified clock period, pipeline/fuse computation to achieve the specified clock rate.

Re-timing—When WCET prediction suggests logic could not fit in specified clock period and there are multiple registers in the feedback loop, re-time computation by moving registers around to achieve the specified clock rate.

As indicated above, a platform component characterization library may be provided that allows for automatic (tool) or manual (user) early design space exploration. This exploration may be performed by:

Measuring the performance of primitives on the selected target.

Using those measurements, in combination with a number of (analysis) models, to describe the behavior of a user-provided (high-level) application description. These models may include heuristics to describe some of the effects of a stack of possible compiler optimizations techniques, as well as some platform abstraction mechanisms. Additionally, different models can be applied to different parts of the user provided application description.

Refining the data in the timing library by analyzing the results of full compilation of an application on the end-user machine especially if the estimate is not close to the result of the full compilation.

Performance is one example of optimization criteria, and similar techniques may be applied to area and power.

Exemplary enabling assumptions:

The measurement/characterization may be performed at the same level of granularity as the basic primitives in the application domain and not just as primitives in the platform domain. This may provide more accurate data, by incorporating at least part of the mapping information. Accordingly, the lowest level logic optimization problem can be better abstracted and more traditional compiler level optimization may only be relevant.

Additionally, the programming language/environment (e.g., designer tool) may have some limited control choices, so that the traditional compilation stack transformations can be more easily abstracted, or may only require basic transformations that can execute quickly.

Specific variants:

Do as above with refinement loops, either by adding pattern information back (see below), or extracting information about individual actors, by including possible observers into the generated code.

Do as above with some light optimization at the higher layers (to better model traditional compiler flow) (see FIG. 23).

Do as above based on micro-architecture abstraction of some of the platform components (e.g. FPGA LUTs (Look Up Tables) to micro-units).

Do as above with end-user replaceable platform libraries.

Do as above where the application model uses not just individual actors, but looks at "patterns" of actors, and/or the interaction between actors.

Do as above where the application model looks at markers (number of actors, number of inputs or outputs, word length, number operators, etc.).

Do as above where the application model uses part/resource utilization information.

The timing library as above, but storing further parameters besides clocks, data type (including basic type, or particulars of rounding, etc.), implementation strategy (optimization of speed or area), etc. or some basic patterns.

The description of the timing information for each actor whose ET is equivalent to 0 (sub-cycle) based on a vector that describes information of first stage, last stage, and the longest of the stages in between (wcet_l, wcet_r, or wcet_m). In other words, the vector comprises the delay before functional block input registers, the delay after functional block output registers, and the maximum combinational delay between registers of the functional block.

The description of the timing information for each actor whose ET is greater than or equal to 1 and that has multiple possible configurations (e.g. including multiple possible IC, OC, ET, II, IP and OP for different models of computations, specifications or required execution properties) based on a value for the maximum delay between functional block registers from a configurations determined based on model of computation, specifications and required execution properties.

Actor specific information, e.g. memory implementation options (Block RAM, LUTs, etc.).

As above, but also relate the implementation of individual actors to information about timing and platform, so that they can interact with the tool to be the runtime repository of this information. As above, where the configuration information is provided by the actor. As above, where the actor relies on a separate database (e.g. a global or distributed database) to implement access to specific information.

Alternatively, HDL (Hardware Description Language) may be generated and then estimated at that level.

In order to support compile-time timing analysis for designs targeting FPGA platforms (or other types of platforms), a timing library may be constructed (e.g., prior to use, e.g., in the development environment) that characterizes the execution delays of the FPGA programming primitive constructs. The timing delay characteristic of building constructs may be FPGA platform specific and moreover dependent upon the clock frequency. Therefore, the data may be aggregated across different platforms, e.g., systematically.

To characterize the timing property of the functional blocks, their execution time in the worst-case scenario should be considered, which is usually called Worst-Case Execution Time (WCET). In the following, methods for obtaining timing characteristics to generate a timing library database as well as how to use timing library services are discussed.

To automatically gather WCETs of building constructs, an instrumentation circuit for each primitive/function block may be generated for each FPGA platform. Additionally, regular FPGA compilation (e.g., from graphical programs) may be used to synthesize and implement the generated program. Next the generated timing report may be imported into various software tools, such as PlanAhead™, provided by Xilinx, Inc., which may export a corresponding report with detailed path information. Finally, the report may be processed (e.g., post processed) to extract the WCET of the primitive and automatically generate timing library database.

To support pre-synthesis (or pre-HDL code generation) timing analysis, the data structure representing system specification may be annotated with the pre-characterized primitive delay property. At compile-time, a longest path analysis can be performed to predict the WCET of the corresponding FPGA implementation.

The data types supported for FPGA implementation are mainly Boolean, integer, and fixed point, although other data types are envisioned.

Ideally, the database or library may have explicitly recorded all widths integer and fixed point data types. Practically, to prevent the database from becoming too large, inner interpolation may be used to estimate the WCET for those widths that cannot be directly found in the library. For a good estimation, the inner interpolation may be performed based on the information of its immediate lower/higher width configurations available in the timing library. The following formula may be used to compute the estimated WCET of the currently requested input data type configuration.

$$\text{wcet}_w = \text{wcet}_{lw} + (\text{wcet}_{hw} - \text{wcet}_{lw}) * (w - lw)/(hw - lw)$$

Depending on the intra-cycle level timing library database, two types of timing models may be used. There are three entry points which may be used to obtain routing information, e.g., no routing, estimated, and real-implementation. Experiments show that using real-implementation routing delay to characterize a primitive is not a good choice since routing delay is more design specific.

In some embodiment, a routing delay allowance model may be used. This model uses the pure logic delay as the worst-case execution time of the primitives. To predict the total delay, the timing model requests from the library a percentage allowance to account for the routing delay from the nets.

For a simple version of the Routing Delay Allowance Model, WCET of the longest path may be scaled by a single routing allowance percentage, which models routing delay contribution:

$$\text{totalDelay} = \text{computedTotalLogicDelay} * (1 + \text{routingDelayAllowancePercentage})$$

For an advanced version of the Routing Delay Allowance Model, the WCET of the longest paths may be scaled by possibly different routing allowance percentages based on the path component characteristics.

Alternatively, or additionally, an estimated routing delay model may be used. In this timing model, the worst-case execution time of primitives in the timing library may include both logic delay and corresponding estimated routing delays.

Furthermore, multiple actors or functional blocks may be considered together when performing estimation. Together, these functional blocks form patterns whose performance or resource estimation may be better as whole than compared to addition of individual components. In one embodiment, information about such patterns and corresponding models can be used for estimation.

One possible pattern to consider is the fanout, i.e. the number of interconnection from one output terminal of a block to possibly multiple input ports in one or multiple functional blocks.

Similarly the number of functional blocks in a given graphical program may affect the estimation, so it should be considered as a possible pattern by which to adjust the overall estimation, or estimation of portions of a graphical program.

The following describes an exemplary API that may be used to access the database.

Primitive information: ID, Input data type configuration (rounding mode, overflow mode), Implementation configuration (pipelining vs. non-pipelining; BRAIVI vs. LUT)

FPGA platform information: Part number, Clock frequency,

Implementation strategy, Area vs. Speed

Routing model, Pure logic delay plus routing allowance vs. total delay with estimated routing.

The return value encodes the primitive's timing characteristics: for a non-pipelined primitive, a single number may be used to record its WCET; for a pipelined primitive, a tuple may be used to record the timing characteristics of individual pipeline stages.

One of the most challenging challenges in timing analysis and optimization is to model/characterize the routing delay. Routing for Boolean operators may contribute significantly to the total delay (close to 100%). However, for arithmetic operators, routing contribution is about 50%. Based on this observation, a refined routing allowance percentage may be applied based on the characteristics of the components along the critical path.

A second technique that can be used to predict execution delay is based on incorporating the detailed FPGA hardware resource characteristics. For example, any logic component that has no more than 6 single bit inputs can be implemented by a single LUT in a Virtex V platform. With this, accurate timing estimation may be achieved for sub-components in a system.

Early "pre-synthesis" WCET estimation may be based on timing characteristics from platform library. An FPGA compilation timing error may imply that the utilized timing model (especially for routing) is not perfect (e.g., timing analysis engine under-estimated the worst-case execution time). For a new round of analysis, the analysis and optimization engine should be able to take advantages of the timing results obtained from last compilation. Note that it makes sense to use delay consisting of post-implementation routing nets as feedback since it is brought back to the same design with the same configuration. Furthermore, the timing library database can be updated/refined based on the same information.

In summary, the above-described timing library may serve as an input analysis and optimization engine. With the pre-characterized execution delay information, pre-synthesis (we-code-generation) timing analysis and optimization can be performed on the data structure representing the design. With the capability of incorporating the detailed timing information from last round of compilation, timing analysis and optimization is achieved.

FIGS. 24-28

Figure 24:
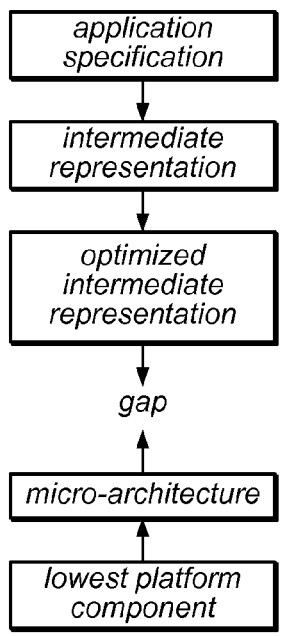
FIG. 24 is an exemplary flow diagram illustrating the gap between top down and bottom up design, according to one embodiment.

FIG. 24 is an exemplary flow diagram illustrating the gap between top down and bottom up design. As shown, in top down design, an application specification may be initially specified, which may be used to create an intermediate representation. The intermediate representation may be optimized. From the bottom up, the lowest platform components may be used to create a micro-architecture. Between the two approaches, a gap exists, which may be fulfilled by the embodiments described herein.

Figure 25:
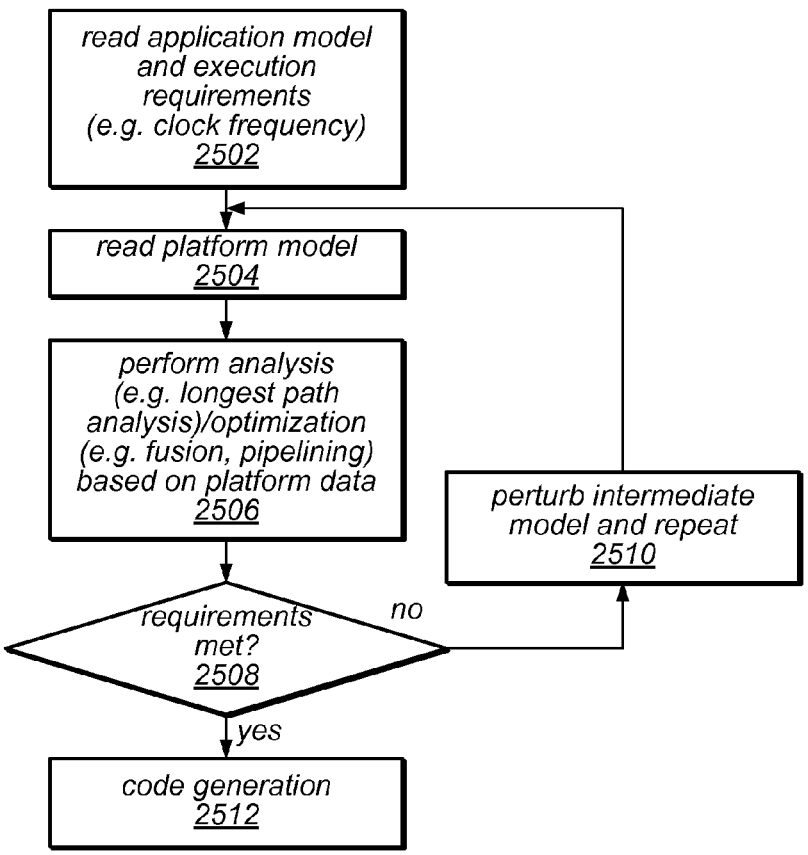
FIG. 25 is a flowchart of an exemplary method for generating code, according to one embodiment.

FIG. 25 is a flow chart of an exemplary method for generating code. As shown, in 2502, the application model and design required execution properties (e.g., clock frequency) may be read. In 2504, the platform model may be read. In 2506, analysis may be performed (e.g., longest path analysis) and optimizations may be performed (e.g., fusion, pipelining, etc.) based on the platform data. In 2508, if the required execution properties are met, code is generated in 2512. If they are not, in 2510, the intermediate model may be perturbed and 2504 and 2506 may be repeated.

Figure 26:
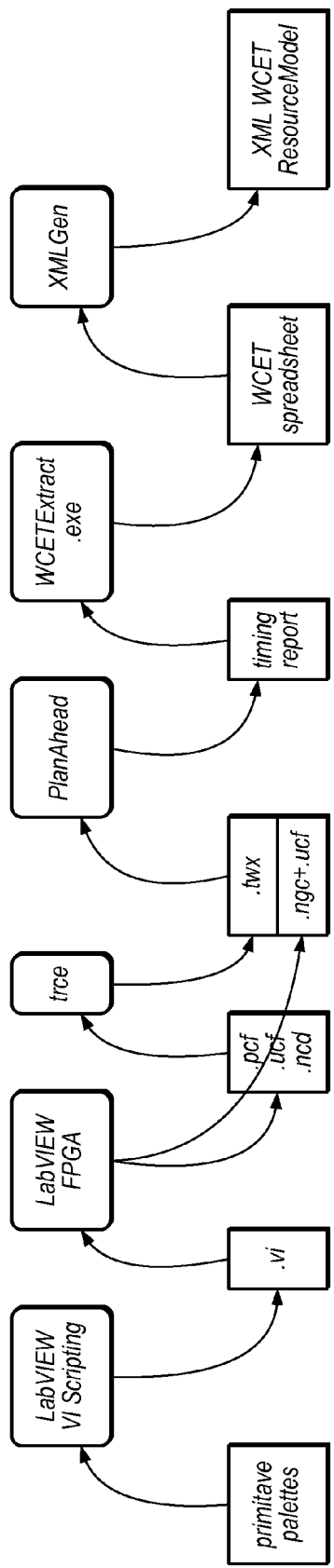
FIG. 26 illustrates an exemplary process flow for populating models or databases with actor characteristic information, according to one embodiment.

FIG. 26 illustrates an exemplary process flow that may be used to populate models or databases in embodiments described above. As shown, LabVIEW VI scripting may generate .vi (graphical programs) using primitive palettes. Lab-VIEW FPGA may generate various files as part of a hardware generation process (including .pcf, .ucf, .ncd; trce, .ngs+.ucf, .twx, etc.). The .twx may be used to generate a timing report (via PlanAhead) which may be used to extract a WCET spreadsheet via an extraction program. XML may be generated from the WCET spreadsheet, which may implement or be included in the XML WCET ResourceModel.

Figure 27:
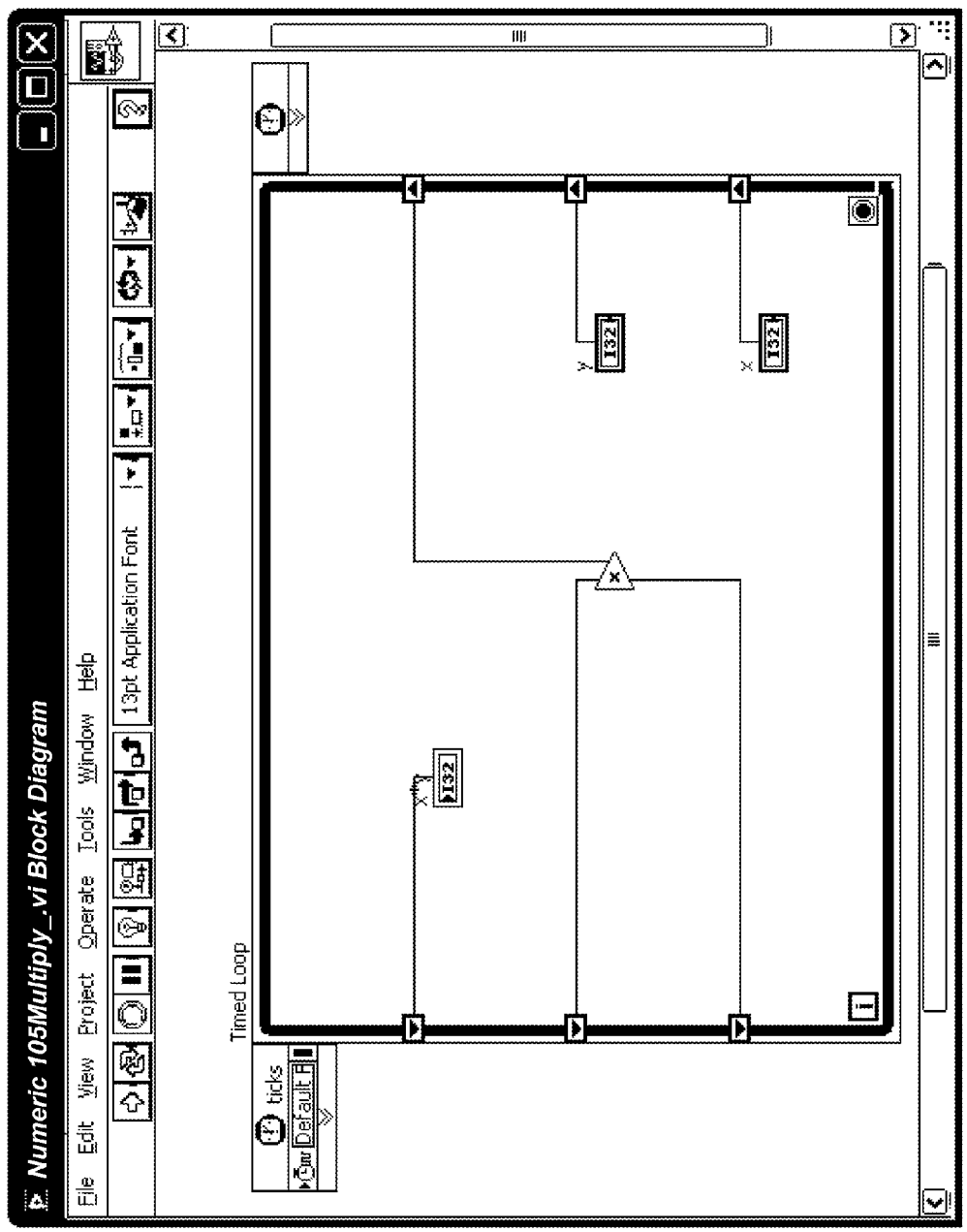
FIG. 27 illustrates an exemplary graphical program used to generate a timing report for a multiply operator, according to one embodiment.

FIG. 27 illustrates an exemplary graphical program that may be used to generate a timing report that may be imported into a third party tool, such as PlanAhead™, provided by Xilinx, Inc. The specific program generates a timing report for a multiplier, but a skilled practitioner can easily extend the program to handle any specified construct.

Figure 28:
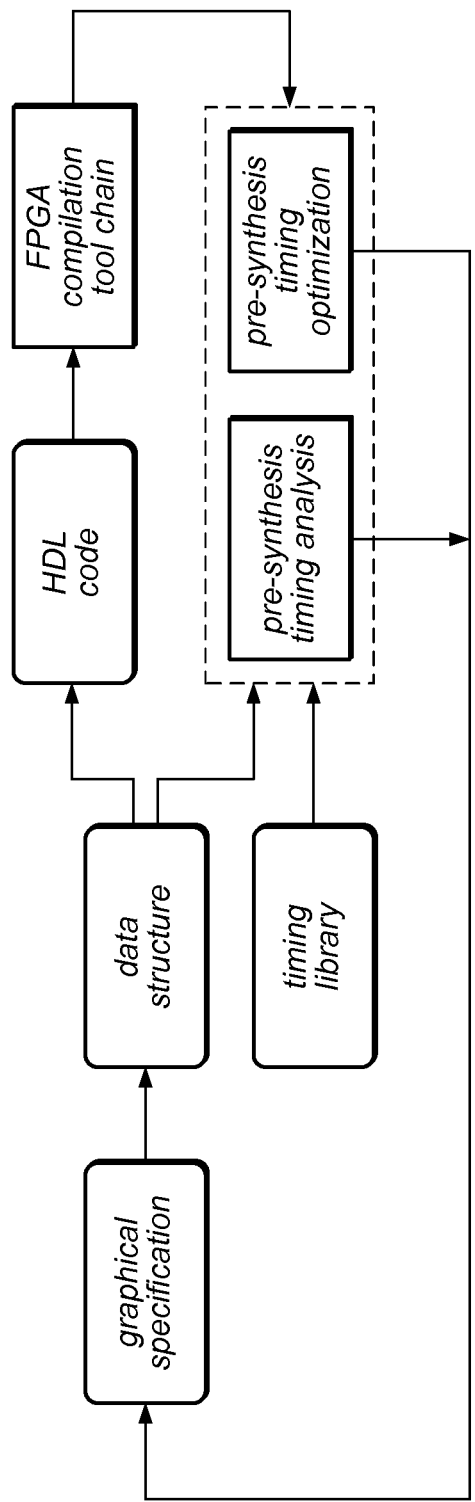
FIG. 28 illustrates an exemplary process flow for converting a graphical specification into a implementation program for an FPGA, according to one embodiment.

FIG. 28 illustrates an exemplary process flow according to one embodiment. As shown, the process may begin with graphical specification, which may be described in a data structure (e.g., the graphical program). The data structure may be analyzed and/or optimized using a timing library, which may be used as feedback into modifying the graphical specification. Additionally, or alternatively, the data structure may be used to generate HDL code, which may be analyzed, and/or optimized, and may return back to the graphical specification for further changes. Note that while this process flow involves timing analysis, similar process flow may apply to performance, resource utilization, etc.

Generation of a Timing Accurate Simulation from a Graphical Program

As noted above, in some embodiments, various of the above techniques may be used to generate a simulation, e.g., a timing accurate simulation (which may include emulation), from a graphical program. In other words, in some embodiments, instead of, or in addition to, the above described generation of a program based on a graphical program (subject to a specified model of computation and specifications or required execution properties), the method may generate a timing accurate simulation of the graphical program. The generated simulation may support or facilitate various debugging capabilities at the level of the model of computation and specifications or required execution properties.

For example, in one embodiment, break points may be provided (i.e., supported by the designer tool or development environment) at the level of the model of computation and specifications or required execution properties. Additionally, the designer tool may provide visualization displays and may capture user or environment input at the level of the model of computation and specifications or required execution properties. As another example, the designer tool may provide or support token flow probes at the level of the model of computation and specifications or required execution properties.

In some embodiments, at least some of the specified model of computation and specifications or required execution properties may be projected onto a lower dimensional space to simplify or increase performance of the timing accurate simulation. Additionally, in one embodiment, the projection may be directed to a specified portion of the graphical program. Moreover, multiple projections may be used, or the dimensionality of the projection may change. For example, the analyzing and generating of the timing accurate simulation may be repeated in an iterative manner, where during the repeating, the dimensionality of the projection may be changed, thereby changing the generated timing accurate simulation.

In one embodiment, the timing accurate simulation may include a first portion generated via projection of the at least some of the specified model of computation and specifications or required execution properties into a lower dimensional space of a first dimensionality, and a second portion generated via projection of the at least some of the specified model of computation and specifications or required execution properties into a lower dimensional space of a second dimensionality.

Thus, for example, the first portion of the timing accurate simulation may include a timing accurate simulation of a first portion of the graphical program, and the second portion comprises a detailed functional simulation of a second portion of the graphical program. In this manner, different portions of the graphical program may be simulated to explore or address different aspects of the design. Moreover, in some embodiments, during the repeating, the first dimensionality of the projection or the second dimensionality may be changed, thereby changing the first or second portions of the timing accurate simulation, respectively. Thus, as the analysis and generation of the simulation are repeated, the focus of the simulation may change, e.g., from a functional simulation to a timing accurate simulation, or vice versa, as desired during the design/exploration process.

The following describes an exemplary embodiment directed to a DSP diagram (or graphical program).

In one exemplary embodiment, the method (or designer tool) may provide the ability to run the DSP diagram in simulation mode from the development environment, e.g., a DSPD (Digital Signal Processing Development) environment. This may involve one or more of the following processes or constructs:

A DSP VI (Virtual Instrument, i.e., graphical program) may be generated for the DSP diagram, which may include creating conditional code constructs implementing functionality required for proper simulation behavior. This functionality may include one or more of the following:

1. updating data probe values on the DSP diagram at runtime;
2. providing simulation data for all input ports (e.g., data and parameter terminals); or
3. flushing output ports to prevent deadlock.

The designer tool may also be configured to reset all data probes. For example, numeric probes may be set to zero and graph probes may be cleared and their default axis ranges restored.

The designer tool may be further configured to switch an associated programmable hardware element (e.g., FPGA) target into emulation mode with simulated I/O. This may be implemented via an FPGA project provider.

The designer tool may be configured to run the DSP VI in response to user input, e.g., when the user clicks a Start button in a GUI of the development environment or designer tool.

Figure 30:
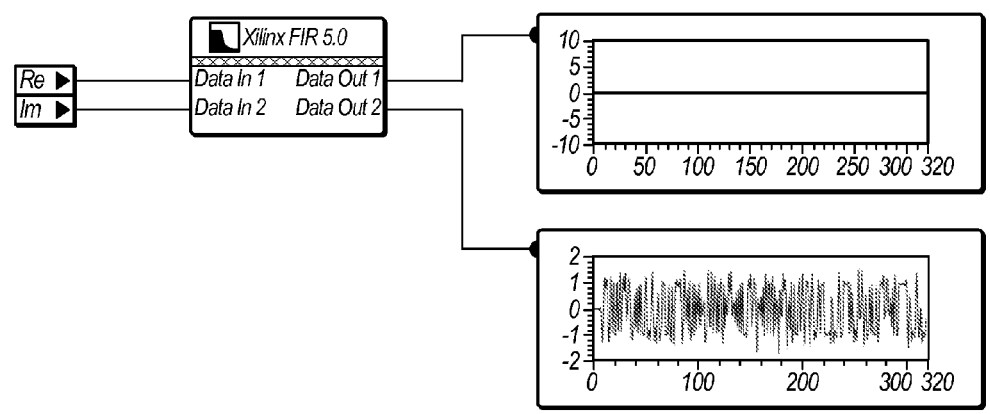
FIG. 30 illustrates a graphical program with input playback/feeding and output capture capabilities, according to one embodiment.

The designer tool may marshal the data probe values back to the DSPD environment for display on the diagram. FIG. 30 illustrates a graphical program with input playback/feeding and output capture capabilities, according to one embodiment. As may be seen, only the central portion of the graphical program is implemented in a targeted device, including the appropriate terminals. During simulation the terminals are fed using either playback from data files or using a specified second graphical program. Similarly the output is capture in simulation mode to a display or a data files The designer tool may abort the simulation in response to user input, e.g., when the user clicks a Stop button in the GUI.

The process of simulating (e.g., emulating) the DSP VI and creating the conditional simulation code may utilize existing features of the development environment. For example, in the context of the LabVIEW graphical development environment, the code to update data probes may use a provided Diagram Disable Structure and the DSP_SIMULATION_ACTIVE conditional symbol to control code emission. A probe ID may uniquely identify the visual data probe to update on the DSP diagram. The value update may be dispatched to the DSPD UI (user interface) thread where it may update asynchronously to the DSP VI being simulated.

In some embodiments, input ports may be simulated using data from a data file, e.g., a CSV (Comma Separated Values) file, or a VI (Virtual Instrument), as configured by the user in the DSPD environment. These data may be injected into input port FIFOs using queues.

A major benefit of this approach is that the same code can be used for DSPD simulation, FPGA compilation, and target-level emulation. This eliminates code generation overhead when switching between operational modes. The conditional simulation code may be designed to have zero impact on the resource utilization of compiled code or the emulation behavior of the DSP VI outside of the DSPD environment, such as when running a test bench.

In further embodiments, the designer tool may provide one or more of the following features and capabilities:

The designer tool may be configured to visually reflect channel buffer status, e.g., free space, full/empty, etc., on the DSP diagram during simulation (e.g., as an annotation on the channel wire).

The designer tool may also support breakpoints on the DSP diagram, and may map them to appropriate, e.g., corresponding, places in the generated code.

The designer tool may provide or support dynamic probes on the DSP diagram that would not persist with standard dsp files, e.g., .lvdsp files provided in the LabVIEW development environment.

The designer tool may provide or support comprehensive profiling of generated code to provide detailed cycle-level behavior, e.g., as an internal diagnostic tool.

The designer tool may provide or support an option to extend all simulation-level behavior to compiled code running on the programmable hardware target, e.g., an FPGA. However, note that this may affect resource usage and/or quality of results (QoR).

The designer tool may provide or support integration of simulation/debugging capabilities with a schedule view, which may require the schedule view to accurately reflect execution behavior.

Thus, embodiments of the designer tool (or development environment) may provide a powerful set of debugging capabilities.

It should be noted that any of the features and techniques described herein may be used in any combinations as desired.

Figure 31:
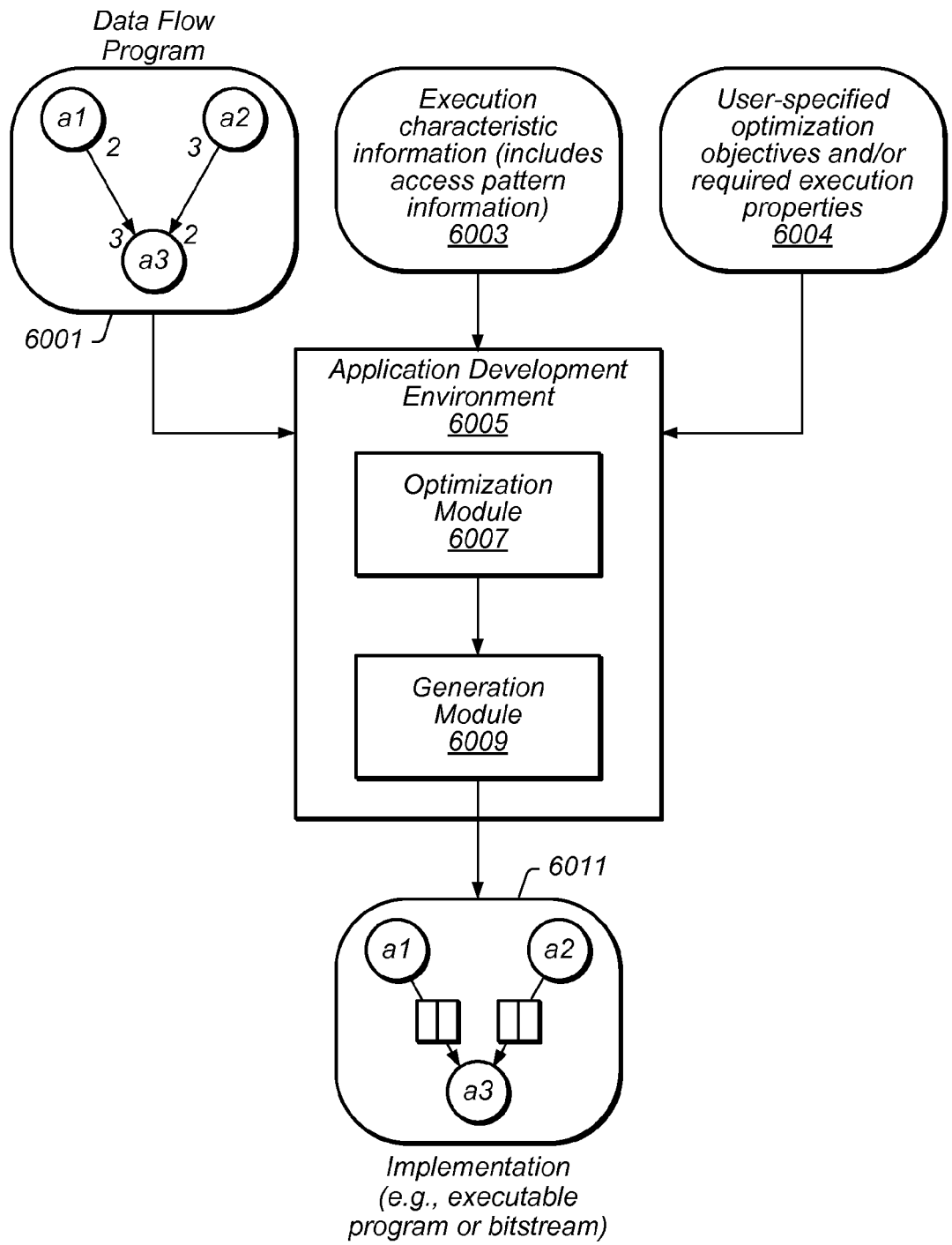
FIG. 31 illustrates a high level view of generating an implementation of a data flow program, according to one embodiment.

FIG. 31 illustrates the general operation of generating an implementation of a data flow program 6001 according to some embodiments. The functionality described with respect to FIG. 31 may be performed by an application development environment 6005 which is executed by a computer system.

The application development environment may receive a data flow program 6001 as input. In some embodiments the data flow program 6001 may be in the form of a diagram in which the actors are represented as nodes, and the data flow connections among the actors are represented as edges or arrows between the nodes. For example, the application development environment may include a diagram editor which enables a user to create new actors or select previously created actors and add data flow connections to indicate the desired data flow among the actors. The diagram may be displayed in the diagram editor and may visually indicate the functionality of the data flow program. FIG. 31 illustrates a simple example of a data flow program diagram that has three actors: a1, a2, and a3, where a1 and a2 both act as producer nodes that produce output tokens consumed by a3. (In a typical real-world example the actors may be shown with more descriptive names or icons to better illustrate the functionality of the program.)

In other embodiments the data flow program 6001 may be represented in other ways besides a diagram such as shown in FIG. 31. In general, the data flow program may be specified in any textual and/or graphical format that specifies the actors in the program and the data flow connections among the actors.

Each actor may be configured to perform any of various kinds of functions or operations that consume zero or more input tokens and/or produce zero or more output tokens. In various embodiments the input or output tokens for each actor may be values of any kind of data type, such as simple data types (e.g., integers, floating point numbers, etc.), or more complex data types such as arrays, structures, etc.

The functionality of each actor may be described in any of various ways, e.g., using various kinds of programming languages, program code, hardware configuration code, etc. In some embodiments the user may manually create or specify the functionality for the actors, e.g., by creating source code that defines the functions performed by the actors. In other embodiments the user may select pre-created actors that have pre-configured functionality. For example, the user may include IP (Intellectual Property) blocks or other components created by a third party as actors in the data flow program.

Along with the data flow program 6001, the application development environment may also receive execution characteristic information 6003 as input. As discussed above, the execution characteristic information 6003 may include access pattern information for one or more of the actors in the data flow program 6001, as well as other information such as execution times and initiation intervals for one or more of the actors.

The application development environment may also receive user input specifying one or more optimization objectives or goals and/or one or more required execution properties 6004 which the user wants to be applied by the application development environment in generating the implementation of the data flow program. In various embodiments the application development environment may enable the user to specify objectives for optimizing any of various aspects of the data flow program's execution behavior or resource usage.

For example, in some embodiments the user may be able to request that the throughput of the data flow program be maximized. In generating the implementation of the data flow program, the application development environment may use the execution characteristic information (and in particular the access pattern information) to determine an execution schedule that maximizes the throughput of the data flow program.

As another example, in some embodiments the user may be able to request that the latency of the data flow program be minimized. In generating the implementation of the data flow program, the application development environment may use the execution characteristic information (and in particular the access pattern information) to determine an execution schedule that minimizes the latency of the data flow program.

As another example, in some embodiments the user may be able to request that the total buffer size of the data flow program be minimized. In generating the implementation of the data flow program, the application development environment may use the execution characteristic information (and in particular the access pattern information) to determine an execution schedule that minimizes the total buffer size used by all the channels in the data flow program. The user may also be able to request that the usage of various other kinds of resources be minimized.

In addition to the optimization objective(s), in some embodiments the user may also specify one or more required execution properties to be applied. In various embodiments the user may be able to specify required execution properties regarding any of various aspects of the data flow program's execution behavior or resource usage. For example, the user may specify desired lower and/or upper bounds for the data flow program implementation, such as its latency, throughput, etc. As another example, the user may specify desired lower and/or upper bounds for the buffer sizes used by the data flow program implementation or the use of various other resources.

As shown in FIG. 31, the application development environment 6005 may include an optimization module 6007 and a generation module 6009. The optimization module may receive the input described above and may perform various kinds of optimization techniques such as described below which analyze the input and determine information for generating an implementation of the data flow program that meets the user's specified objective(s), such as a particular execution schedule, the size of the buffer for each channel, etc. The generation module 6009 may use the information determined by the optimization module 6007 to generate the implementation of the data flow program, e.g., to generate an implementation 6011 that will operate according to the particular schedule and that uses the buffer sizes determined by the optimization module. The implementation 6011 may include executable program instructions for a software implementation and/or hardware configuration information for a hardware implementation, e.g., depending on the target platform. In some embodiments the user may be able to select whether to generate a software and/or a hardware implementation.

Figure 32:
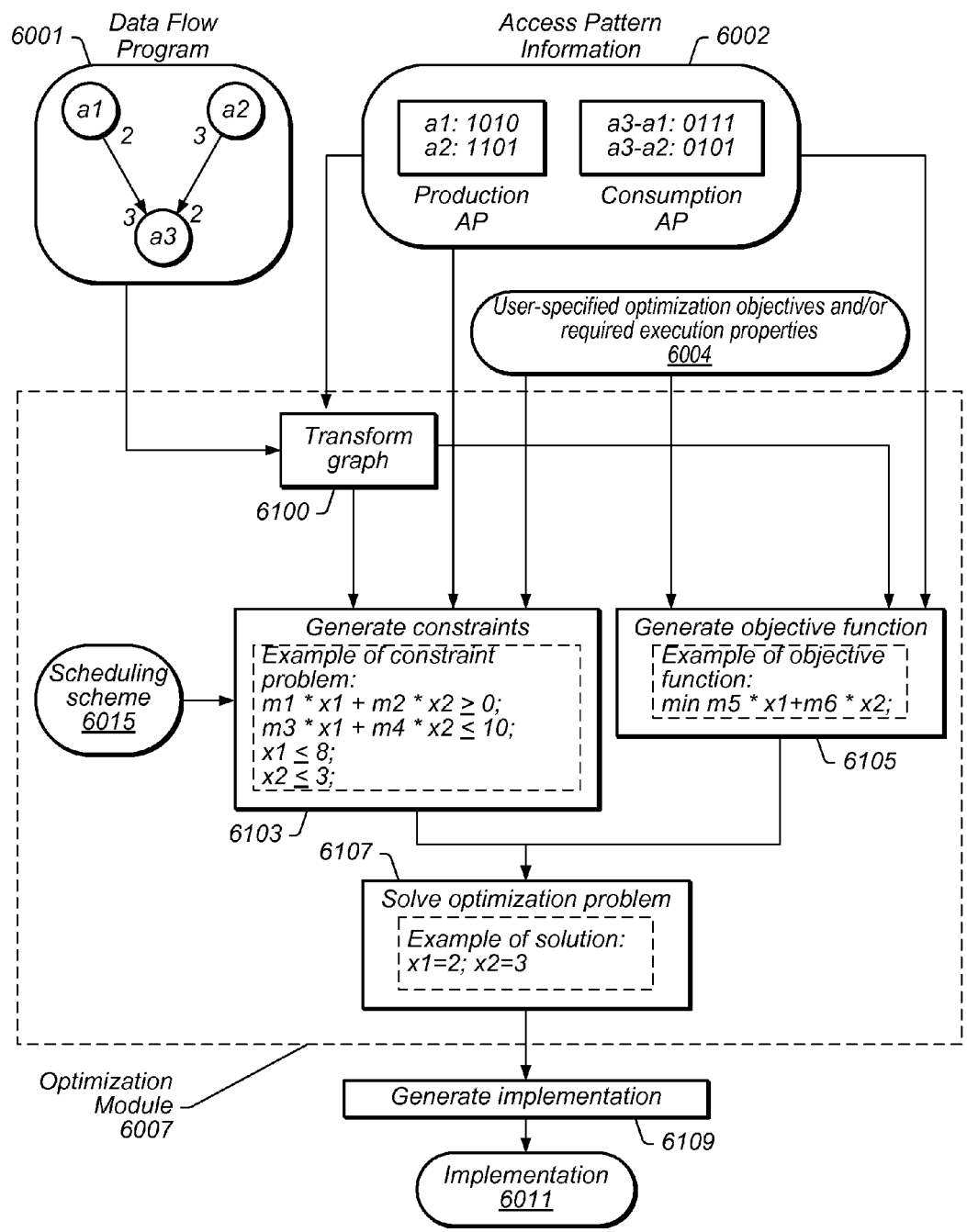
FIG. 32 illustrates operation of an exemplary optimization module with an example data flow program, example access pattern information, and detailed internals, according to one embodiment.

FIG. 32 illustrates the operation of the optimization module 6007 according to some embodiments. In this example, the output count of the actor a1 is shown in the data flow diagram 6001 as 2, indicating that the actor a1 produces 2 output tokens each time it executes. The output count of the actor a2 is shown in the data flow diagram 6001 as 3, indicating that the actor a2 produces 3 output tokens each time it executes. The input count of the actor a3 with respect to the tokens produced by the actor a1 is 3, indicating that the actor a3 consumes 3 of these tokens each time it executes. Similarly, the input count of the actor a3 with respect to the tokens produced by the actor a2 is 2, indicating that the actor a3 consumes 2 of these tokens each time it executes.

FIG. 32 also shows an example of access pattern information 6002 which is received as input by the optimization module 6007, and which indicates the timing of the production and consumption of the tokens in more detail. In this example, each of the actors has an execution time of four cycles. Each time the actor a1 fires, it produces its first token on the first cycle of the execution and its second token on the third cycle of the execution. Each time the actor a2 fires, it produces its first token on the first cycle of the execution, its second token on the second cycle of the execution, and its third token on the fourth cycle of the execution. Each time the actor a3 fires, it consumes its first token from the actor a1 on the second cycle of the execution, its second token from the actor a1 on the third cycle of the execution, and its third token from the actor a1 on the fourth cycle of the execution; similarly, it consumes its first token from the actor a2 on the second cycle of the execution, and its second token from the actor a2 on the fourth cycle of the execution.

As discussed above, the data flow program can be considered as a directed graph with nodes corresponding to the actors, and edges representing the data flow channels. As indicated in block 6100, in some embodiments the optimization module may transform the data flow program graph, e.g., in order to simplify the graph to make it easier to determine the optimized implementation. In various embodiments the optimization module may use various algorithms to simply the graph. For example, if the graph includes symmetrical or identical portions then the duplicate portions may be temporarily removed from the graph for analysis.

After optionally simplifying the data flow program graph, the optimization module may determine the optimization information to be used by the generation module in generating the implementation of the data flow program. The optimization information may be determined by formulating and solving an optimization problem. In some embodiments, formulating the optimization problem may include automatically generating or formulating a mathematical objective function (also referred to as a cost function) as shown in block 6105, and a set of mathematical constraints to which the objective function is subject as shown in block 6103. The objective function may include a mathematical expression to be minimized and/or maximized. More particularly, the expression may include one or more variables, and the optimization module may attempt to find values for the variables which minimize or maximize the expression, while respecting the set of constraints. In some embodiments the solution may be found by invoking a solver tool that takes the generated objective function and set of constraints as input and uses mathematical analysis to solve the problem (block 6107), e.g., by determining variable values that minimize or maximize the expression in the objective function.

For example, in FIG. 32 the generated objective function is to minimize the expression "m5*x1+m6*×2". An example set of constraints (e.g., "m1*x1+m2*×2>=0", etc.) is generated. Notice that m5, m6, m1, and m2 are constants while x1 and x2 are variables. The objective function and set of constraints are passed to a solver tool, and the solver tool executes on a computer system to determine that the objective function is minimized by using a value of 2 for the variable x1 and a value of 3 for the variable x2. The optimization module may then communicate with the generation module to inform the generation module that these are the values to be used for the variables x1 and x2 in generating the implementation of the data flow program (block 6109).

The objective function and the set of constraints generated by the optimization module may depend on the user-specified optimization objectives/constraints and the access pattern information and other execution characteristic information received as input. Examples of objective functions and constraints for achieving various kinds of optimization objectives and methods for generating them are described below.

In some embodiments the application development environment may be able to use different types of scheduling schemes for the implementation of the data flow program, and the objective function and the set of constraints generated by the optimization module may also depend on which scheduling scheme is used, as indicated in block 6015. Examples of scheduling schemes that can be used include regular periodic scheduling, regular 1-periodic scheduling, and r-periodic scheduling, among others.

Generalizing the exemplary technique illustrated in FIG. 32, in some embodiments the method may receive access pattern information for a data flow diagram, where the data flow diagram includes a plurality of interconnected actors visually indicating functionality of the data flow diagram, where the access pattern information includes one or more of: a) input pattern information specifying the time at which tokens are consumed by at least one of the actors, or b) output pattern information specifying the time at which tokens are produced by at least one of the actors. A program may then be generated that implements the functionality of the data flow diagram based at least in part on the access pattern information. In some embodiments, each actor may be, include, or be implemented by, a respective functional block. Thus, the data flow diagram may include a plurality of interconnected functional blocks.

The techniques disclosed herein may be applied not only to graphical programs and data flow diagrams, but to data flow specifications, as well. Thus, following the above, the method may include receiving access pattern information for a data flow specification, where the data flow specification specifies a plurality of functional actors (or simply actors) that perform functionality according to a data flow model of computation, and where, similar to the above, the access pattern information includes one or more of: a) input pattern information specifying the time at which tokens are consumed by at least one of the functional actors, or b) output pattern information specifying the time at which tokens are produced by at least one of the functional actors. A(n implementation) program may be generated that implements the functionality based on the data flow specification and the access pattern information In various embodiments, the access pattern information may have any of a variety of forms and functions. For example, in some embodiments, the access pattern information includes input pattern information specifying the time at which tokens are consumed by a plurality of the actors. In one embodiment, the input pattern information for an actor includes information indicating when the actor's input tokens are consumed relative to the beginning of the at least one actor's execution. In one embodiment, the input pattern information specifies the particular time at which input tokens are consumed by the actor. In another embodiment, the input pattern information includes a plurality of values, where each of the values corresponds to one of the cycles during the execution of the actor and specifies the number of tokens consumed by the actor on that cycle.

Similarly, in some embodiments, the access pattern information includes output pattern information specifying the time at which tokens are produced by a plurality of the actors. The output pattern information for an actor may include information indicating when the actor's output tokens are produced relative to the beginning of the at least one actor's execution. In another embodiment, the output pattern information specifies the particular the time at which output tokens are produced by the actor. In one embodiment, the output pattern information includes a plurality of values, where each of the values corresponds to one of the cycles during the execution of the actor and specifies the number of tokens produced by the actor on that cycle.

Thus, the token production/consumption times may be in relative or absolute terms, as desired.

The generation of the (implementation) program may also be performed in any of a variety of ways. For example, in one embodiment, the data flow diagram may be converted into an intermediate representation, and generating the program may include generating the program from the intermediate representation.

As another example, input specifying additional information for the data flow diagram may be received. The additional information may include one or more of: one or more execution times for one or more of the actors (e.g., functional blocks), or one or more initiation intervals for one or more of the actors. Generating the program may be further based on the additional information.

Moreover, in some embodiments, a hardware device, e.g., a programmable hardware element, may be configured according to the generated program. For example, in one embodiment, the generated program may be used to generate a hardware configuration program, which may then be used to configure the programmable hardware element.

As mentioned above, embodiments of the techniques disclosed herein may operate to optimize the implementation of the data flow diagram. Thus, generating the program comprises optimizing one or more features of the program based at least in part on the access pattern information. In one embodiment, user input specifying the one or more features of the program to be optimized may be received, and the generated (implementation) program may be optimized accordingly. For example, the one or more features of the program to be optimized may include one or more of: buffer size, throughput, or latency, among others.

As indicated above, optimizing the one or more features of the program may include optimizing one or more of the following based at least in part on the access pattern information: throughput of terminals on the actors (e.g., functional blocks), throughput of the program, clock rate of the program, a size of a buffer between actors, or latency between actor inputs and corresponding actor outputs. The optimization may include automatically formulating an objective function based on the one or more features of the program to be optimized, automatically generating one or more constraints for the objective function based at least in part on the access pattern information, applying a solver to the objective function to find at least one minimum value or maximum value that at least one variable of the objective function can take on, subject to the one or more constraints, and configuring the program according to the at least one minimum value or maximum value, where the configuring optimizes the one or more features of the program. Various approaches to this optimization process are described below with respect to FIGS. 33-61.

Figure 33:
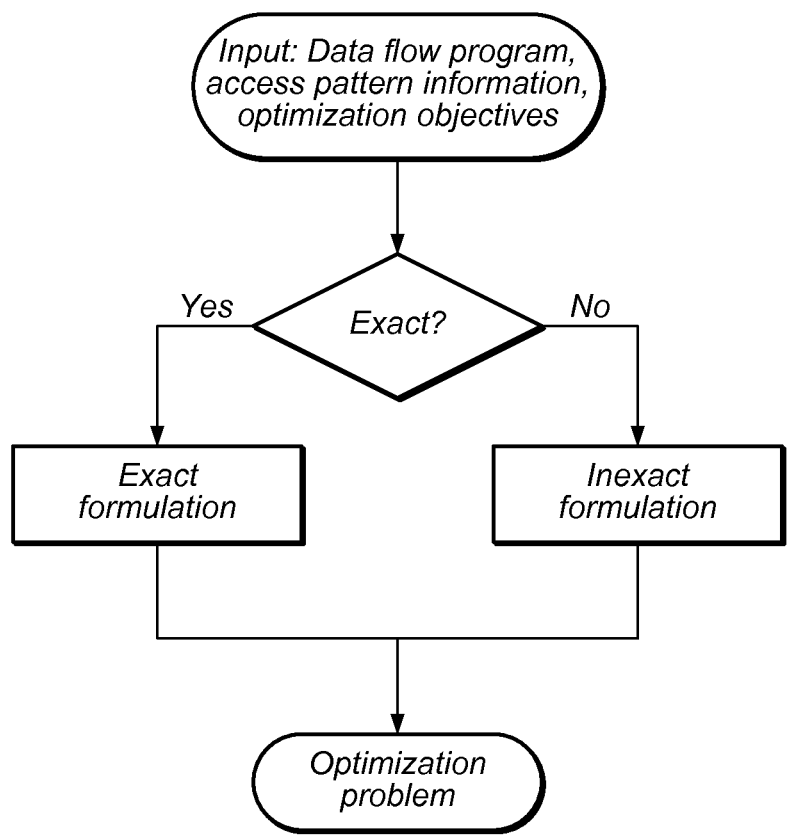
FIG. 33 illustrates exemplary formulation of an optimization problem using an exact or an inexact formulation, according to some embodiments.

FIG. 33 illustrates that the optimization problem can be formulated exactly or inexactly, i.e., approximately. The optimization module receives input, such as the data flow program, the access pattern information and other execution characteristic information for the data flow program, and the user's desired optimization objectives. The optimization module determines whether to use an exact or an inexact formulation for the optimization problem. The determination as to which method to use may depend on a user-configurable option, and/or on knowledge or heuristics built into the optimization module. Different optimization methods can be applied to the overall data flow program and to sub-programs of the data flow program.

The exact and inexact formulations each have pros and cons. For example, an exact formulation may be able to achieve the best result, but may take longer to solve. An inexact formulation may be able to achieve some optimization, but may not achieve a result as good as that produced by an exact approach.

One example of an inexact formulation is that some of the access pattern information can be ignored in formulating the optimization problem. With the access pattern information, the optimization module has detailed information about how the actors execute. In some embodiments the optimization module may choose not to make the solution based on all of that information, but may just use part of the access pattern information. If not all of the access pattern information is used, this may allow the optimization module to get a solution faster, but the resulting solution may not be as good as one obtained if the complete set of information were used.

Another example of an inexact formulation is to relax the solving step by using an inexact solution mechanism. For example, the optimization module may make an assumption about the solution and then try to see whether the assumption is good or not. The solution can then be improved iteratively.

Figure 34:
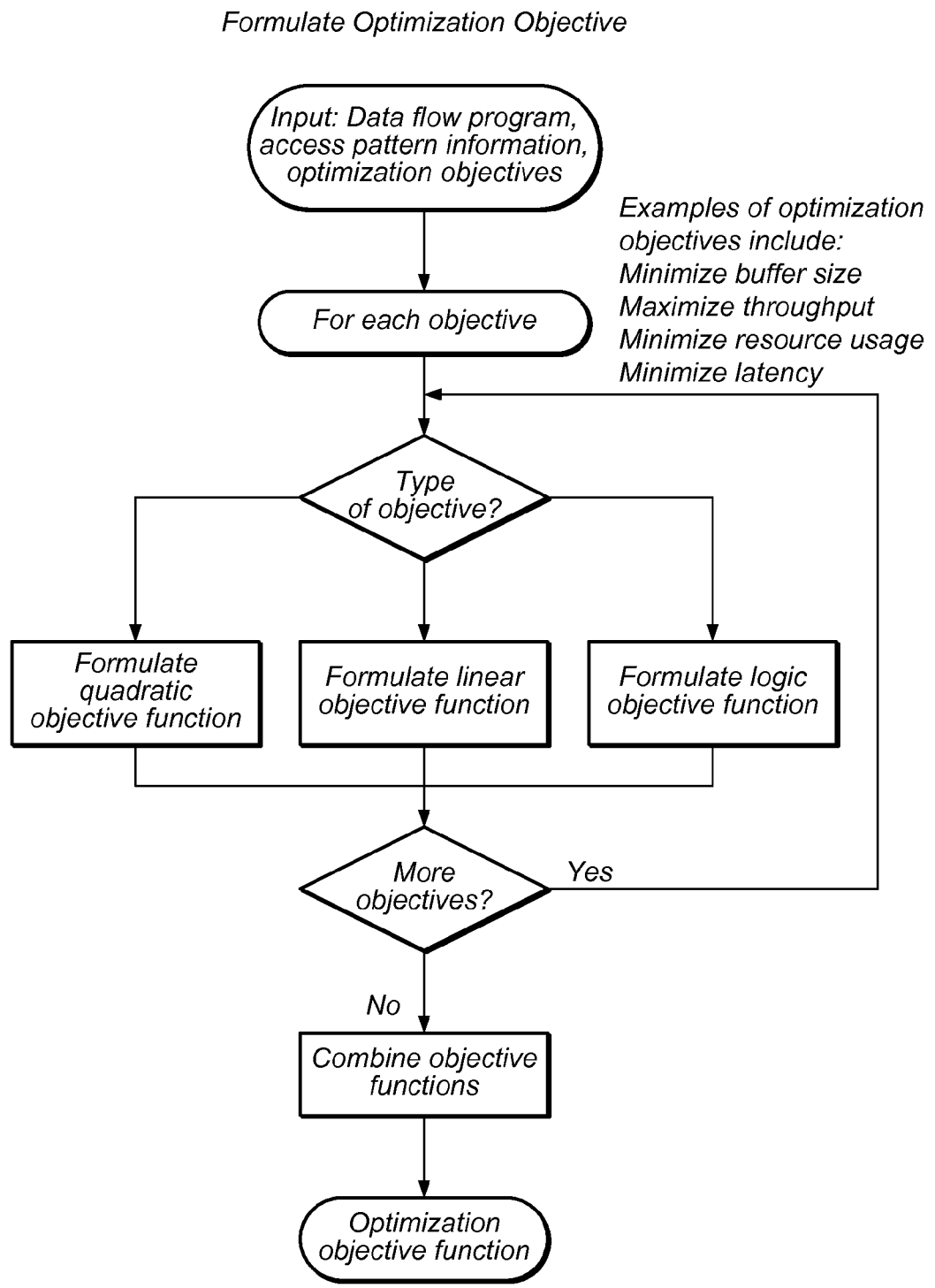
FIG. 34 illustrates exemplary formulation of an optimization objective function, according to one embodiment.

FIG. 34 illustrates that different types of objective functions may be formulated in various embodiments. The optimization module receives input, such as the data flow program, the access pattern information and other execution characteristic information for the data flow program, and the user's desired optimization objectives. For each of the user-specified optimization objectives, the optimization module may determine the type of objective. The optimization module may then generate an appropriate type of objective function for that type of objective, such as a quadratic objective function, linear objective function, or logic objective function. For example, if the objective is to minimize the buffer size then a linear objective function may be generated. In other embodiments, any of various other kinds of objective functions besides quadratic, linear, or logic objective functions may be formulated. After the individual objective functions for each of the user's objectives have been formulated, they may be combined into a single objective function that will be optimized during the optimization process.

Figure 35:
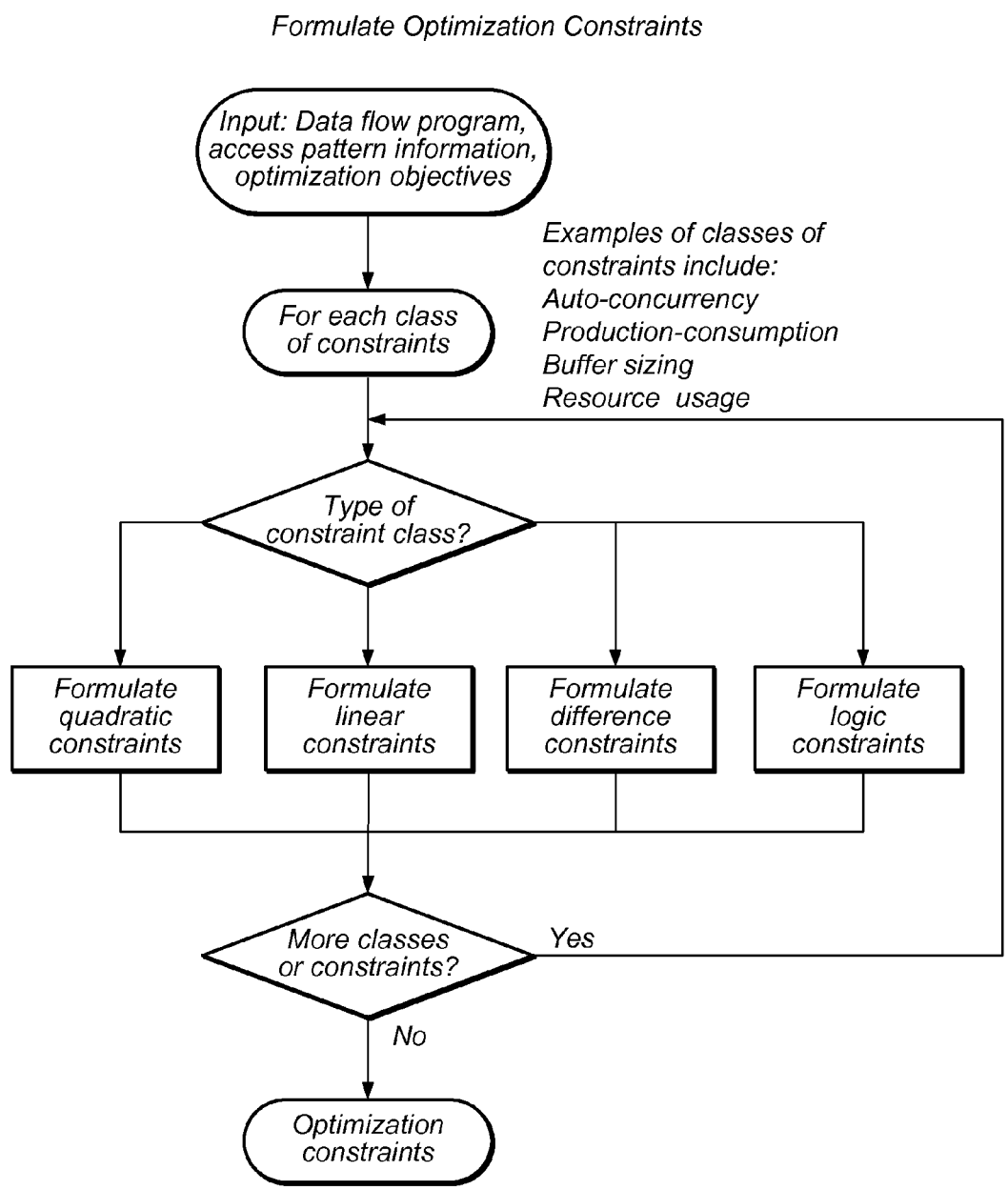
FIG. 35 illustrates exemplary formulation of optimization constraints, according to one embodiment.

FIG. 35 illustrates that different types of optimization constraints may be formulated in various embodiments. The optimization module receives input, such as the data flow program, the access pattern information and other execution characteristic information for the data flow program, and the user's desired optimization objectives. The optimization module may determine one or more classes of constraints that need to be generated based on the desired optimization objectives. For each of these classes of constraints, the optimization module may determine the type of constraint class and then generate an appropriate set of constraints for that class. The optimization module may generate different types of constraints, such as quadratic constraints, linear constraints, difference constraints, or logic constraints. In other embodiments, any of various other kinds of optimization constraints may be formulated. What is eventually obtained is a set of constraints that need to be respected when solving the objective function.

Examples of constraint classes include: auto-concurrency constraints, producer-consumer precedence constraints, buffer size constraints, and resource usage constraints, among others. These classes are described below. Examples of methods for generating the constraints, including the use of access pattern information in their generation, are also described below.

Figure 36:
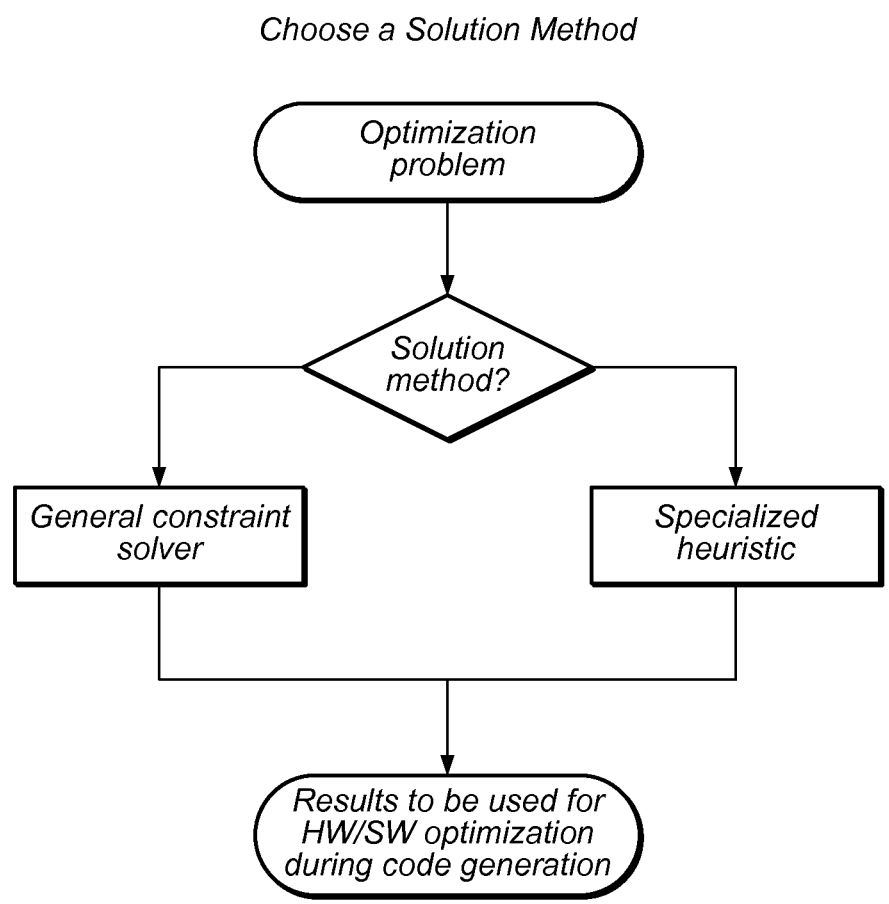
FIG. 36 illustrates selection of a solution method for an optimization problem, according to one embodiment.

FIG. 36 illustrates some kinds of solver tools that can be used to solve the optimization problem (objective function plus the set of optimization constraints), such as a general constraint solver, or a tool that implements a specialized heuristic, in some embodiments. In other embodiments, any of various other kinds of solvers may be used. The obtained optimization results may be used during code generation of the designed hardware/software.

Figure 37:
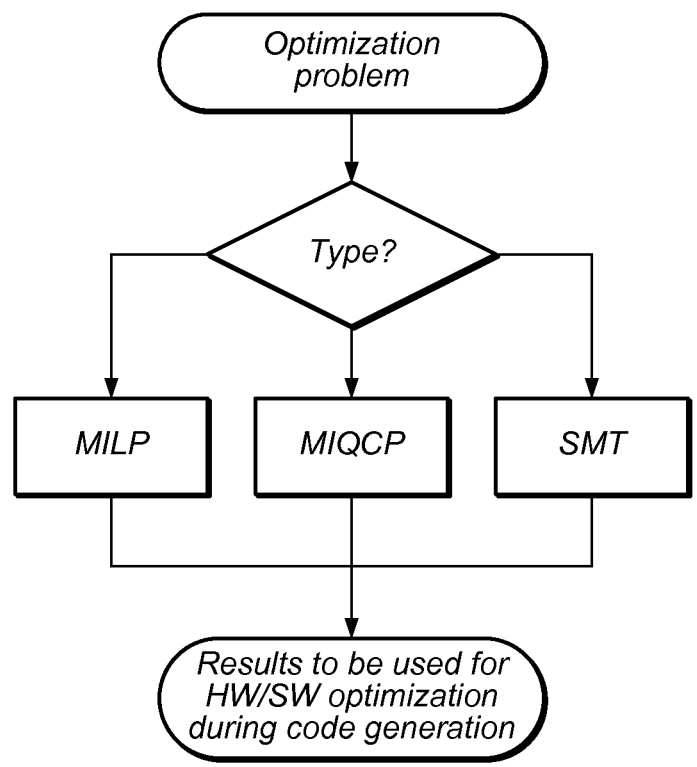
FIG. 37 illustrates solving of an optimization problem using any of a variety of general constraint solvers, according to one embodiment.

FIG. 37 illustrates some of the general constraint solver tools that may be used to solve the optimization problem described in FIG. 36 in some embodiments. The selection of which type of solver tool to use may depend on the particular optimization problem that was generated. Examples of general constraint solver tools include: mixed integer linear programming (MILP) solvers, mixed integer quadratic constraint programming (MIQCP) solvers, SMT solvers, etc. In other embodiments, any of various other kinds of appropriate general constraint solvers may be used.

The optimization module may generate a graph from the data flow program, e.g., where the actors are represented as nodes in the graph, and the data flow connections between the actors are represented as edges between the nodes in the graph. The resulting graph is represented by the notation SDF-AP G=(A,C), which refers to a static data flow (SDF) program augmented with access pattern (AP) information, which is represented as a graph G having nodes representing a set of actors A and edges representing a set of data flow channels C between the actors. Note that the term GSDF-AP G=(A,C), refers to a graphical static data flow (GSDF) program, to which the techniques presented herein may also be applied.

Figure 38:
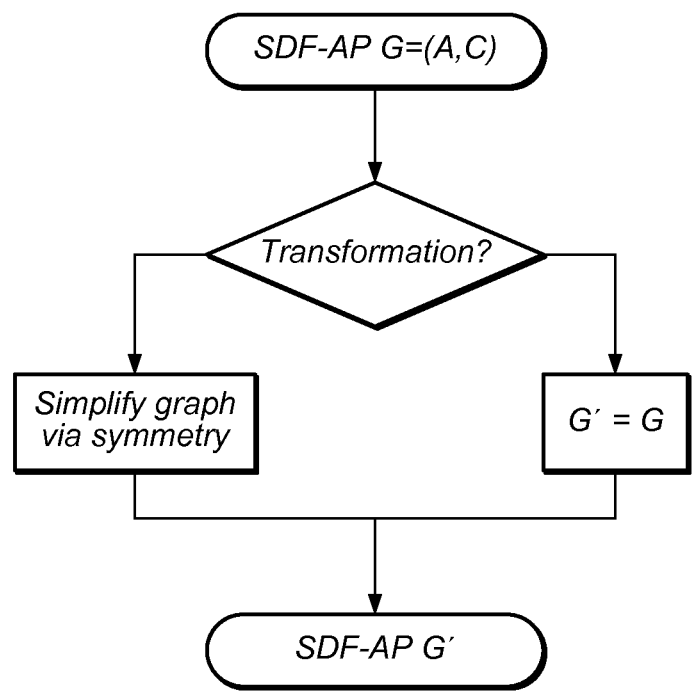
FIG. 38 illustrates use of a graph transformation (in this embodiment, simplification via symmetry) to simplify an optimization problem, according to one embodiment.

FIG. 38 expands item 6100 in FIG. 32 to illustrate some of the graph transformations that may be used to simplify or modify that graph, e.g. symmetry, as indicated by the block labeled "Simply graph via symmetry", or other graph modification scheme, e.g., hierarchical graph partitioning. Other embodiments may use other transformations, and the transformations may be performed multiple times in any order.

Figure 39:
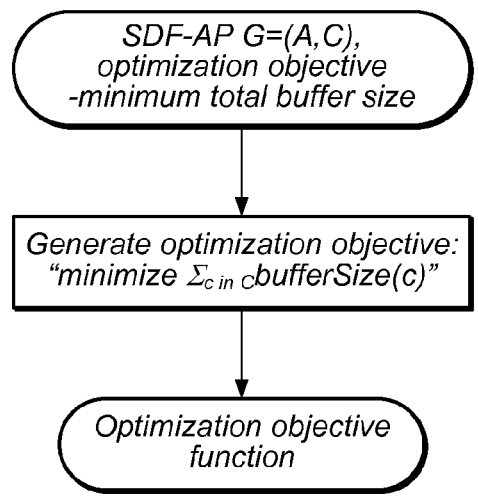
FIG. 39 illustrates optimization of total buffer size by generating an optimization objective function, according to one embodiment.

In various embodiments, the optimization module may operate to optimize any of various features or aspects of the program to be generated from the data flow diagram, e.g., depending on which features the user requests to be optimized. As one example, the user may request that the total buffer size used by the program be optimized (minimized), e.g., so that the total size of all the buffers used to transmit data between the various actors (e.g., functional blocks) is as small as possible while still enabling the program to function correctly. FIG. 39 illustrates that in some embodiments the total buffer size may be optimized by generating a linear optimization objective function based on a summation of all the channel buffer sizes: "$\Sigma_{c\ in\ C}$bufferSize(c)", as shown. The linear optimization objective function may be solved to minimize the total buffer size of the program. In an alternative embodiment, a weight (cost of per token through channel) associated with each channel may be included in the optimization objective function generation. Note that depending on tokens, the weights may be different from channel to channel.

Figure 40:
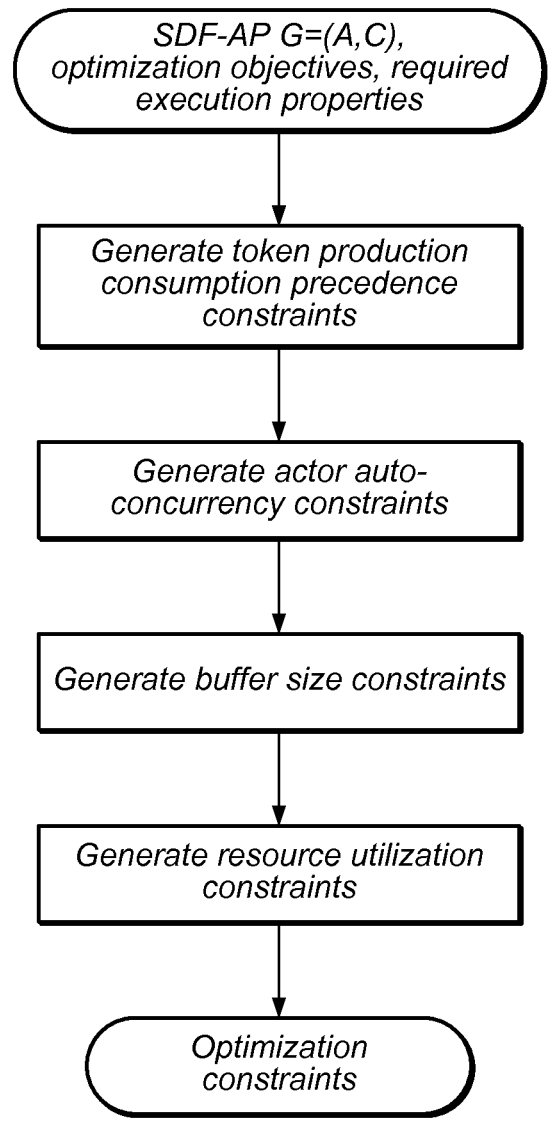
FIG. 40 illustrates exemplary generation of optimization constraints, according to one embodiment.

In various embodiments, any of various kinds of constraints may be automatically generated by the optimization module, e.g., to enable any of various kinds of features of the program to be optimized. FIG. 40 illustrates an exemplary method for generating optimization constraints in response to input, e.g., an SDF graph including access patterns, optimization objectives, and required execution properties. As shown in FIG. 40, examples of classes of constraints that may be generated include producer-consumer precedence constraints, auto-concurrency constraints, buffer sizing constraints, and resource utilization constraints, among others. These constraint classes are described below. Thus, automatically generating the one or more constraints for the objective function may include automatically generating one or more of: at least one producer-consumer constraint, at least one auto-concurrency constraint, at least one buffer size constraint, or at least one resource utilization constraint, among others. In some embodiments, automatically generating the one or more constraints for the objective function may include automatically generating one or more of: a linear constraint, a quadratic constraint, a difference constraint, or a propositional logic constraint, among others.

The determination of which classes of constraints to generate depends on the objective(s) specified by the user. For example, if the objective is to maximize throughput, the optimization module may generate producer-consumer precedence constraints and auto-concurrency constraints, but does not need to generate buffer sizing constraints (assume unlimited resources). Notice that the constraint generation order shown in FIG. 40 is only for exemplary purposes. In practice, the different sets of constraints can be generated in a different order, including in parallel. The whole set of constraints generated needs to be respected during optimization performed by a solver.

Figure 41:
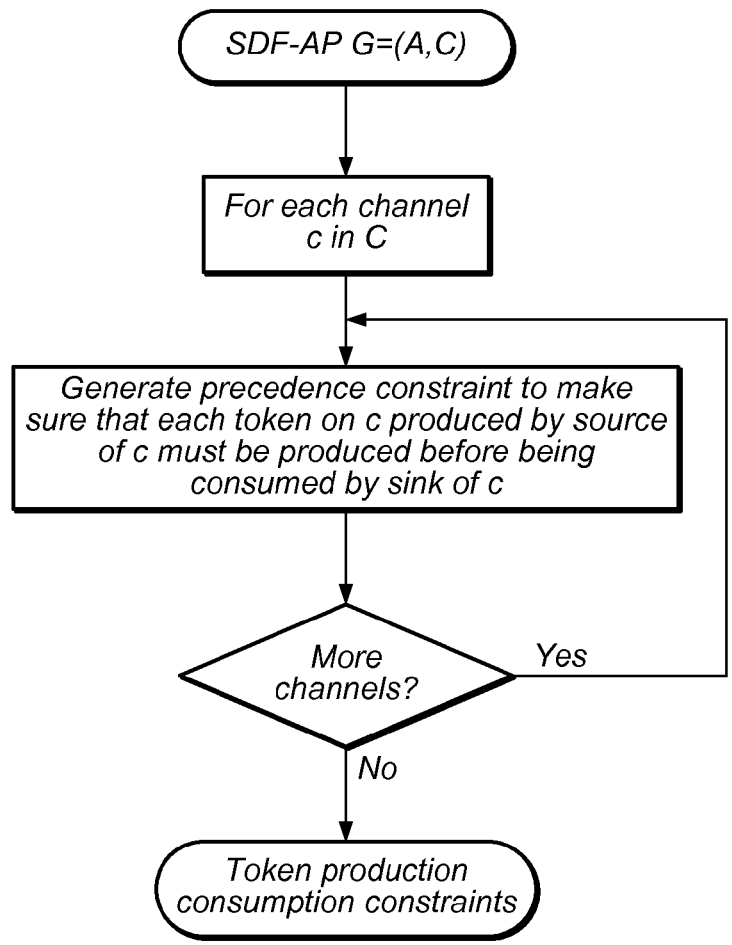
FIG. 41 illustrates a high level method for generating token producer-consumer precedence constraints, according to one embodiment.
Figure 42:
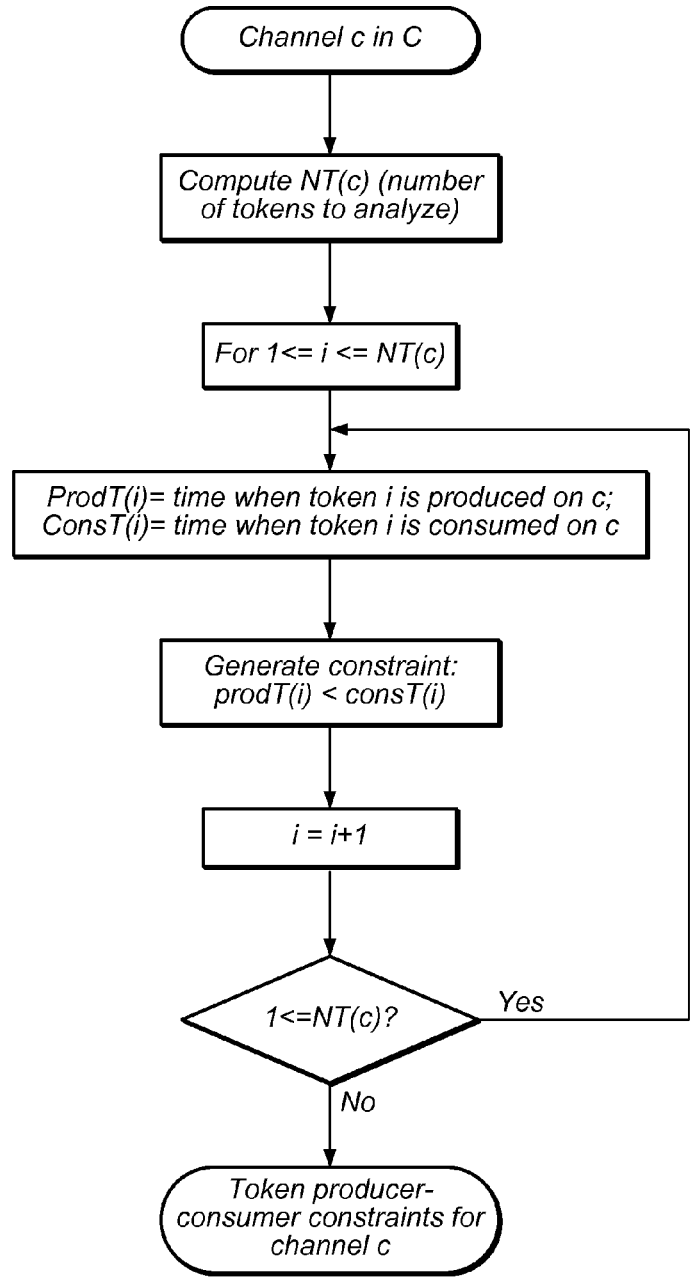
FIG. 42 illustrates a slightly more detailed method for generating producer-consumer constraints, according to one embodiment.

FIGS. 41 and 42 illustrate high level concepts of generating the producer-consumer constraints of FIG. 40. More specifically, FIG. 41 illustrates one embodiment of a method for generating producer-consumer precedence constraints of the method of FIG. 40. Producer-consumer precedence constraints may be used to specify that tokens must be produced before they can be consumed. This may define the semantics of data flow, and thus the optimization module may generate a set of producer-consumer precedence constraints regardless of which optimization objective the user specified. As FIG. 41 shows, for each channel c between a source block and a sink block, a precedence constraint may be generated to ensure that each token on c must be produced by the source block of c before being consumed by the sink block of c.

FIG. 42 illustrates a more detailed method for generating the producer-consumer constraint for a channel as per FIG. 41, according to some embodiments. For each channel c, generating the producer-consumer constraints for the channel c may include computing the number of tokens to be analyzed on channel c (denoted as NT(c)), determining the production and consumption times of each of the tokens, and generating a precedence constraint to ensure that the production time for each token on the channel c is less than its corresponding consumption time, e.g., prodT(i)<consT(i).

Figure 43:
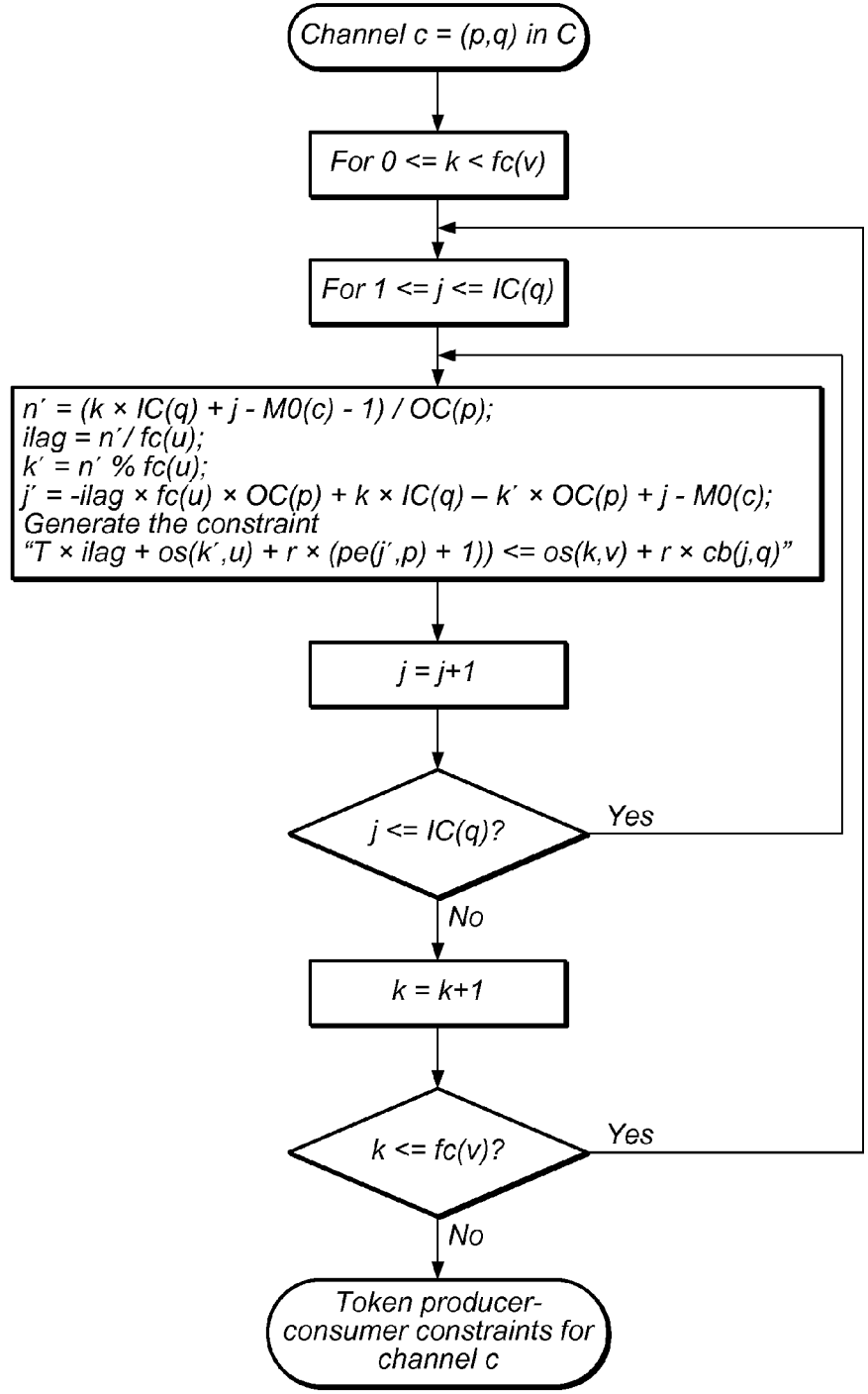
FIG. 43 illustrates a detailed example of a method for generating token producer-consumer constraints, according to one embodiment.

FIG. 43 illustrates a more detailed example of the producer-consumer constraint for a channel c of FIG. 41, according to one embodiment. This method uses the access pattern information for the data flow program, which enables a more detailed set of precedence constraints to be generated than would be possible without such information. Note that this embodiment of the method is based on an r-periodic scheduling scheme with r and T being the schedule iteration periodicity and schedule iteration period, respectively.

In generating a producer-consumer precedence constraint, the optimization module may generate a linear or difference constraint based on r-periodic scheduling with schedule iteration periodicity r and schedule iteration period T, where, given firing count vector (denoted by fc) for all actors, for channel c=(p,q), for each token consumed by the sink of c from terminal q in one iteration, the optimization module computes the corresponding token production (i.e. which token production (j') of which firing (k') of the source of c and the iteration difference (ilag)), and generates a constraint to ensure that the firings of the source and sink actor of c are scheduled in such a way that the consumption of the said tokens occurs after their respective productions, as indicated by the exemplary constraint related relationships shown: "n'= (k×IC(q)+j−M0(c)−1)/OC(p); ilag=n'/fc(u); k'=n' % fc(u); j'=−ilag×fc(u)×OC(p)+k×IC(q)−k'−OC(p)+j−M0(c); and the generated constraint: "T×ilag+os(k',u)+r×(pe(j',p)+1))<=os (k,v)+r×cb(j,q)". Note that os(k,a) represents the schedule offset of the $k^{th}$ instance of actor a in one iteration; pe(j',p) represents the production ending time of the $j^{th}$ token on terminal p; cb(j,q) represents the consumption beginning time of the $j^{th}$ token on terminal q; IC(q) represents the number of tokens consumed from terminal q of the sink actor of the channel c.

Figure 44:
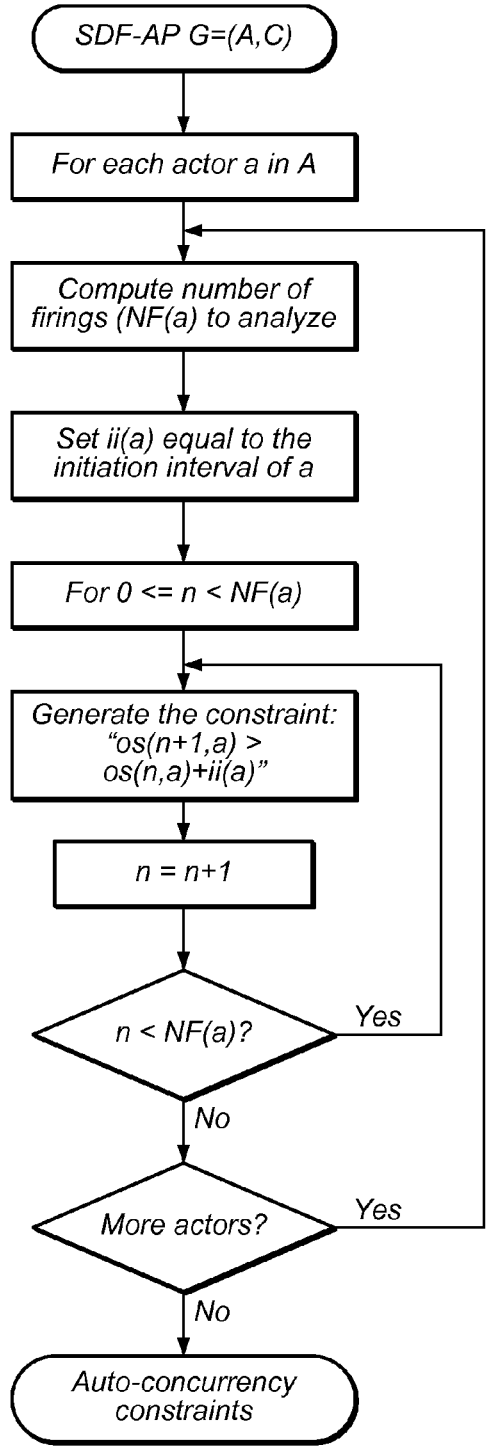
FIG. 44 illustrates a method for generating actor autoconcurrency constraints, according to one embodiment.

FIG. 44 illustrates one embodiment of a method for generating the actor auto-concurrency constraints of FIG. 40. The set of auto-concurrency constraints specifies that for each actor in the data flow program successive firings of the actor must be separated in time by at least the initiation interval of the actor. In some embodiments the actor auto-concurrency constraint generation may include: for each actor a, computing the number of actor firings to be analyzed (denoted by NF(a) in the figure), and for each of the firings, generating a linear or difference constraint, e.g., "os(n+1,a)>os(n,a)+ii(a)", to ensure that successive firings are separated by at least the given initiation interval (II). NF(a), the number of actor firings to be analyzed, needs to be big enough to cover the constraint on iteration boundaries.

Figure 45:
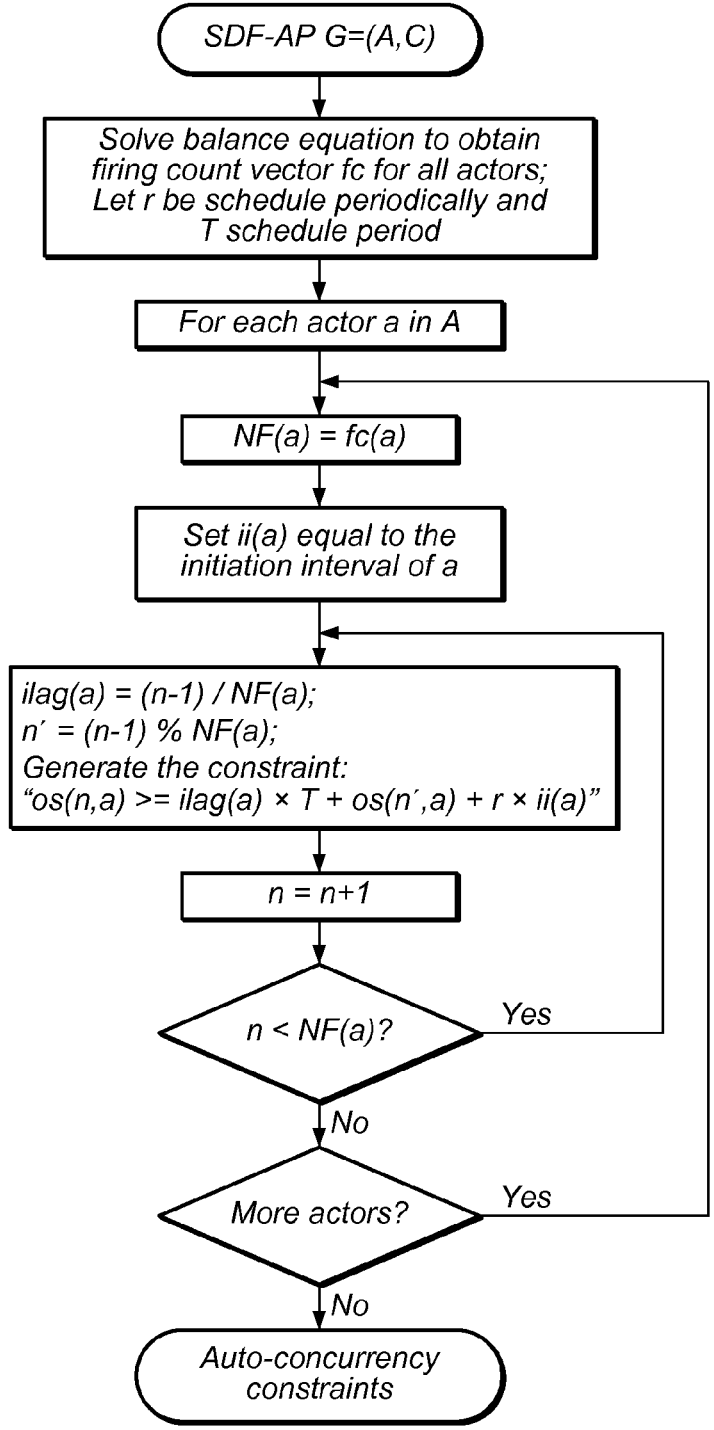
FIG. 45 illustrates a more detailed example of a method for generating the actor auto-concurrency constraints, according to one embodiment.

FIG. 45 illustrates a more detailed example of a method for generating the actor auto-concurrency constraints of FIG. 40 under r-periodic scheduling, according to one embodiment. In this embodiment, a linear or difference constraint is generated based on r-periodic scheduling with schedule iteration periodicity r and schedule iteration period T. In this exemplary embodiment, given firing count vector (denoted by fc) for all actors, for each actor a, the number of firings to be analyzed is selected to be its firing count fc(a). For each of the firings of actor a, a constraint, e.g., "os(n,a)>=ilag(a)×T+os(n',a)+r×ii(a)", may be generated, where, as noted above, os(n,a) denotes the scheduling offset of the nth instance of actor a in one iteration, ilag(a) denotes the iteration difference, an ii(a) denotes the initiation interval. Thus, the constraint is generated to ensure that successive firings in one iteration are separated by at least the given initiation interval, denoted by ii(a)). The firings across iteration boundaries are also separated by at least the given initiation interval from their respective previous firings. Note further that this method uses the access pattern information for the data flow program, which enables a more detailed set of actor auto-concurrency constraints to be generated than would be possible without such information.

Figure 46:
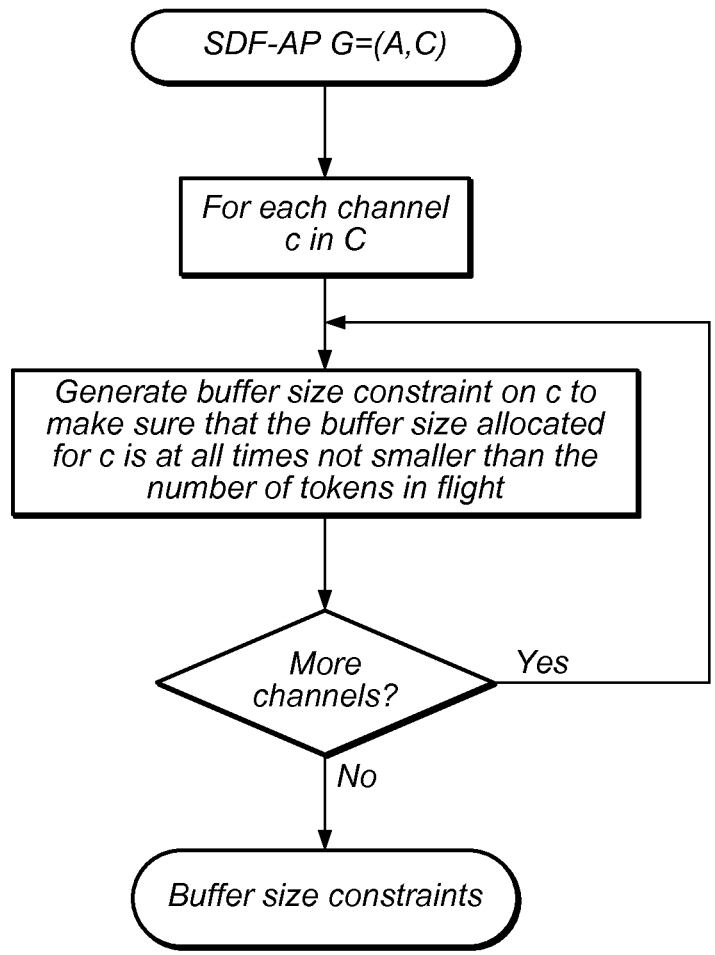
FIG. 46 illustrates a method for generating buffer size constraints, according to one embodiment.

FIG. 46 illustrates one embodiment of a method for generating the buffer size constraints of FIG. 40. As FIG. 46 shows, for each channel c, a buffer size constraint may be generated to ensure that the buffer size allocated for c is at all times not smaller than the number of tokens in transit over c ("in flight"). The number of tokens in transit over c is defined as the initial tokens plus those tokens whose productions are finished or started minus those tokens whose consumptions have finished.

Figure 47:
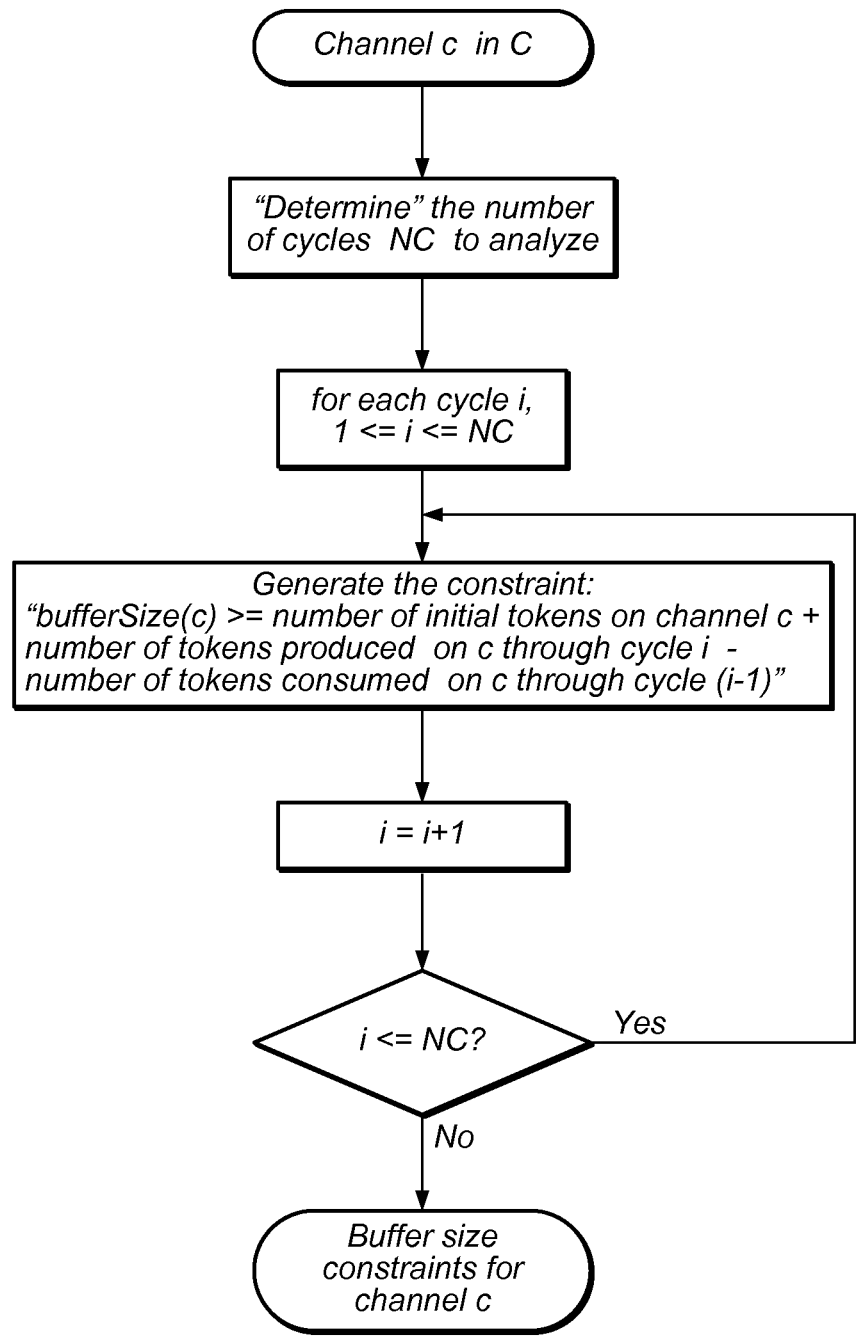
FIG. 47 illustrates a method for generating buffer size constraints for a channel, according to one embodiment.

FIG. 47 illustrates that the buffer size constraint generation for each channel c in FIG. 46 may include determining the number of cycles to be analyzed on channel c (denoted by NC), and the generation of buffer size constraint for cycle i such that the buffer size of that channel is no smaller than the sum of the number of initial tokens on channel c and the number of tokens produced on c through cycle i minus the number of tokens consumed on c through the previous cycle (i−1).

Figure 48:
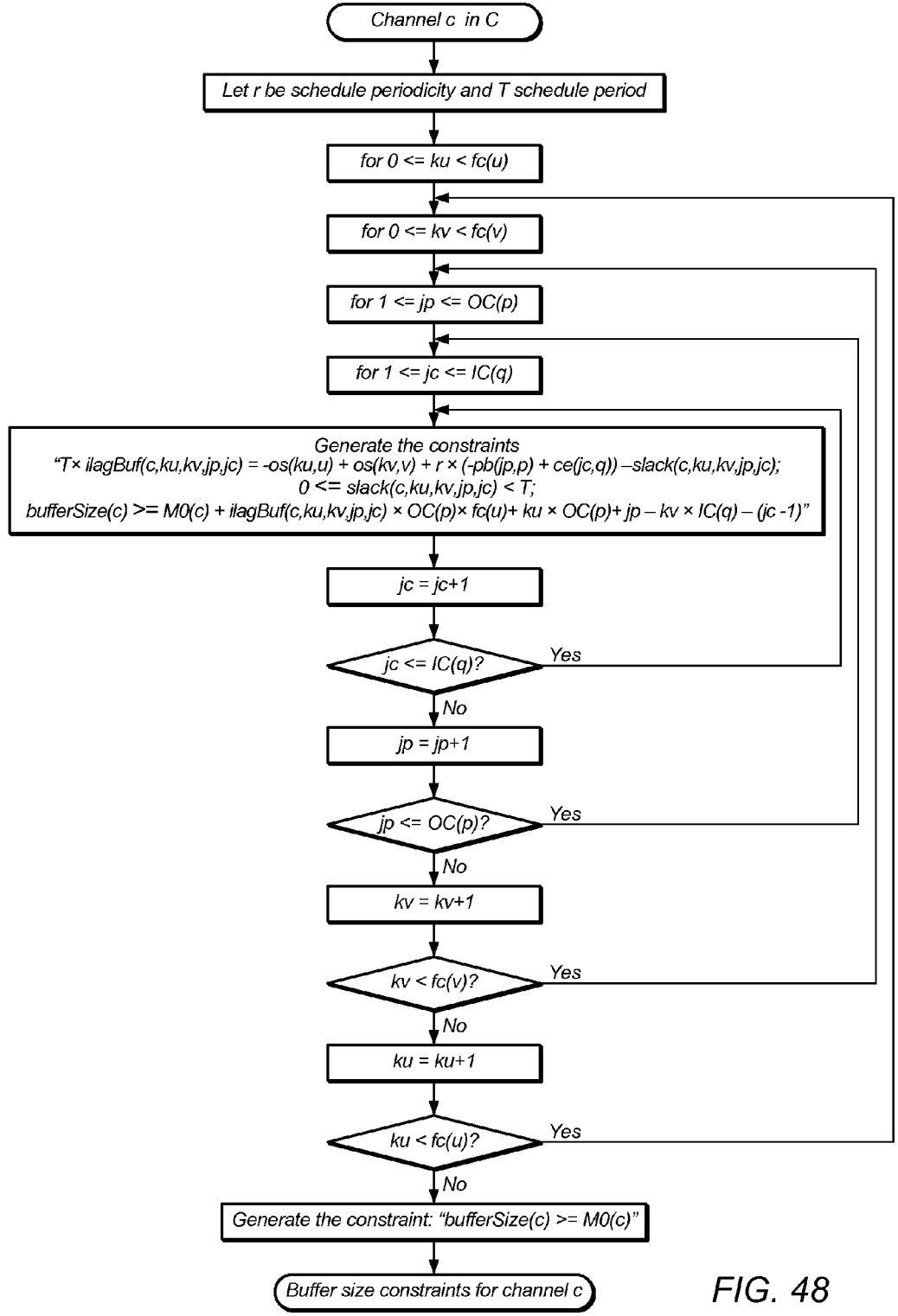
FIG. 48 illustrates another method for generating the buffer size constraints, according to one embodiment.

In actual practice it may be difficult to determine the number of cycles that need to be analyzed on a given channel c. FIG. 48 illustrates one embodiment of a method for generating the buffer size constraints of FIG. 46 which avoids the need to determine the number of cycles that needs to be analyzed. The buffer size constraint generation may be performed as follows: a linear constraint is generated based on r-periodic scheduling with schedule iteration periodicity r and schedule iteration period T, where, given firing count vector (denoted by fc) for all actors, for each token production of each producer actor firing in one iteration (denoted by OC(p)), the optimization module examines each token consumption in each consumer actor firing in one iteration (denoted by IC(q)), and generates constraints: "T×ilagBuf(c,ku,kv,jp,jc)=−os(ku,u)+os(kv,v)+r×(−pb(jp,p)+ce(jc,q))−slack (c,ku,kv,jp,jc)"; "0<=slack(c,ku,kv,jp,jc)<T"; and "bufferSize(c)≥M0(c)+ilagBuf(c,ku,kv,jp,jc)×OC(p)×fc(u)+ku×OC(p)+jp−kv×IC(q)−(jc−1), where ilagBuf is defined to be the floor of "−os(ku,u)+os(kv,v)+r×(−pb(jp,p)+ce(jc,q))" divided by T". Once the constraints for each token production of each producer actor firing in each iteration are determined, the constraint "bufferSize(c)>=M0(c)" may be generated, thereby generating buffer size constraints for channel c. Note that os(k,a) represents the schedule offset of the $k^{th}$ instance of actor a in one iteration; pb(jp,p) represents the production beginning time of the $jp^{th}$ token on terminal p; ce(jc,q) represents the consumption ending time of the j c token on terminal q. slack(c,ku,kv,jp,jc) (ranging from 0 to T−1) are introduced slack variables to linearly represent the floor function.

Figure 49:
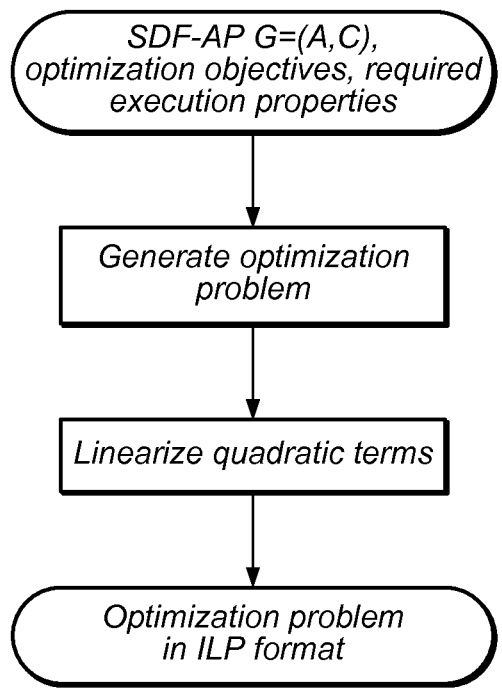
FIG. 49 illustrates a method for transforming a quadratic formulation of an optimization problem to an equivalent Integer Linear Programming (ILP) problem formulation, according to one embodiment.

In some embodiments, automatically generating the one or more constraints for the objective function includes automatically generating a quadratic constraint. The method may further include transforming the quadratic constraint into a linear constraint. FIG. 49 illustrates an embodiment in which an optimization problem is generated that includes one or more quadratic terms, and the quadratic terms are then reformulated as linear terms via linearization as shown to achieve a transformed but equivalent optimization problem in ILP format.

Figure 50:
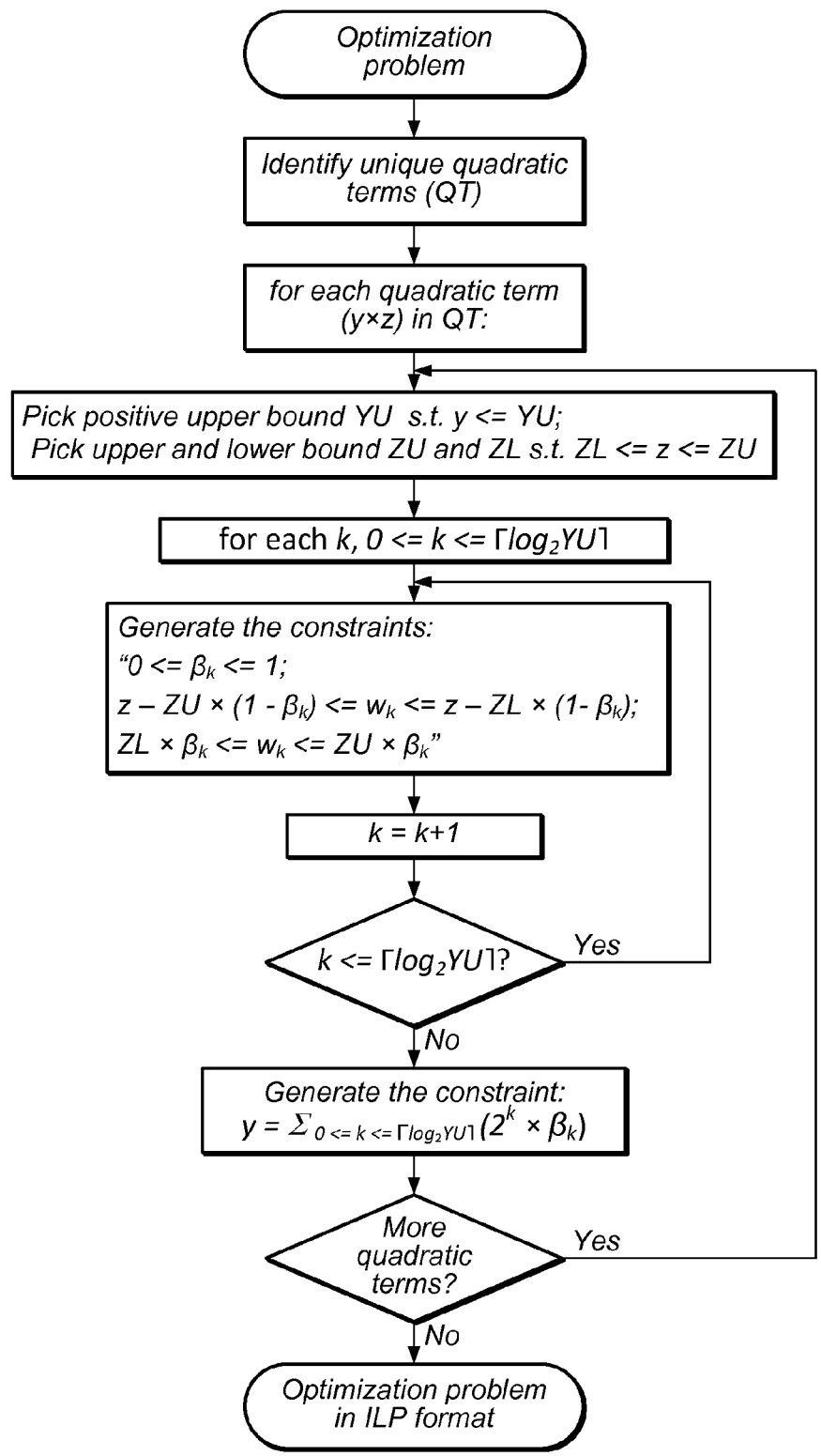
FIG. 50 illustrates a method for linearizing quadratic terms of an optimization problem, according to one embodiment.

FIG. 50 illustrates an exemplary embodiment of a method for linearizing the quadratic terms in the method of FIG. 49. Quadratic terms (QTs) may be identified, and then for each such quadratic term, a positive upper bound YU may be picked (or determined) such that y is less than or equal to YU, and upper and lower bounds ZU and ZL may be picked (or determined) such that ZL is less than or equal to z, which is less than or equal to ZU.

As indicated in FIG. 50, binary decomposition may be applied to (at least) one of the bounded product factors. As indicated by its name, binary decomposition breaks the product of two variables into a sum of products by decomposing one of the variables into a sum of powers of two (e.g., 12 is equal to $0*2^0+0*2^1+1*2^2+1*2^3$), so that the product of the two variables becomes a sum of products of the powers of two composing one variable times the other. Substituting numeric values for upper and lower bounds for the two variables and manipulating the math yields a sequence of linear constraints. For example, the binary decomposition on y, where y is upper bounded by YU, is $y=\Sigma_{0\leq k\leq floor(log\ YU)}(2^k*\beta k)$, where log is the base 2 logarithm function. The product terms of a Boolean variable and a bounded integer variable ($w_k=z*\beta_k$) may then be linearized by generating the constraints: "$0\leq\beta_k\leq 1$; $z-ZU\times(1-\beta_k)\leq w_k\leq z-ZL\times(1-\beta_k)$; and $ZL\times\beta_k\leq w_k\leq ZU\times\beta_k$", where ZU and ZL are respectively the upper bound and lower bound of z. This set of linear constraints is equivalent to the original quadratic constraint. The final step "Generate the constraint: '$y=\Sigma_{0<=<=\lfloor log_2 YU \rfloor}(2^k\cdot\beta_k)$'" constrains the $\beta_k$'s to be the binary components of y.

In other embodiments, the one or more constraints may all be integer linear constraints, and such transformations may not be needed.

In some embodiments, generating the one or more constraints includes using a technique for optimizing functions. For example, generating the one or more constrains may include transforming the constraints using a technique for optimizing functions.

As noted above, the optimization process may include applying a solver to the objective function to find at least one minimum value or maximum value that at least one variable of the objective function can take on, subject to the one or more constraints. This may be accomplished via any of a variety of ways. For example, in one embodiment, the solver may return an approximation to the at least one minimum value or maximum value rather than an exact value.

Figure 51:
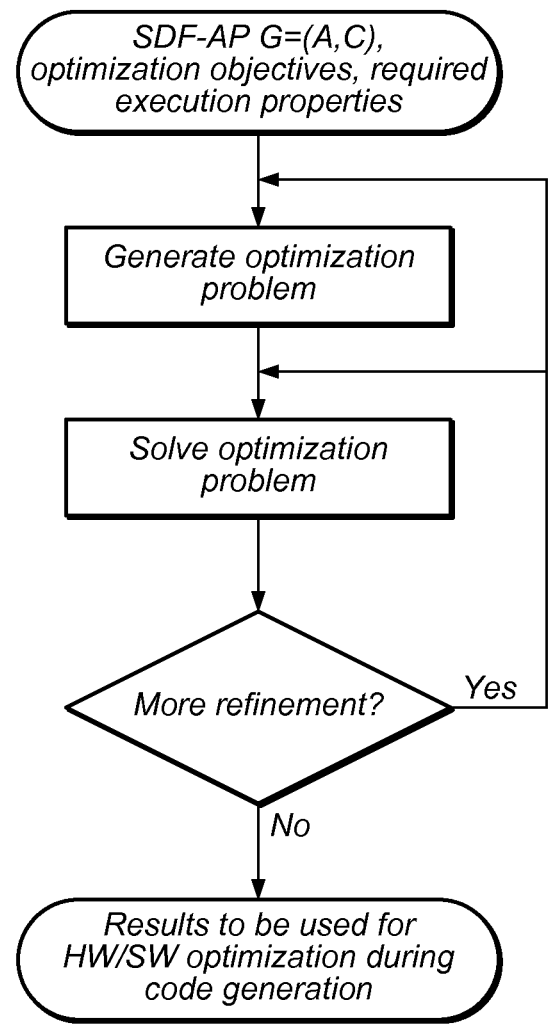
FIG. 51 illustrates iterative refinement of solutions to an optimization problem, according to one embodiment.

FIG. 51 illustrates an embodiment utilizing an iterative flow in which the optimization problem is modified by solving a separate optimization problem that generates more information about the constraints. The optimization problem can be solved in a sequence of steps, each of which involves a minimization or maximization of the objective function. For example, given an SDF program or diagram including access pattern information, optimization objectives, and required execution properties, a first optimization problem can be generated and solved, and the results from solving the first problem may be used to generate tighter constraints for a second optimization problem, which may then be solved, and so forth, continuing in an iterative manner. In various embodiments any number of iterations may be performed in this manner. The final results may be used for HW/SW optimization during code generation.

Figure 52:
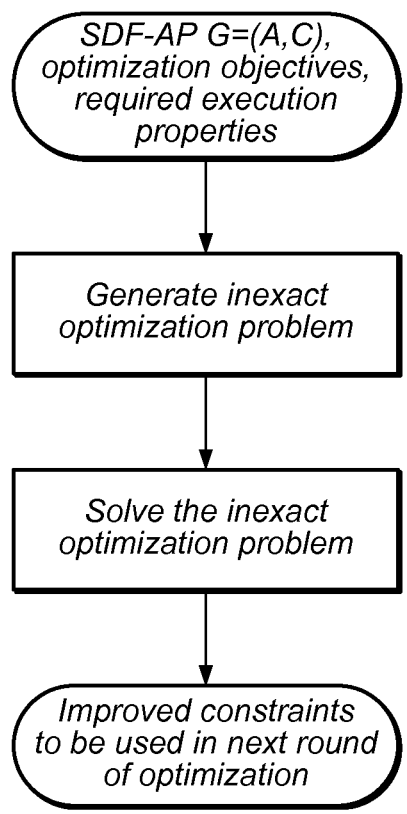
FIG. 52 illustrates solving an inexact formulation of an optimization problem to improve constraints, according to one embodiment.

FIG. 52 illustrates an embodiment in which an inexact formulation is solved in order to improve the constraints, which can be used in embodiments of the method of FIG. 51. Based on a given SDF program or diagram including access pattern information, optimization objectives, and required execution properties, an inexact optimization problem is generated and solved to generate improved constraints to be used in the next round of optimization. In other words, utilizing an iterative flow, an inexact (i.e., approximation) method is used to obtain some constraints, and these constraints are then used in a further round of optimization.

Figure 53:
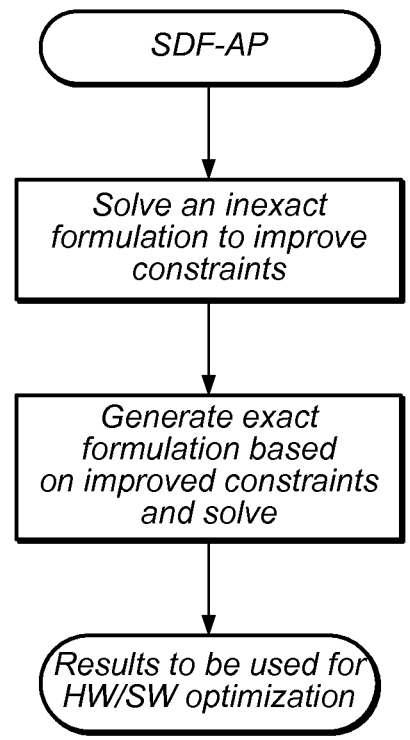
FIG. 53 illustrates solving an inexact formulation followed by solving an exact formulation, according to one embodiment.

FIG. 53 illustrates an embodiment of the method of FIG. 51 in which optimization is performed by solving an inexact formulation to improve constraints, followed by solving an exact formulation generated based on the improved constraints. In some embodiments, the reverse order can also occur. The final results may be used for HW/SW optimization during code generation.

Figure 54:
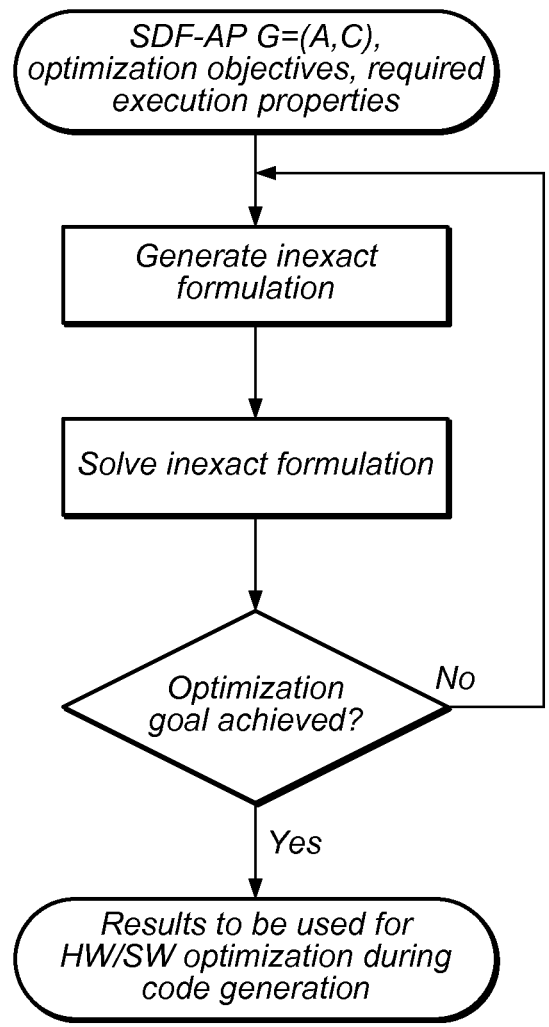
FIG. 54 illustrates optimization via a decomposition method that relaxes some constraints in the constraint problem, according to one embodiment.

FIG. 54 illustrates another embodiment of the method of FIG. 51 in which optimization is performed by a decomposition method that relaxes some constraints in the constraint problem. Given an SDF program or diagram including access pattern information, optimization objectives, and required execution properties, an inexact problem may be generated and solved, and if the optimization goal is not achieved, the method may repeat, generating and solving another inexact/approximate formulation of the optimization problem. Thus, from In other words, from a more general problem the optimization module can iteratively solve an inexact formulation and generate a solution, generate a new formulation, and then solve another inexact problem that is not exactly identical to the original problem. In this iterative process the optimization module eventually determines that the optimization goal has been achieved.

Figure 55:
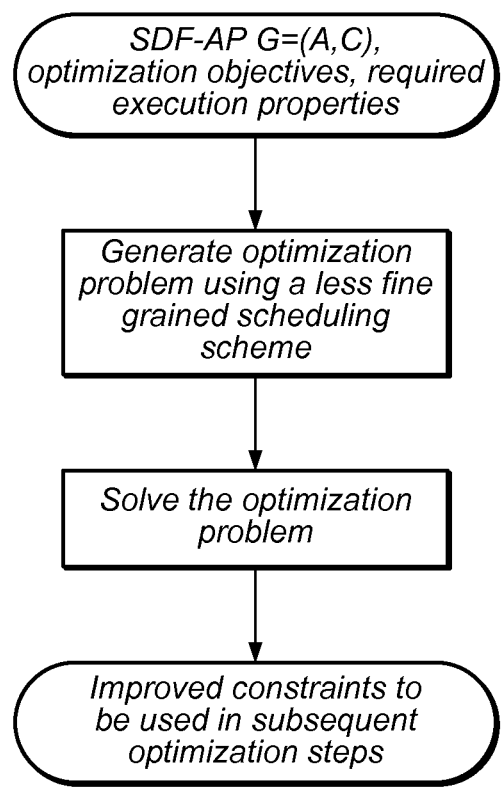
FIG. 55 illustrates improving constraints by solving an optimization problem based on a less fine grained scheduling scheme, according to one embodiment.

In general, to generate the optimization problem constraints, the optimization module may use a particular scheduling scheme. Examples of scheduling schemes, in increasing levels of granularity, are: regular periodic scheduling, regular l-periodic scheduling, r-periodic scheduling. FIG. 55 illustrates another embodiment that can be used in the method of FIG. 51 in which constraints are improved by solving an optimization problem based on a less fine grained scheduling scheme. This gives an initial solution that can be used to improve constraints for future rounds of optimization problems.

Figure 56:
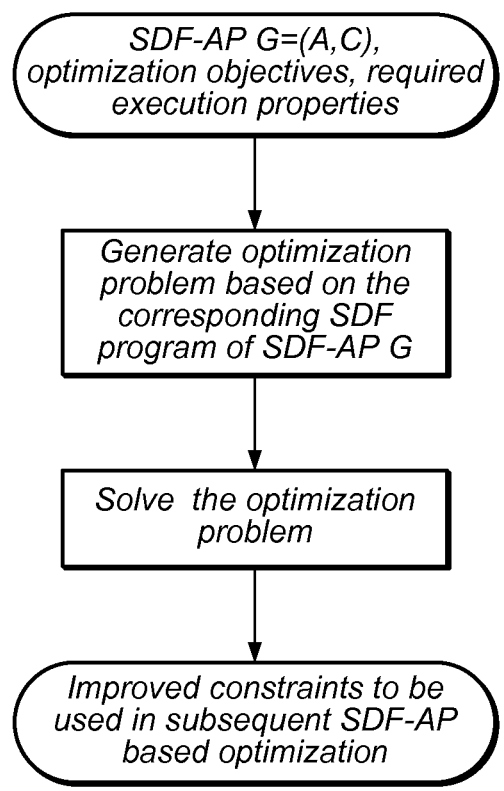
FIG. 56 illustrates improving constraints by first solving an optimization problem based on an underlying SDF, according to one embodiment.

FIG. 56 illustrates another embodiment that can be used in the method FIG. 51 in which some constraints are obtained by solving an optimization problem on its corresponding SDF (static data flow) problem that does not use the access pattern information. The access pattern information in general makes the optimization problem more complex and time-consuming to solve. Thus, the optimization problem may first be solved without considering the access pattern information, and the resulting solution may be used to improve the constraints (e.g., to narrow the possible solution space) for a subsequent optimization problem which does use the access pattern information. More specifically, given an SDF program or diagram G including access pattern information, optimization objectives, and required execution properties, an optimization problem may be generated based on the program/diagram, and the problem may be solved, thereby generating improved constraints to be used in subsequent SDF program/diagram based optimization.

In some embodiments, generating the one or more constrains includes simulating execution of the data flow diagram. For example, the one or more constraints may be generated using a scheduling scheme, which in some embodiments may be a static fine-grained schedule scheme.

Figure 57:
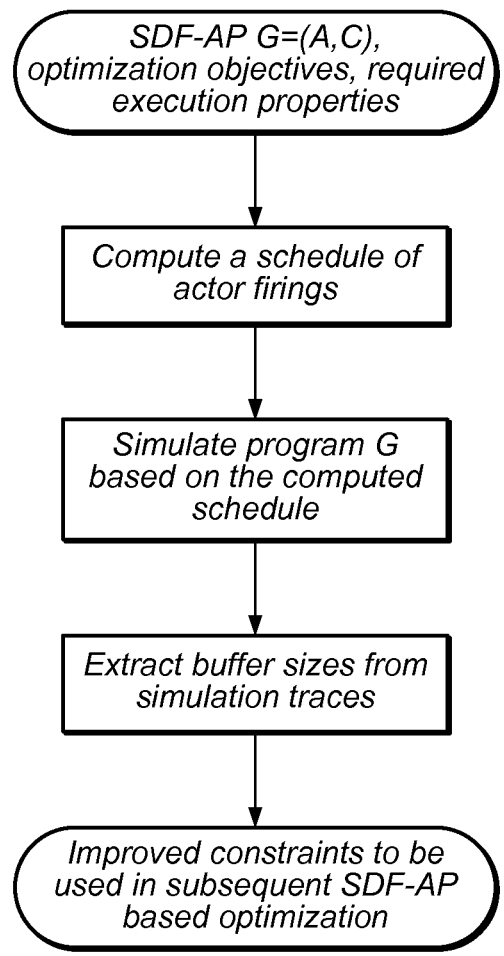
FIG. 57 illustrates obtaining buffer sizes using program simulation, according to one embodiment.

FIG. 57 illustrates another embodiment that can be used in the method of FIG. 51 in which simulation is used to obtain buffer sizes. The optimization module may compute a valid schedule of actor firings, e.g., by forming an optimization problem with a set of producer-consumer precedence constraints and solving it. The resulting schedule may not be optimal, but at least is valid. The data flow program may then be simulated based on the computed schedule. Then the optimization module may analyze the simulation traces to determine the buffer sizes needed. Those buffer sizes may then be used in constraints for a more complex optimization problem, e.g., in subsequent SDF program/diagram based optimization.

Figure 58:
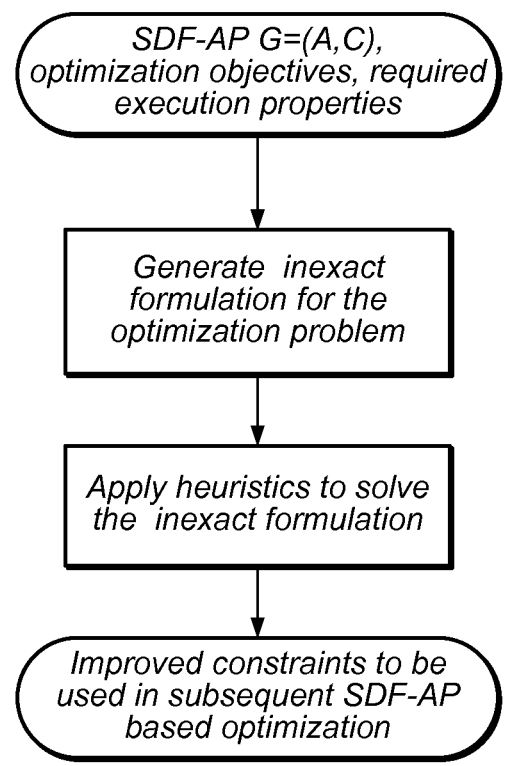
FIG. 58 illustrates using a heuristic or heuristics to solve an inexact formulation of an optimization problem to determine improved constraints for subsequent optimization steps, according to one embodiment.

FIG. 58 illustrates another embodiment that can be used in the method of FIG. 51 in which an inexact approach is used to formulate an optimization problem, and a heuristic is then applied to solve the inexact problem in order to determine improved constraints for subsequent SDF program/diagram based optimization.

Figure 59:
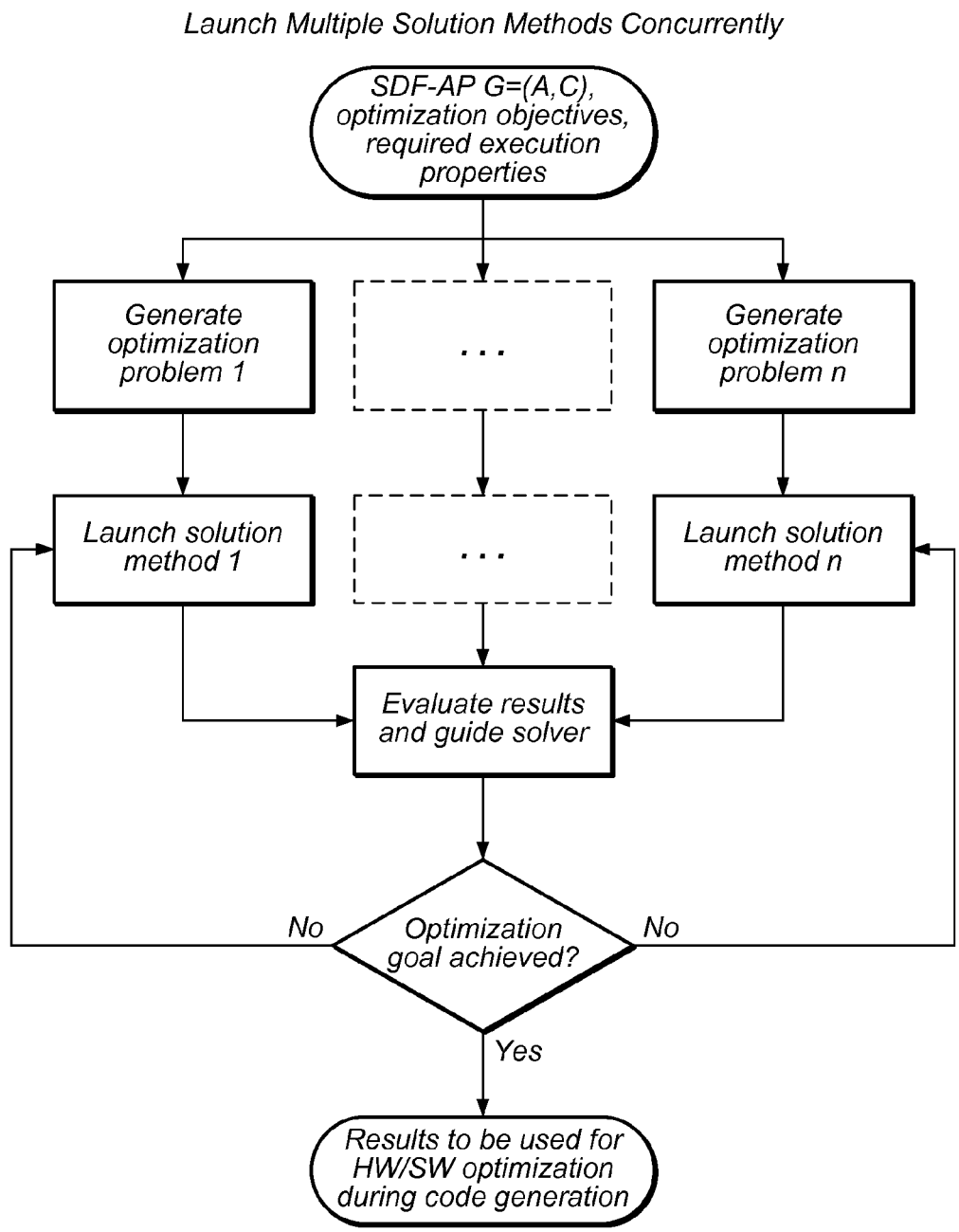
FIG. 59 illustrates concurrent use of multiple solvers to solve an optimization problem, according to one embodiment.

FIG. 59 illustrates an embodiment in which multiple solvers (e.g., using inexact and/or exact solution techniques) are executed concurrently to optimize an SDF program/diagram. As shown, given the SDF program/diagram, optimization objectives, and required execution properties, multiple respective optimization problems may be generated, e.g., problems 1-n. Accordingly, multiple respective solution methods may be launched, and results from all of them evaluated and used to guide the solver (or method). If the desired optimization goals have not been achieved, the method may repeat, again launching one or more solution methods, results from which may further guide the solver (or method), and so forth in an iterative manner. Thus, the progress of the solvers may be used to further guide the solver (or optimization module) or choose alternate solution techniques.

For example, different formulations of the optimization problem may be launched on different computer systems. The optimization module may not know at first which formulation will give a solution quickly. If it gets a good solution from one formulation, the optimization module can then guide the solvers using the results from that formulation.

The optimization module may also use different solvers to work on different optimization problems concurrently. For example, problem 1 may be to minimize buffer size, and problem 2 may be to maximize throughput. The solutions can be merged and used in another round of optimization.

Figure 60:
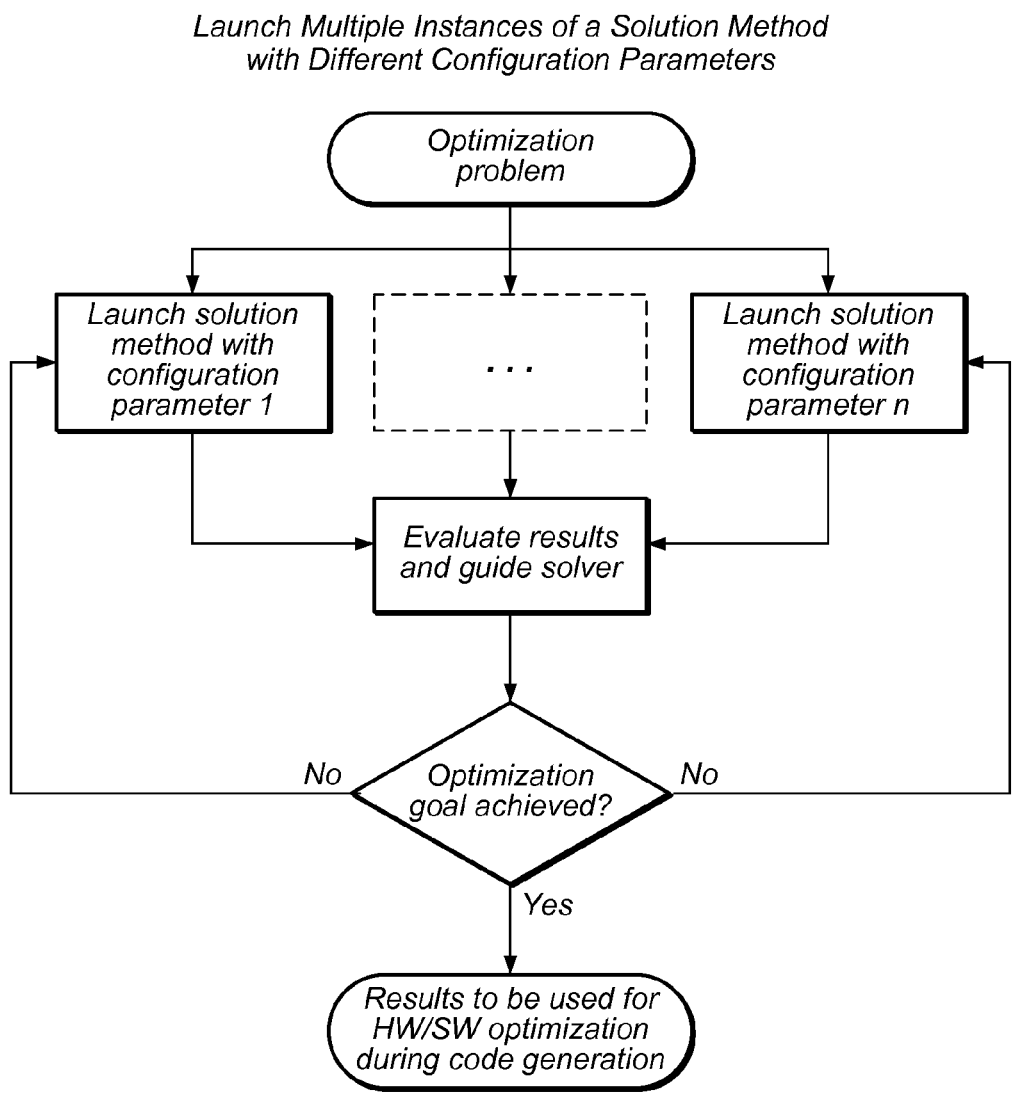
FIG. 60 illustrates optimization using multiple solvers launched with different configuration parameters, according to one embodiment.

The solver tools can have different configuration parameters. The best parameters to use can depend on the particular optimization problem being solved, but it may be difficult to know what they are other than through trial and error. FIG. 60 illustrates an embodiment in which multiple solvers are launched with different configuration parameters. The progress of the solvers may be used to further guide the solver or choose alternate solver parameters. Once the optimization goal is achieved, the results may be used for HW/SW optimization during code generation.

Figure 61:
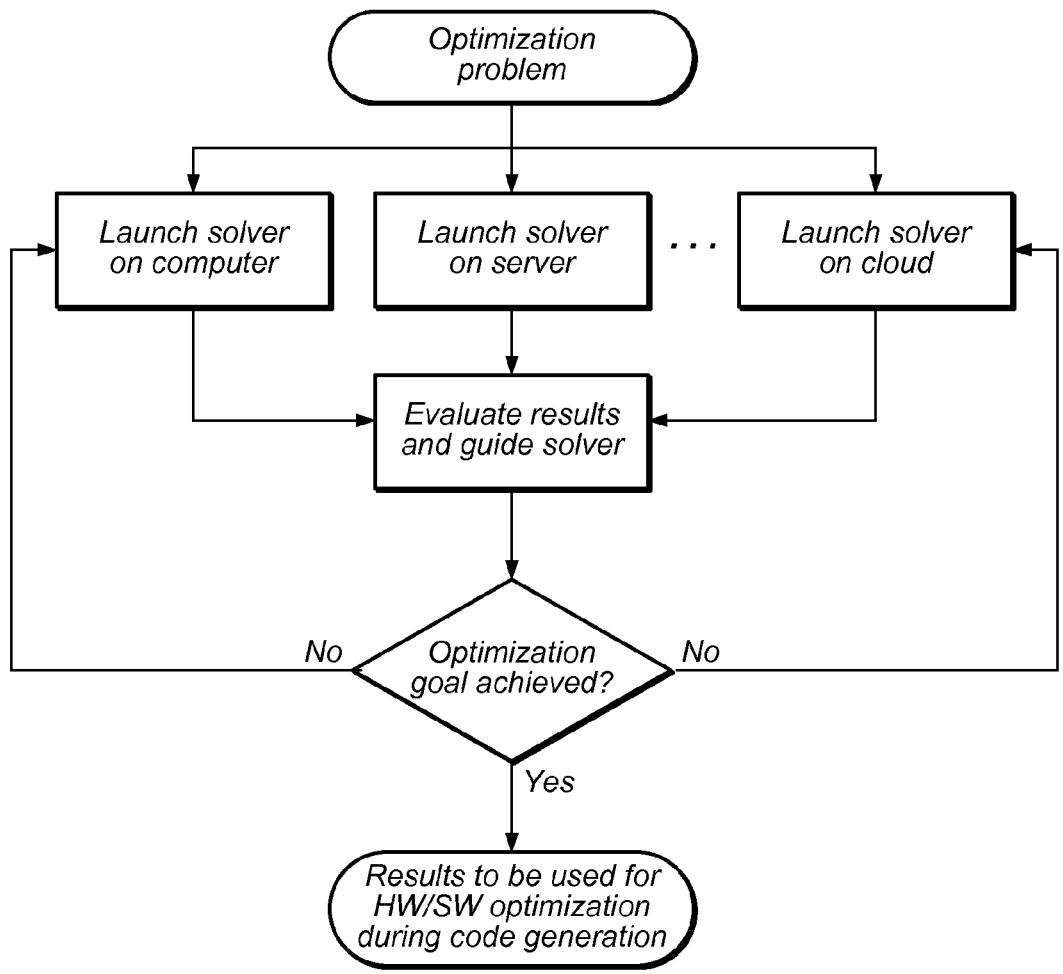
FIG. 61 illustrates distributed concurrent use of multiple solvers at different facilities to solve an optimization problem, according to one embodiment.

FIG. 61 illustrates an embodiment in which multiple solvers are concurrently executed in separate computing facilities (e.g., on different computer systems, processors, servers, or cloud services, among others). As with the methods of FIGS. 59 and 60, results from all of the computing facilities may be evaluated and used to guide the method, where if the desired optimization goals have not been achieved, the method may repeat, again launching solvers on the different computing facilities, results from which may further guide the solver (or method), and so forth in an iterative manner. Once the optimization goal is achieved, the results may be used for HW/SW optimization during code generation. Of course, any number and type of optimization facilities or platforms may be used as desired.

It should be noted that any of the above-described features and techniques may be used in any combinations as desired.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A non-transitory computer accessible memory medium that stores program instructions executable by a processor to implement:
   receiving access pattern information for a data flow diagram, wherein the data flow diagram includes a plurality of interconnected actors visually indicating functionality of the data flow diagram, wherein the access pattern information includes one or more of: a) input pattern information specifying the time at which tokens are consumed by at least one of the actors, or b) output pattern information specifying the time at which tokens are produced by at least one of the actors;
   generating a program that implements the functionality of the data flow diagram based at least in part on the access pattern information, wherein the functionality comprises digital signal processing (DSP) and communications, industrial test and measurement, or industrial automation and control; and
   configuring a hardware device according to the generated program.

2. The non-transitory computer accessible memory medium of claim 1, wherein the access pattern information includes input pattern information specifying the time at which tokens are consumed by a plurality of the actors.

3. The non-transitory computer accessible memory medium of claim 1, wherein the input pattern information for an actor comprises information indicating when the actor's input tokens are consumed relative to the beginning of the at least one actor's execution.

4. The non-transitory computer accessible memory medium of claim 1, wherein the input pattern information specifies the particular time at which input tokens are consumed by the actor.

5. The non-transitory computer accessible memory medium of claim 1, wherein the input pattern information comprises a plurality of values, wherein each of the values corresponds to a respective cycle during execution of the actor and specifies a number of tokens consumed by the actor on that cycle.

6. The non-transitory computer accessible memory medium of claim 1, wherein the access pattern information includes output pattern information specifying the time at which tokens are produced by a plurality of the actors.

7. The non-transitory computer accessible memory medium of claim 1, wherein the output pattern information for an actor comprises information indicating when the actor's output tokens are produced relative to a beginning of the at least one actor's execution.

8. The non-transitory computer accessible memory medium of claim 1, wherein the output pattern information specifies the particular the time at which output tokens are produced by the actor.

9. The non-transitory computer accessible memory medium of claim 1, wherein the output pattern information comprises a plurality of values, wherein each of the values corresponds to a respective cycle during execution of the actor and specifies a number of tokens produced by the actor on that cycle.

10. The non-transitory computer accessible memory medium of claim 1, wherein the program instructions are further executable by a processor to implement:
    converting the data flow diagram into an intermediate representation, wherein said generating the program comprises generating the program from the intermediate representation.

11. The non-transitory computer accessible memory medium of claim 1, wherein the program instructions are further executable by a processor to implement:
    receiving input specifying additional information for the data flow diagram, wherein the additional information includes one or more of:
      one or more execution times for one or more of the actors; or
      one or more initiation intervals for one or more of the actors;
    wherein said generating the program is further based on the additional information.

12. The non-transitory computer accessible memory medium of claim 1, wherein said generating the program comprises optimizing one or more features of the program based at least in part on the access pattern information.

13. The non-transitory computer accessible memory medium of claim 12, wherein the program instructions are further executable by a processor to implement:
    receiving user input specifying the one or more features of the program to be optimized.

14. The non-transitory computer accessible memory medium of claim 12, wherein the one or more features of the program to be optimized include one or more of: buffer size, throughput, or latency.

15. The non-transitory computer accessible memory medium of claim 12, wherein said optimizing the one or more features of the program comprises optimizing one or more of the following based at least in part on the access pattern information:
    throughput of terminals on the actors;
    throughput of the program;
    clock rate of the program;
    a size of a buffer between actors; or
    latency between actor inputs and corresponding actor outputs.

16. The non-transitory computer accessible memory medium of claim 12, wherein said optimizing the one or more features of the program comprises:
- automatically formulating an objective function based on the one or more features of the program to be optimized;
- automatically generating one or more constraints for the objective function based at least in part on the access pattern information;
- applying a solver to the objective function to find at least one minimum value or maximum value that at least one variable of the objective function can take on, subject to the one or more constraints; and
- configuring the program according to the at least one minimum value or maximum value, wherein said configuring optimizes the one or more features of the program.

17. The non-transitory computer accessible memory medium of claim 16, wherein said automatically generating the one or more constraints for the objective function comprises automatically generating one or more of:
- at least one producer-consumer constraint;
- at least one auto-concurrency constraint;
- at least one buffer size constraint; or
- at least one resource utilization constraint.

18. The non-transitory computer accessible memory medium of claim 16, wherein said automatically generating the one or more constraints for the objective function comprises automatically generating one or more of:
- a linear constraint;
- a quadratic constraint;
- a difference constraint;
- or a propositional logic constraint.

19. The non-transitory computer accessible memory medium of claim 16,
- wherein said automatically generating the one or more constraints for the objective function comprises automatically generating a quadratic constraint; and
- wherein the method further comprises transforming the quadratic constraint into a linear constraint.

20. The non-transitory computer accessible memory medium of claim 16, wherein the one or more constraints are all integer linear constraints.

21. The non-transitory computer accessible memory medium of claim 16, wherein the solver returns an approximation to the at least one minimum value or maximum value rather than an exact value.

22. The non-transitory computer accessible memory medium of claim 16, wherein the solver is one of a mixed integer linear programming (MILP) solver, mixed integer quadratic constraints programming (MIQCP solver), or satisfiability modulo theories (SMT) solver.

23. The non-transitory computer accessible memory medium of claim 16, wherein said generating the one or more constraints comprises using a technique for optimizing functions.

24. The non-transitory computer accessible memory medium of claim 16, wherein said generating the one or more constrains comprises transforming the constraints using a technique for optimizing functions.

25. The non-transitory computer accessible memory medium of claim 16, wherein said generating the one or more constraints comprises simulating execution of the data flow diagram.

26. The non-transitory computer accessible memory medium of claim 16, wherein said generating the one or more constraints uses a scheduling scheme.

27. The non-transitory computer accessible memory medium of claim 26, wherein the scheduling scheme is a static fine-grained scheduling scheme.

28. The non-transitory computer accessible memory medium of claim 1, wherein the data flow diagram is hierarchical, comprising one or more sub-diagrams.

29. The non-transitory computer accessible memory medium of claim 1, wherein each actor comprises a respective functional block.

30. A method comprising:
- utilizing a computer to perform:
  - receiving access pattern information for a data flow diagram, wherein the data flow diagram includes a plurality of interconnected actors visually indicating functionality of the data flow diagram, wherein the access pattern information includes one or more of: a) input pattern information specifying the time at which tokens are consumed by at least one of the actors, or b) output pattern information specifying the time at which tokens are produced by at least one of the actors;
  - generating a program that implements the functionality of the data flow diagram based at least in part on the access pattern information, wherein the functionality comprises digital signal processing (DSP) and communications, industrial test and measurement, or industrial automation and control; and
  - configuring a hardware device according to the generated program.

31. A non-transitory computer accessible memory medium that stores program instructions executable by a processor to implement:
- receiving access pattern information for a data flow specification, wherein the data flow specification specifies a plurality of functional actors that perform functionality according to a data flow model of computation, wherein the access pattern information includes one or more of: a) input pattern information specifying the time at which tokens are consumed by at least one of the functional actors, or b) output pattern information specifying the time at which tokens are produced by at least one of the functional actors;
- generating a program that implements the functionality based on the data flow specification and the access pattern information, wherein the functionality comprises digital signal processing (DSP) and communications, industrial test and measurement, or industrial automation and control; and
- configuring a hardware device according to the generated program.

* * * * *